US012132334B2

(12) United States Patent
Takahashi et al.

(10) Patent No.: US 12,132,334 B2
(45) Date of Patent: Oct. 29, 2024

(54) SEMICONDUCTOR DEVICE AND BATTERY PACK

(71) Applicant: SEMICONDUCTOR ENERGY LABORATORY CO., LTD., Atsugi (JP)

(72) Inventors: Kei Takahashi, Kanagawa (JP); Yuki Okamoto, Kanagawa (JP); Minato Ito, Kanagawa (JP); Takahiko Ishizu, Kanagawa (JP); Hiroki Inoue, Kanagawa (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 693 days.

(21) Appl. No.: 17/292,218

(22) PCT Filed: Nov. 12, 2019

(86) PCT No.: PCT/IB2019/059679
§ 371 (c)(1),
(2) Date: May 7, 2021

(87) PCT Pub. No.: WO2020/104890
PCT Pub. Date: May 28, 2020

(65) Prior Publication Data
US 2022/0006309 A1    Jan. 6, 2022

(30) Foreign Application Priority Data

Nov. 22, 2018 (JP) .................................. 2018-219232
Dec. 4, 2018 (JP) .................................. 2018-227040
Dec. 19, 2018 (JP) .................................. 2018-237055

(51) Int. Cl.
*H02J 7/00* (2006.01)
*H01M 10/42* (2006.01)
(Continued)

(52) U.S. Cl.
CPC ..... *H02J 7/00304* (2020.01); *H01M 10/4264* (2013.01); *H01M 10/44* (2013.01);
(Continued)

(58) Field of Classification Search
USPC .................................. 320/158–159, 163–164
See application file for complete search history.

(56) References Cited

U.S. PATENT DOCUMENTS 5,218,607 A    6/1993  Saito et al.
5,378,912 A    1/1995  Pein
(Continued)

FOREIGN PATENT DOCUMENTS

CN    102904534 A    1/2013
CN    103178308 A    6/2013
(Continued)

OTHER PUBLICATIONS

Chinese Office Action (Application No. 201980077100.5) Dated Apr. 11, 2024.
(Continued)

*Primary Examiner* — Samuel Berhanu
(74) *Attorney, Agent, or Firm* — Fish & Richardson P.C.

(57) ABSTRACT

A semiconductor device with reduced power consumption is provided. The semiconductor device includes a node ND1, a node ND2, a resistor, a capacitor, and a comparison circuit. The resistor is electrically connected in series between one of a positive electrode and a negative electrode of a secondary battery and a first terminal. The resistor has a function of converting current flowing between the one of the positive electrode and the negative electrode of the secondary battery and the first terminal into a first voltage. The first voltage is added to a voltage of the node ND2 through the capacitor. The comparison circuit has a function of comparing a voltage of the node ND1 and the voltage of
(Continued)

the node ND2. The comparison circuit outputs a signal that notifies detection of overcurrent when the voltage of the node ND2 is higher than the voltage of the node ND1.

17 Claims, 37 Drawing Sheets

(51) Int. Cl.
  H01M 10/44 (2006.01)
  H03K 3/0231 (2006.01)
  H03K 17/082 (2006.01)
(52) U.S. Cl.
  CPC .......... *H02J 7/0031* (2013.01); *H03K 3/0231* (2013.01); *H03K 17/0822* (2013.01)

(56) References Cited

U.S. PATENT DOCUMENTS

| | | | |
|---|---|---|---|
| 5,498,988 | A | 3/1996 | Reyes et al. |
| 5,585,994 | A | 12/1996 | Tamai et al. |
| 5,726,929 | A | 3/1998 | Suminaga et al. |
| 5,731,856 | A | 3/1998 | Kim et al. |
| 5,744,864 | A | 4/1998 | Cillessen et al. |
| 5,812,440 | A | 9/1998 | Suminaga et al. |
| 5,936,879 | A | 8/1999 | Brouwer et al. |
| 6,046,606 | A | 4/2000 | Chu et al. |
| 6,154,009 | A | 11/2000 | Fujita. et al. |
| 6,294,274 | B1 | 9/2001 | Kawazoe et al. |
| 6,563,174 | B2 | 5/2003 | Kawasaki et al. |
| 6,639,827 | B2 | 10/2003 | Clark et al. |
| 6,727,522 | B1 | 4/2004 | Kawasaki et al. |
| 6,775,180 | B2 | 8/2004 | Biyani et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,612,594 | B2 | 11/2009 | Fukuoka |
| 7,626,434 | B2 | 12/2009 | Aksamit |
| 7,674,650 | B2 | 3/2010 | Akimoto et al. |
| 7,732,819 | B2 | 6/2010 | Akimoto et al. |
| 8,053,836 | B2 | 11/2011 | Yeh et al. |
| 8,115,201 | B2 | 2/2012 | Yamazaki et al. |
| 8,188,477 | B2 | 5/2012 | Miyairi et al. |
| 8,362,478 | B2 | 1/2013 | Yamazaki et al. |
| 8,611,061 | B2 | 12/2013 | Nishizawa et al. |
| 8,736,337 | B2 | 5/2014 | Yayama et al. |
| 9,083,327 | B2 | 7/2015 | Ohmaru |
| 9,130,047 | B2 | 9/2015 | Sakakura et al. |
| 9,316,695 | B2 | 4/2016 | Takahashi et al. |
| 9,705,398 | B2 | 7/2017 | Takahashi |
| 9,735,282 | B2 | 8/2017 | Miyake et al. |
| 9,876,374 | B2 * | 1/2018 | Baek .................. H02J 7/00 |
| 10,228,423 | B2 | 3/2019 | Yanagawa |
| 10,298,043 | B2 | 5/2019 | Takahashi et al. |
| 10,476,289 | B2 | 11/2019 | Takahashi et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0051574 | A1 | 3/2004 | Ko et al. |
| 2004/0090256 | A1 | 5/2004 | Cho |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0119406 | A1 | 6/2006 | Henzler et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0085585 | A1 | 4/2007 | Frederick |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0218234 | A1 | 9/2008 | Jain |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2008/0315932 | A1 | 12/2008 | Tower et al. |
| 2009/0068773 | A1 | 3/2009 | Lai et al. |
| 2009/0073325 | A1 | 3/2009 | Kuwabara et al. |
| 2009/0108896 | A1 | 4/2009 | Yasuda et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0189664 | A1 | 7/2009 | Remington |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0252832 | A1 | 10/2010 | Asano et al. |
| 2011/0248759 | A1 | 10/2011 | Chi et al. |
| 2012/0132910 | A1 | 5/2012 | Yamazaki et al. |
| 2012/0161868 | A1 | 6/2012 | Yayama et al. |
| 2012/0170355 | A1 | 7/2012 | Ohmaru et al. |

(56) References Cited

U.S. PATENT DOCUMENTS

| | | | |
|---|---|---|---|
| 2012/0229187 A1 | 9/2012 | Choudhury et al. | |
| 2013/0162197 A1 | 6/2013 | Takahashi et al. | |
| 2013/0222033 A1 | 8/2013 | Kato et al. | |
| 2013/0229218 A1 | 9/2013 | Nishijima | |
| 2013/0242639 A1 | 9/2013 | Koyama | |
| 2013/0265010 A1 | 10/2013 | Nomura et al. | |
| 2013/0293138 A1 | 11/2013 | Takahashi | |
| 2013/0293186 A1* | 11/2013 | Chou | H02J 7/007194 320/107 |
| 2014/0009198 A1* | 1/2014 | Ohmaru | H03K 3/0375 327/198 |
| 2014/0009199 A1 | 1/2014 | Ohmaru et al. | |
| 2014/0126271 A1 | 5/2014 | Aoki et al. | |
| 2015/0034945 A1 | 2/2015 | Sakakura et al. | |
| 2015/0333546 A1* | 11/2015 | Ono | G01R 31/382 324/426 |
| 2016/0195584 A1 | 7/2016 | Takahashi et al. | |
| 2017/0310215 A1 | 10/2017 | Takahashi | |
| 2017/0315176 A1 | 11/2017 | Yanagawa | |
| 2020/0052499 A1 | 2/2020 | Takahashi et al. | |

FOREIGN PATENT DOCUMENTS

| | | |
|---|---|---|
| CN | 103367820 A | 10/2013 |
| CN | 107111985 A | 8/2017 |
| CN | 107315107 A | 11/2017 |
| EP | 0797214 A | 9/1997 |
| EP | 0999635 A | 5/2000 |
| JP | 06-303728 A | 10/1994 |
| JP | 10-094186 A | 4/1998 |
| JP | 10-215518 A | 8/1998 |
| JP | 10-270091 A | 10/1998 |
| JP | 2001-190028 A | 7/2001 |
| JP | 2012-065440 A | 3/2012 |
| JP | 2012-138870 A | 7/2012 |
| JP | 2013-149609 A | 8/2013 |
| JP | 2013-233072 A | 11/2013 |
| JP | 2013-251891 A | 12/2013 |
| JP | 2014-030191 A | 2/2014 |
| JP | 2014-142923 A | 8/2014 |
| JP | 2014-166071 A | 9/2014 |
| JP | 2015-046580 A | 3/2015 |
| JP | 2017-198546 A | 11/2017 |
| KR | 2013-0073830 | 7/2013 |
| KR | 2013-0113979 A | 10/2013 |
| KR | 2014-0005792 A | 1/2014 |
| KR | 2015-0015383 A | 2/2015 |
| TW | 399214 | 7/2000 |
| TW | 201351833 | 12/2013 |
| WO | WO-2016/108122 | 7/2016 |

OTHER PUBLICATIONS

International Search Report (Application No. PCT/IB2019/059679) Dated Feb. 4, 2020.

Written Opinion (Application No. PCT/IB2019/059679) Dated Feb. 4, 2020.

* cited by examiner

250

250

250

250

250

250

250

250

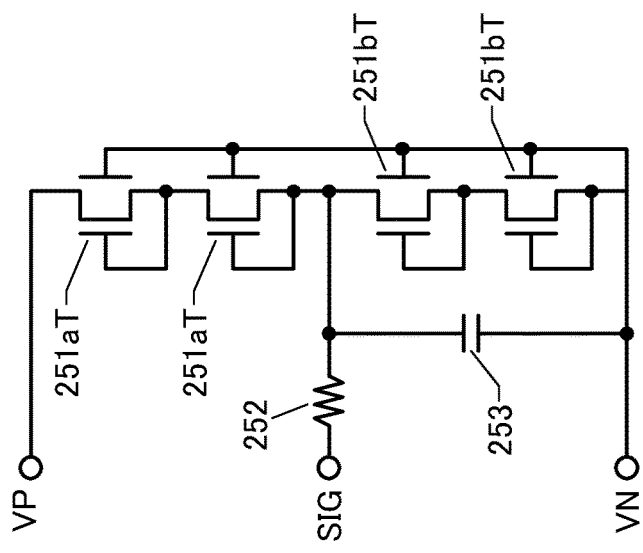
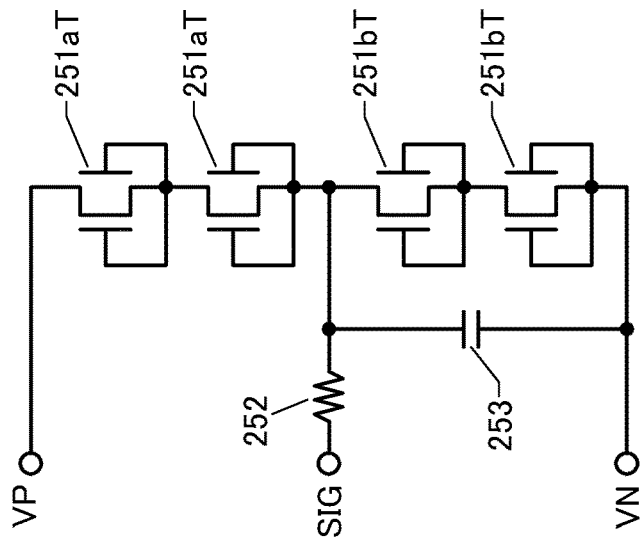
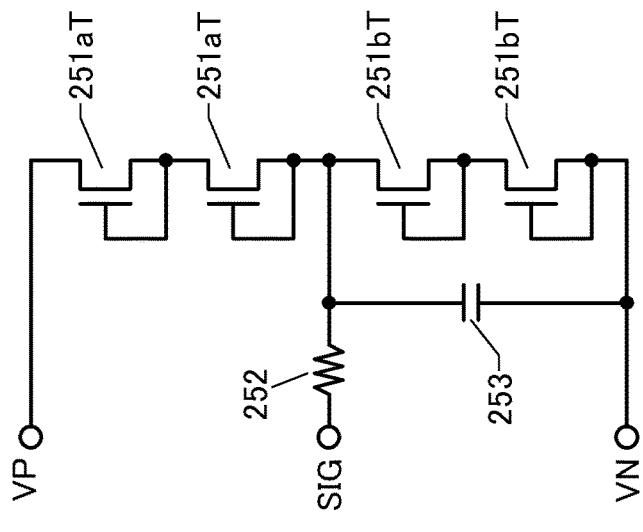

SEMICONDUCTOR DEVICE AND BATTERY PACK

CROSS REFERENCE TO RELATED APPLICATIONS

This application is a U.S. National Phase Application under 35 U.S.C. § 371 of International Application PCT/IB2019/059679, filed on Nov. 12, 2019, which is incorporated by reference and claims the benefit of foreign priority applications filed in Japan on Nov. 22, 2018, as Application No. 2018-219232, on Dec. 4, 2018, as Application No. 2018-227040, and on Dec. 19, 2018, as Application No. 2018-237055.

TECHNICAL FIELD

One embodiment of the present invention relates to a semiconductor device and a method for operating the semiconductor device. Another embodiment of the present invention relates to a battery control circuit, a battery protection circuit, a power storage device, and an electronic device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter. Thus, more specifically, examples of the technical field of one embodiment of the present invention disclosed in this specification include a display device, a light-emitting device, a power storage device, an imaging device, a memory device, a driving method thereof, and a manufacturing method thereof.

In this specification and the like, a semiconductor device generally means a device that can function by utilizing semiconductor characteristics. Thus, a semiconductor element such as a transistor or a diode and a semiconductor circuit are semiconductor devices. A display device, a light-emitting device, a lighting device, an electro-optical device, an electronic device, and the like may include a semiconductor element or a semiconductor circuit. Therefore, a display device, a light-emitting device, a lighting device, an electro-optical device, an imaging device, an electronic device, and the like are referred to as a semiconductor device in some cases.

BACKGROUND ART

In recent years, a variety of power storage devices such as lithium-ion secondary batteries, lithium-ion capacitors, and air batteries have been actively developed. In particular, demand for lithium-ion secondary batteries with high output and high energy density has rapidly grown with the development of the semiconductor industry for portable information terminals such as mobile phones, smartphones, tablets, or laptop computers; game machines; portable music players; digital cameras; medical equipment; next-generation clean energy vehicles such as hybrid electric vehicles (HEVs), electric vehicles (EVs), and plug-in hybrid electric vehicles (PHEVs); electric bikes; or the like, and lithium-ion secondary batteries have become essential as rechargeable energy supply sources for the modern information society.

Patent Document 1 discloses a semiconductor device that senses overcurrent to control charging and discharging of a secondary battery.

REFERENCE

Patent Document

[Patent Document 1] Japanese Published Patent Application No. 2014-166071

SUMMARY OF THE INVENTION

Problems to be Solved by the Invention

In the structure described in Patent Document 1, power consumption is likely to increase because a constant current source is used for sensing overcurrent. Furthermore, the structure described in Patent Document 1 is affected by a variation in resistance value of each of a transistor for discharging and a transistor for charging when sensing overcurrent, and thus the sensing accuracy is difficult to improve.

An object of one embodiment of the present invention is to provide a semiconductor device with reduced power consumption, or the like. Another object is to provide a semiconductor device that has excellent accuracy of sensing overcurrent, or the like. Another object is to provide a semiconductor device that is operated stably, or the like. Another object is to provide a semiconductor device with high reliability, or the like. Another object is to provide a semiconductor device with high productivity, or the like. Another object is to provide a novel semiconductor device or the like.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

One embodiment of the present invention is a semiconductor device including a node ND1, a node ND2, a resistor, a capacitor, and a comparison circuit, in which the resistor is electrically connected in series between one of a positive electrode and a negative electrode of a secondary battery and a first terminal. The resistor has a function of converting current flowing between the one of the positive electrode and the negative electrode of the secondary battery and the first terminal into a first voltage. The first voltage is added to a voltage of the node ND2 through the capacitor. The comparison circuit has a function of comparing a voltage of the node ND1 and the voltage of the node ND2. The comparison circuit outputs a signal that notifies detection of overcurrent when the voltage of the node ND2 is higher than the voltage of the node ND1.

Another embodiment of the present invention is a semiconductor device including first to fourth transistors and a comparator, in which one of a source and a drain of the first transistor is electrically connected to a non-inverting input terminal of the comparator; one of a source and a drain of the second transistor is electrically connected to an inverting input terminal of the comparator; one of a source and a drain of the third transistor is electrically connected to one of a source and a drain of the fourth transistor; and a resistor is included between the other of the source and the drain of the third transistor and the other of the source and the drain of the fourth transistor.

The resistance value of the resistor is preferably greater than or equal to 1 mΩ and less than or equal to 10Ω. A first capacitor may be provided at the one of the source and the drain of the first transistor. The capacitance value of the first capacitor is preferably greater than or equal to 0.01 fF and less than or equal to 100 pF. Furthermore, a second capacitor may be included between the one of the source and the drain of the second transistor and the one of the source and the drain of the third transistor. The capacitance value of the second capacitor is preferably greater than or equal to 0.01 fF and less than or equal to 100 pF.

Each of the first and second transistors preferably includes an oxide semiconductor in a semiconductor layer. Each of the third and fourth transistors preferably includes an oxide semiconductor in a semiconductor layer.

At least one of the first to fourth transistors may be a multi-gate transistor.

A potential supplied to the other of the source and the drain of the first transistor is preferably lower than a potential supplied to the other of the source and the drain of the second transistor.

Another embodiment of the present invention is a semiconductor device including a first transistor, a second transistor, and a comparator, in which one of a source and a drain of the first transistor is electrically connected to a non-inverting input terminal of the comparator; a first capacitor is provided at the one of the source and the drain of the first transistor; one of a source and a drain of the second transistor is electrically connected to an inverting input terminal of the comparator; and a second capacitor is included between the one of the source and the drain of the second transistor and a resistor.

Another embodiment of the present invention is a battery pack including a semiconductor device provided over a flexible substrate, an insulating sheet, and a secondary battery.

In the above battery pack, a first diode, a second diode, a second resistor, and a third capacitor may be provided. A cathode of the first diode is electrically connected to a positive electrode of the secondary battery, an anode of the first diode is electrically connected to a cathode of the second diode, and an anode of the second diode is electrically connected to a negative electrode of the secondary battery. The second resistor is provided between the anode of the first diode and an output terminal of the comparator, and the third capacitor is connected to the second diode in parallel.

One or both of the first diode and the second diode can be a transistor.

Effect of the Invention

According to one embodiment of the present invention, a semiconductor device with reduced power consumption, or the like can be provided. A semiconductor device that has excellent accuracy of sensing overcurrent, or the like can be provided. A semiconductor device that is operated stably, or the like can be provided. A semiconductor device with high reliability, or the like can be provided. A semiconductor device with high productivity, or the like can be provided. A novel semiconductor device or the like can be provided.

Note that the description of the effects does not preclude the existence of other effects. One embodiment of the present invention does not have to have all these effects. Other effects are apparent from the description of the specification, the drawings, the claims, and the like, and other effects can be derived from the description of the specification, the drawings, the claims, and the like.

BRIEF DESCRIPTION OF THE DRAWINGS

FIG. 21A to FIG. 21C are diagrams each illustrating an equivalent circuit of a protection device.

MODE FOR CARRYING OUT THE INVENTION

Figure 1:
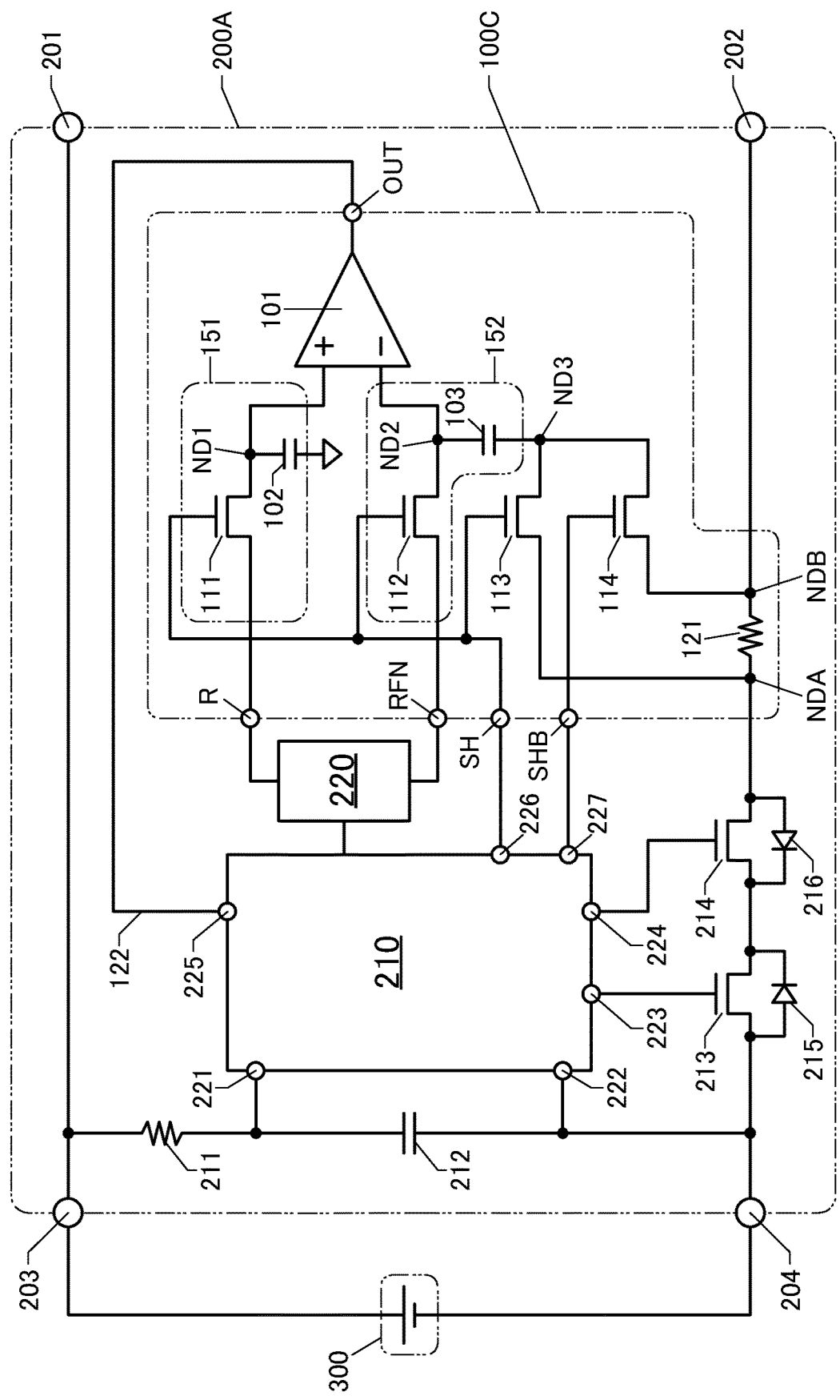
FIG. 1 is a diagram illustrating a structure example of a semiconductor device.

Embodiments are described in detail with reference to the drawings. However, the present invention is not limited to the following description, and it is readily appreciated by those skilled in the art that modes and details can be modified in various ways without departing from the spirit and the scope of the present invention. Thus, the present invention should not be construed as being limited to the description in the following embodiments. Note that in the structures of the present invention described below, the same portions or portions having similar functions are denoted by the same reference numerals in different drawings, and description thereof is not repeated.

The position, size, range, and the like of each component illustrated in the drawings and the like are not accurately represented in some cases to facilitate understanding of the invention. Therefore, the disclosed invention is not necessarily limited to the position, size, range, or the like disclosed in drawings and the like. For example, in the actual manufacturing process, a resist mask or the like might be unintentionally reduced in size by treatment such as etching, which is not illustrated in some cases for easy understanding.

In a top view (also referred to as a "plan view"), a perspective view, or the like, some components might be omitted for easy understanding of the drawings.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

In this specification and the like, a "terminal" in an electric circuit refers to a portion that inputs or outputs current or voltage or receives or transmits a signal. Accordingly, part of a wiring or an electrode functions as a terminal in some cases.

Note that the term "over" or "under" in this specification and the like does not necessarily mean that a component is placed directly over and in contact with or directly under and in contact with another component. For example, the expression "electrode B over insulating layer A" does not necessarily mean that the electrode B is formed on and in direct contact with the insulating layer A, and does not exclude the case where another component is provided between the insulating layer A and the electrode B.

Furthermore, functions of a source and a drain are interchanged with each other depending on operation conditions, for example, when a transistor of different polarity is employed or when the direction of current flow is changed in circuit operation; therefore, it is difficult to define which is the source or the drain. Thus, the terms "source" and "drain" can be interchanged with each other in this specification.

In this specification and the like, the expression "electrically connected" includes the case where components are directly connected to each other and the case where components are connected through an "object having any electric function". There is no particular limitation on the "object having any electric function" as long as electric signals can be transmitted and received between components that are connected through the object. Thus, even when the expression "electrically connected" is used, there is a case where no physical connection is made and a wiring just extends in an actual circuit.

In this specification and the like, "parallel" indicates a state where two straight lines are placed at an angle of greater than or equal to −10° and less than or equal to 10°, for example. Accordingly, the case where the angle is greater than or equal to −5° and less than or equal to 5° is also included. Furthermore, the terms "perpendicular" and "orthogonal" indicate a state where two straight lines are placed at an angle of greater than or equal to 80° and less than or equal to 100°, for example. Accordingly, the case where the angle is greater than or equal to 85° and less than or equal to 95° is also included.

In this specification and the like, the terms "identical", "same", "equal", "uniform", and the like used in describing calculation values and actual measurement values allow for a margin of error of ±20% unless otherwise specified.

Furthermore, in this specification, in the case where an etching treatment is performed after a resist mask is formed, the resist mask is removed after the etching treatment, unless otherwise specified.

A voltage refers to a potential difference between a given potential and a reference potential (e.g., a ground potential or a source potential) in many cases. Therefore, the terms "voltage" and "potential" can be replaced with each other in many cases. In this specification and the like, "voltage" and "potential" can be replaced with each other unless otherwise specified.

Note that a "semiconductor" has characteristics of an "insulator" when the conductivity is sufficiently low, for example. Thus, a "semiconductor" can be replaced with an "insulator". In that case, a "semiconductor" and an "insulator" cannot be strictly distinguished from each other because a border therebetween is not clear. Accordingly, a "semiconductor" and an "insulator" in this specification can be replaced with each other in some cases.

Furthermore, a "semiconductor" has characteristics of a "conductor" when the conductivity is sufficiently high, for example. Thus, a "semiconductor" can be replaced with a "conductor". In that case, a "semiconductor" and a "conductor" cannot be strictly distinguished from each other because a border therebetween is not clear. Accordingly, a "semiconductor" and a "conductor" in this specification can be replaced with each other in some cases.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in the scope of claims in order to avoid confusion among components. Furthermore, a term with an ordinal number in this specification and the like might be provided with a different ordinal number in the scope of claims. Furthermore, even when a term is provided with an ordinal number in this specification and the like, the ordinal number might be omitted in the scope of claims and the like.

Note that in this specification and the like, an "on state" of a transistor refers to a state in which a source and a drain of the transistor are electrically short-circuited (also referred to as a "conduction state"). Furthermore, an "off state" of the transistor refers to a state in which the source and the drain of the transistor are electrically disconnected (also referred to as a "non-conduction state").

In this specification and the like, in some cases, "on-state current" means a current that flows between a source and a drain when a transistor is in an on state. Furthermore, in some cases, "off-state current" means a current that flows between a source and a drain when a transistor is in an off state.

In this specification and the like, a high power supply potential VDD (hereinafter also simply referred to as "VDD" or an "H potential") is a power supply potential higher than a low power supply potential VSS. The low power supply potential VSS (hereinafter also simply referred to as "VSS" or an "L potential") is a power supply potential lower than the high power supply potential VDD. In addition, a ground potential can be used as VDD or VSS. For example, in the case where VDD is a ground potential, VSS is a potential lower than the ground potential, and in the case where VSS is a ground potential, VDD is a potential higher than the ground potential.

In this specification and the like, a gate refers to part or the whole of a gate electrode and a gate wiring. A gate wiring refers to a wiring for electrically connecting at least one gate electrode of a transistor to another electrode or another wiring.

In this specification and the like, a source refers to part or the whole of a source region, a source electrode, and a source wiring. A source region refers to a region in a semiconductor layer, where the resistivity is lower than or equal to a given value. A source electrode refers to part of a conductive layer that is connected to a source region. A source wiring refers to a wiring for electrically connecting at least one source electrode of a transistor to another electrode or another wiring.

In this specification and the like, a drain refers to part or the whole of a drain region, a drain electrode, and a drain wiring. A drain region refers to a region in a semiconductor layer, where the resistivity is lower than or equal to a given value. A drain electrode refers to part of a conductive layer that is connected to a drain region. A drain wiring refers to a wiring for electrically connecting at least one drain electrode of a transistor to another electrode or another wiring.

Embodiment 1

A semiconductor device of one embodiment of the present invention is described with reference to drawings.
<Structure Example of Semiconductor Device 200A>
FIG. 1 illustrates a structure example of a semiconductor device 200A. The semiconductor device 200A includes a terminal 201 to a terminal 204, a semiconductor device 100C, a control circuit 210, a potential generation circuit 220, a resistor 211, a capacitor 212, a transistor 213, a transistor 214, a diode 215, and a diode 216.

The semiconductor device 100C includes a terminal R, a terminal RFN, a terminal SH, a terminal SHB, and a terminal OUT. Furthermore, the semiconductor device 100C includes a comparator 101, a transistor 111 to a transistor 114, a capacitor 102, a capacitor 103, and a resistor 121.

The control circuit 210 includes a terminal 221 to a terminal 225. One terminal of the resistor 211 is electrically connected to the terminal 201 and the terminal 203, and the other terminal thereof is electrically connected to the terminal 221. One terminal of the capacitor 212 is electrically connected to the terminal 221, and the other terminal thereof is electrically connected to the terminal 222 and the terminal 204.

One of a source and a drain of the transistor 213 is electrically connected to the terminal 222 and the terminal 204, and a gate thereof is electrically connected to the terminal 223. An anode of the diode 215 is electrically connected to the one of the source and the drain of the transistor 213. A cathode of the diode 215 is electrically connected to the other of the source and the drain of the transistor 213.

One of a source and a drain of the transistor 214 is electrically connected to the other of the source and the drain of the transistor 213, and the other of the source and the drain of the transistor 214 is electrically connected to one terminal of the resistor 121. A gate of the transistor 214 is electrically connected to the terminal 224. A cathode of the diode 216 is electrically connected to the one of the source and the drain of the transistor 214. An anode of the diode 216 is electrically connected to the other of the source and the drain of the transistor 214. The other terminal of the resistor 121 is electrically connected to the terminal 202.

The potential generation circuit 220 has a function of supplying a potential $V_R$ to the terminal R and a function of supplying a potential $V_{RFN}$ to the terminal RFN. The control circuit 210 has a function of controlling operation of the potential generation circuit 220.

The comparator 101 includes a non-inverting input terminal, an inverting input terminal, and an output terminal. The comparator 101 has a function of outputting an H potential to the output terminal as a potential $V_{OUT}$ in the case where a potential of the non-inverting input terminal is higher than a potential of the inverting input terminal. The comparator 101 has a function of outputting an L potential to the output terminal as the potential $V_{OUT}$ in the case where the potential of the non-inverting input terminal is lower than the potential of the inverting input terminal. The comparator 101 functions as a comparison circuit. The output terminal of the comparator 101 is electrically connected to the terminal OUT. The terminal OUT is electrically connected to the terminal 225 of the control circuit 210 through a wiring 122.

One of a source and a drain of the transistor 111 is electrically connected to the terminal R, and the other of the source and the drain of the transistor 111 is electrically connected to the non-inverting input terminal of the comparator 101. A gate of the transistor 111 is electrically connected to the terminal SH.

One electrode of the capacitor 102 is electrically connected to the non-inverting input terminal of the comparator 101. A reference potential or a fixed potential is supplied to the other electrode of the capacitor 102.

A node where the other of the source and the drain of the transistor 111, the non-inverting input terminal of the comparator 101, and the one electrode of the capacitor 102 are electrically connected to each other is referred to as a node ND1.

One of a source and a drain of the transistor 112 is electrically connected to the terminal RFN, and the other of the source and the drain of the transistor 112 is electrically connected to the inverting input terminal of the comparator 101. A gate of the transistor 112 is electrically connected to the terminal SH.

One electrode of the capacitor 103 is electrically connected to the inverting input terminal of the comparator 101.

A node where the other of the source and the drain of the transistor 112, the inverting input terminal of the comparator 101, and the one electrode of the capacitor 103 are electrically connected to each other is referred to as a node ND2.

One of a source and a drain of the transistor 113 is electrically connected to the one terminal of the resistor 121, and the other of the source and the drain of the transistor 113 is electrically connected to the other electrode of the capacitor 103. A gate of the transistor 113 is electrically connected to the terminal SH.

One of a source and a drain of the transistor 114 is electrically connected to the other terminal of the resistor 121, and the other of the source and the drain of the transistor 114 is electrically connected to the other electrode of the capacitor 103. A gate of the transistor 114 is electrically connected to the terminal SHB.

Note that the terminal SHB is supplied with an inverted potential of the terminal SH. For example, when an H potential is supplied to the terminal SH, an L potential is supplied to the terminal SHB. Similarly, when an L potential is supplied to the terminal SH, an H potential is supplied to the terminal SHB. However, in a given specific period of circuit operation, the potentials of the terminal SHB and the terminal SH may be the same.

A node where the other of the source and the drain of the transistor 113, the other of the source and the drain of the transistor 114, and the other electrode of the capacitor 103 are electrically connected to each other is referred to as a node ND3.

A node where the other of the source and the drain of the transistor 214, the one of the source and the drain of the transistor 113, and the one terminal of the resistor 121 are electrically connected to each other is referred to as a node NDA. A node where the one of the source and the drain of the transistor 114, the other terminal of the resistor 121, and the terminal 202 are electrically connected to each other is referred to as a node NDB.

A positive electrode of a secondary battery 300 is electrically connected to the terminal 203, and a negative electrode thereof is electrically connected to the terminal 204.

As each of the transistor 111 to the transistor 114, a transistor including an oxide semiconductor, which is a kind of a metal oxide, in a semiconductor layer where a channel is formed (also referred to as an "OS transistor") is preferably used. In particular, OS transistors are preferably used as the transistor 111 and the transistor 112.

The OS transistor can have extremely low off-state current. Specifically, the off-state current per micrometer of channel width at room temperature can be lower than $1 \times 10^{-20}$ A, preferably lower than $1 \times 10^{-22}$ A, further preferably lower than $1 \times 10^{-24}$ A.

The off-state current of the OS transistor hardly increases even in a high temperature environment. Specifically, the off-state current hardly increases even at an environment temperature higher than or equal to room temperature and lower than or equal to 200° C. When S transistors are used as transistors included in a semiconductor device, the semiconductor device achieves stable operation and high reliability even in a high temperature environment.

The use of an OS transistor as the transistor 111 can make the capacitor 102 small. Alternatively, parasitic capacitance of the transistor or the like can be used instead of the capacitor 102 without providing the capacitor 102. As a result, the area occupied by the semiconductor device 100C can be reduced. Thus, the area occupied by the semiconductor device 200A can be reduced.

In general, a capacitor has a structure in which two electrodes face each other with a dielectric therebetween. A capacitance value is proportional to the area where the facing electrodes overlap with each other and a relative permittivity of the dielectric and inversely proportional to the distance between the two electrodes. In the case where the capacitor 102 is provided and the capacitance value is too large, the area occupied by the semiconductor device 200A tends to be large, which is not preferable. Furthermore, when the capacitance value of the capacitor 102 is large, power consumption due to charging and discharging of the capacitor 102 is increased.

In the case where the capacitor 102 is provided, the capacitance value of the capacitor 102 is preferably greater than or equal to 0.01 fF and less than or equal to 100 pF, further preferably greater than or equal to 0.05 fF and less than or equal to 10 pF, still further preferably greater than or equal to 0.1 fF and less than or equal to 1 pF.

Similarly, the use of an OS transistor as the transistor 112 can make the capacitor 103 small. Alternatively, parasitic capacitance of the transistor or the like can be used instead of the capacitor 103 without providing the capacitor 103.

In the case where the capacitor 103 is provided and the capacitance value is too large, the area occupied by the semiconductor device 200A tends to be large, which is not preferable. Furthermore, when the capacitance value of the capacitor 103 is large, power consumption due to charging and discharging of the capacitor 103 is increased.

In the case where the capacitor 103 is provided, the capacitance value of the capacitor 103 is preferably greater than or equal to 0.01 fF and less than or equal to 100 pF, further preferably greater than or equal to 0.05 fF and less than or equal to 10 pF, still further preferably greater than or equal to 0.1 fF and less than or equal to 1 pF.

The off-state current of the OS transistor is less likely to increase even in a high temperature environment (e.g., in an environment higher than or equal to 50° C. and lower than or equal to 150° C.). Accordingly, potentials (charges) supplied to the node ND1 and the node ND2 can be held for a long period even in a high temperature environment.

In this manner, the transistor 111 and the capacitor 102 form a memory element 151. In addition, the transistor 112 and the capacitor 103 form a memory element 152. A memory element using an OS transistor as a transistor forming the memory element may be referred to as an "OS memory"

An OS transistor has high withstand voltage between its source and drain. Accordingly, OS transistors can also be used as the transistor 213 and the transistor 214. Using an OS transistor can provide a highly reliable semiconductor device or the like.

Note that a charge control circuit, a discharge control circuit, an overcurrent detection circuit, an anomaly detection circuit, a secondary battery control system, and the like, each including an OS transistor, may be referred to as BTOS (Battery operating system or Battery oxide semiconductor).

<Operation Example of Semiconductor Device 200A>

The control circuit 210 has a function of selecting the on state and the off state of the transistor 213. Furthermore, the control circuit 210 has a function of selecting the on state and the off state of the transistor 214.

The secondary battery 300 is charged in such a manner that the positive electrode of an external power source for charging is connected to the terminal 201 and the negative electrode of the power source is connected to the terminal 202. The charging operation is performed by bringing the transistor 214 into an on state. Current supplied from the external power source is made to flow from the terminal 201 to the terminal 202 through the terminal 203 and the terminal 204, whereby the secondary battery 300 can be charged.

The secondary battery 300 is discharged in such a manner that a load is connected between the terminal 201 and the terminal 202. The discharging operation is performed by bringing the transistor 213 into an on state. In the discharging operation, current flows from the terminal 202 to the terminal 201 through the terminal 204 and the terminal 203. The direction in which current flows through the resistor 121 in the discharging operation is opposite to that in the charging operation.

The control circuit 210 has a function of detecting the state of the secondary battery 300, such as a charging voltage and a temperature of the secondary battery 300. The control circuit 210 also has a function of detecting the state of the secondary battery 300 to control execution or stop of the charging operation and the discharging operation.

Specifically, the control circuit 210 can stop the discharging operation of the secondary battery 300 by bringing the transistor 213 into an off state. Moreover, the control circuit 210 can stop the charging operation of the secondary battery 300 by bringing the transistor 214 into an off state. One of the transistor 213 and the transistor 214 is brought into an off state, whereby one of the charging operation and the discharging operation of the secondary battery 300 can be stopped.

The semiconductor device 100C has a function of detecting current higher than or equal to a specific value (also referred to as "overcurrent") flowing through the resistor 121 in the charging operation. Specifically, the semiconductor device 100C outputs an H potential upon detecting overcurrent during the charging operation. An output of the semiconductor device 100C (the potential $V_{OUT}$) is supplied to the terminal 225 of the control circuit 210 through the wiring 122. The semiconductor device 100C functions as an overcurrent detection circuit in the charging operation.

When the terminal 225 is supplied with an H potential, the control circuit 210 of the semiconductor device 200A brings the transistor 214 into an off state to stop the charging operation. Charging with overcurrent is not performed, which can prevent a rapid deterioration of characteristics of the secondary battery 300. Thus, the lifetime of the secondary battery 300 can be extended. Furthermore, the reliability of the secondary battery 300 can be improved. Moreover, the safety of the secondary battery 300 can be improved.

[Operation Example of Semiconductor Device 100C]

The semiconductor device 100C functions as an overcurrent detection circuit. Operation examples of the semiconductor device 100C are described with reference to FIG. 2 and FIG. 3. FIG. 2 and FIG. 3 are each a diagram illustrating an operation state of the semiconductor device 100C.

In the drawings and the like, for easy understanding of the potentials of a wiring and an electrode, "H" representing an H potential or "L" representing an L potential is sometimes written near the wiring and the electrode. In addition, enclosed "H" or "L" is sometimes written near a wiring and an electrode whose potential changes. Moreover, a symbol "x" is sometimes written on a transistor in an off state.

As described above, the potential $V_R$ is supplied to the terminal R, and the potential $V_{RFN}$ is supplied to the terminal RFN. In this embodiment, the potential $V_R$ is set to 1.1 V and the potential $V_{RFN}$ is set to 1.25 V.

Figure 2A:
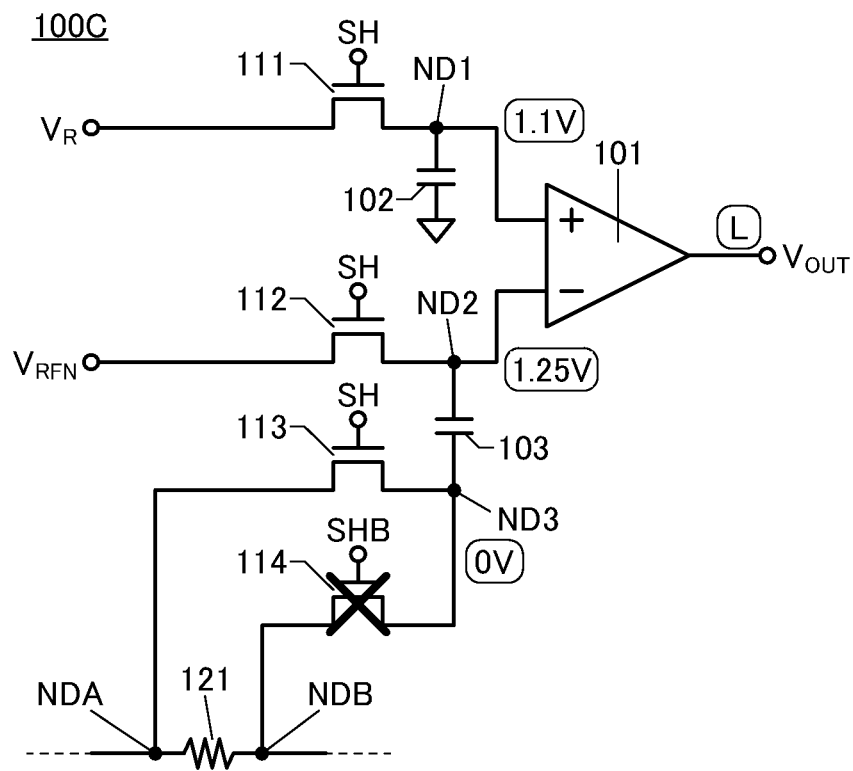
FIG. 2A and FIG. 2B are diagrams illustrating an operation example of a semiconductor device.

First, an H potential is supplied to the terminal SH before start of charging, and an L potential is supplied to the terminal SHB (see FIG. 2A). Then, the transistor 111 is brought into an on state, and the potential of the node ND1 becomes 1.1 V. The transistor 112 is brought into an on state, and the potential of the node ND2 becomes 1.25 V. Thus, the potential $V_{OUT}$ output from the comparator 101 becomes an L potential.

At this time, current does not flow through the resistor 121, and thus the potentials of the node NDA and the node NDB are each 0 V (a reference potential). When an H potential is supplied to the terminal SH, the transistor 113 is brought into an on state, and the potential of the node ND3 becomes 0 V.

Figure 2B:
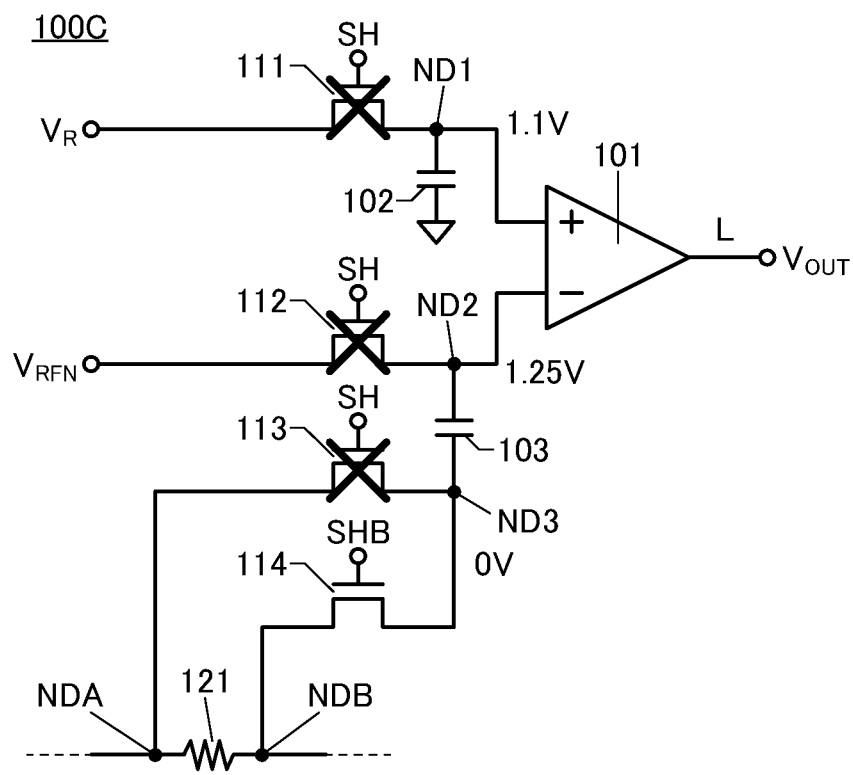

Next, an L potential is supplied to the terminal SH, and an H potential is supplied to the terminal SHB (see FIG. 2B). Then, the transistor 111 is brought into an off state, and thus the potential of the node ND1 is retained. Similarly, the transistor 112 is brought into an off state, and thus the potential of the node ND2 is retained. The transistor 113 is also brought into an off state.

Next, charging operation is started. When charging is started, current $I_C$ flows through the resistor 121 (see FIG. 3A). The current $I_C$ flows from the node NDA to the node NDB, and thus the potential of the node NDB becomes lower than 0 V when the charging is started. Accordingly, the potential of the node ND3 also becomes lower than 0 V.

The resistance value of the resistor 121 is preferably greater than or equal to 1 mΩ and less than or equal to 10Ω, further preferably greater than or equal to 5 mΩ and less than or equal to 5Ω, still further preferably greater than or equal to 10 mΩ and less than or equal to 1Ω. Changing the resistance value of the resistor 121 allows the value of overcurrent detected by the semiconductor device 100C to be changed. Part of the wiring may function as the resistor 121. In other words, wiring resistance may be used as the resistor 121.

A resistance value $R_D$ (Ω) of the resistor 121 for sensing current higher than or equal to a current value $I_{th}$(A) as overcurrent can be obtained by Formula 1.

[Formula 1]

$$R_D = \frac{V_{RFN} - V_R}{I_{th}} \quad (1)$$

In the case where the current value Ith is set to 1 mA, for example, the potential $V_{RFN}$ is 1.25 V, and the potential $V_R$ is 1.1 V; therefore, it is found that the resistance value $R_D$ can be set to 150Ω from Formula 1.

Figure 3A:
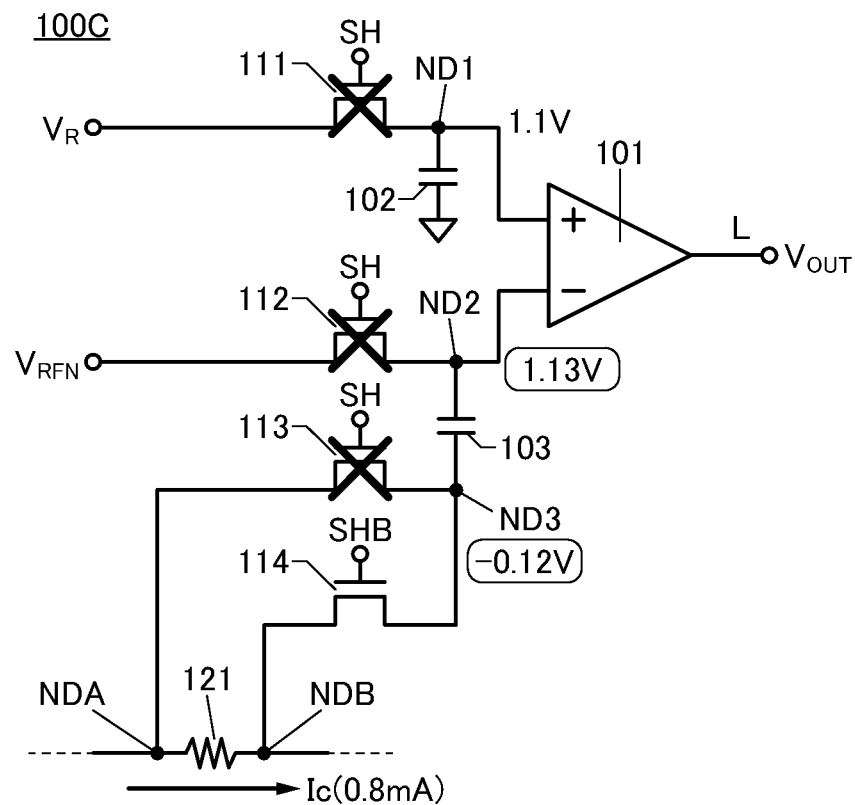
FIG. 3A and FIG. 3B are diagrams illustrating an operation example of a semiconductor device.

FIG. 3A illustrates a state in which a current of 0.8 mA flows as the current $I_C$ when the resistance value $R_D$ of the resistor 121 is 150Ω. In this case, the potential of the node NDB becomes −0.12 V. Thus, the potential of the node ND3 also becomes −0.12 V. The node ND3 and the node ND2 are capacitively coupled through the capacitor 103. Thus, the potential of the node ND2 becomes 1.13 V. The potential of the node ND2 remains higher than the potential of the node ND1. Accordingly, the potential $V_{OUT}$ remains an L potential.

Figure 3B:
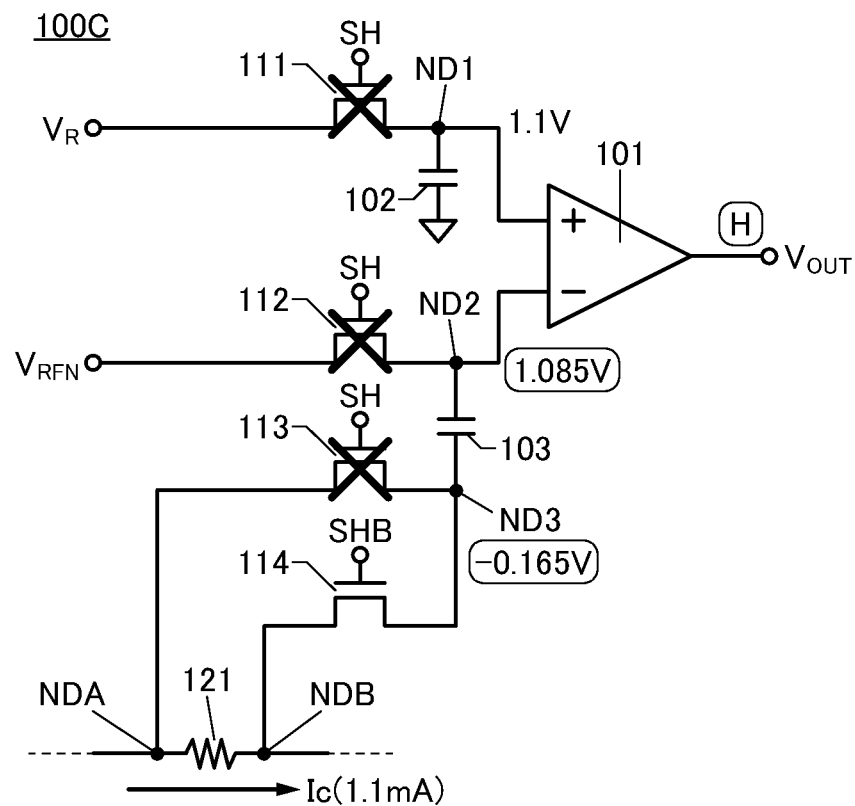

FIG. 3B illustrates a state in which a current of 1.1 mA flows as the current $I_C$ when the resistance value $R_D$ of the resistor 121 is 150Ω. In this case, the potential of the node NDB becomes −0.165 V. Thus, the potential of the node ND3 also becomes −0.165 V. For the same reason as the above, the potential of the node ND2 becomes 1.085 V. Accordingly, the potential of the node ND2 becomes lower than the potential of the node ND1, and thus the potential $V_{OUT}$ becomes an H potential.

In this manner, overcurrent in the charging operation can be detected. The semiconductor device 100C of one embodiment of the present invention has a structure in which overcurrent is detected by the resistor 121 connected to the terminal 202, the transistor 213, and the transistor 214 in series. Accordingly, overcurrent can be detected with high accuracy without being affected by a variation in the resistance values of the transistor 213 and the transistor 214.

Figure 4A:
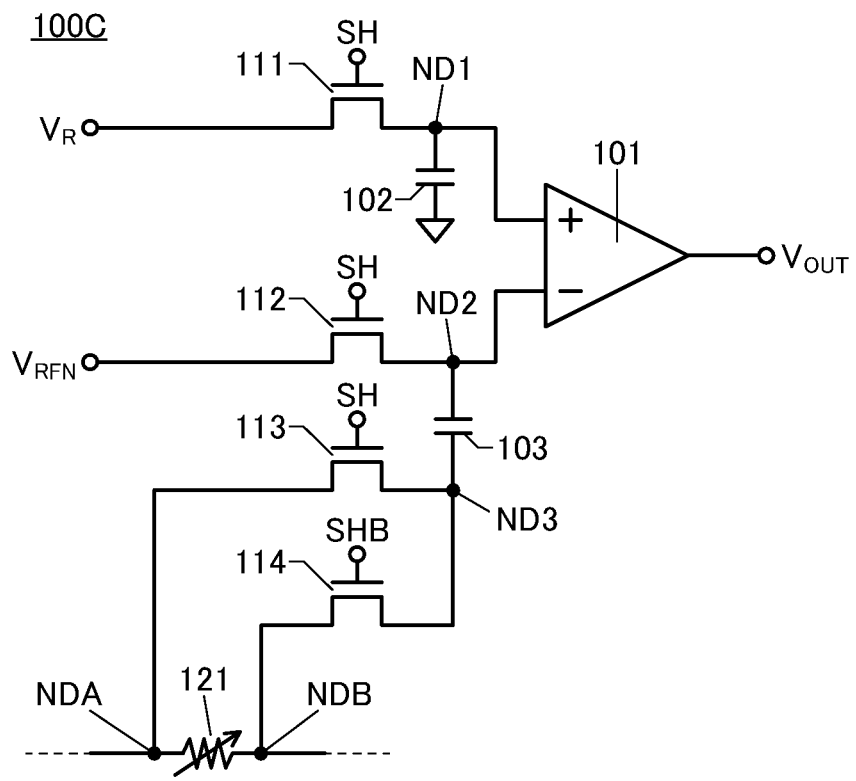
FIG. 4A and FIG. 4B are diagrams each illustrating a structure example of a semiconductor device.

Note that the resistor 121 is not limited to a fixed resistor. As illustrated in FIG. 4A, the resistor 121 may be a variable resistor. When the resistor 121 is a variable resistor, the current value $I_{th}$ can be appropriately changed. For example, the current value $I_{th}$ can be changed to an optimal value depending on the surface temperature of the secondary battery 300.

Figure 4B:
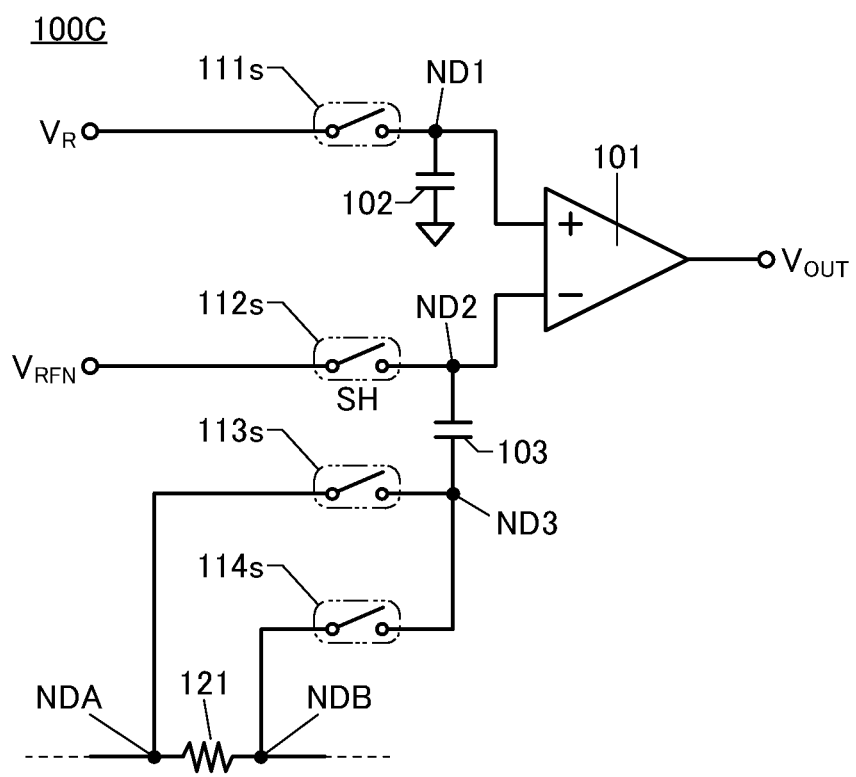

The transistor 111 to the transistor 114, the transistor 213, and the transistor 214 function as switches. Note that a switch is an element having a function of switching a conduction state (ON) or a non-conduction state (OFF) between terminals and a function of controlling whether to flow current. A source of a transistor corresponds to one end of the switch, and a drain of the transistor corresponds to the other end of the switch. Accordingly, as illustrated in FIG. 4B, the transistor 111 to the transistor 114 included in the semiconductor device 100C can be replaced with a switch 111s to a switch 114s, for example.

Figure 5A:
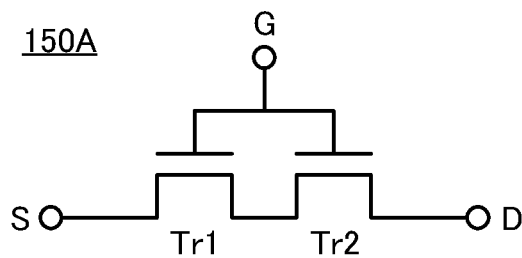
FIG. 5A to FIG. 5D are diagrams illustrating circuit symbols for transistors.

The transistor 111 to the transistor 114, the transistor 213, and the transistor 214 may each be a double-gate transistor. FIG. 5A illustrates a circuit symbol example of a double-gate transistor 150A.

The transistor 150A has a structure in which a transistor Tr1 and a transistor Tr2 are connected in series. FIG. 5A illustrates a state in which one of a source and a drain of the transistor Tr1 is electrically connected to a terminal S, the other of the source and the drain of the transistor Tr1 is electrically connected to one of a source and a drain of the transistor Tr2, and the other of the source and the drain of the transistor Tr2 is electrically connected to a terminal D. FIG. 5A illustrates a state in which gates of the transistor Tr1 and the transistor Tr2 are electrically connected to each other and electrically connected to a terminal G.

The transistor 150A illustrated in FIG. 5A has a function of switching a conduction state and a non-conduction state between the terminal S and the terminal D by changing the potential of the terminal G. Thus, the transistor 150A which is a double-gate transistor functions as one transistor including the transistor Tr1 and the transistor Tr2. In other words, it can be said that in FIG. 5A, one of a source and a drain of the transistor 150A is electrically connected to the terminal S, the other of the source and the drain thereof is electrically connected to the terminal D, and a gate thereof is electrically connected to the terminal G.

Figure 5B:
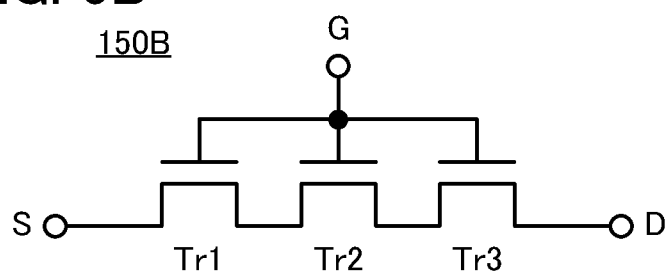

The transistor 111 to the transistor 114, the transistor 213, and the transistor 214 may each be a triple-gate transistor. FIG. 5B illustrates a circuit symbol example of a triple-gate transistor 150B.

The transistor 150B has a structure in which the transistor Tr1, the transistor Tr2, and a transistor Tr3 are connected in series. FIG. 5B illustrates a state in which the one of the source and the drain of the transistor Tr1 is electrically connected to the terminal S, the other of the source and the drain of the transistor Tr1 is electrically connected to the one of the source and the drain of the transistor Tr2, the other of the source and the drain of the transistor Tr2 is electrically connected to one of a source and a drain of the transistor Tr3, and the other of the source and the drain of the transistor Tr3 is electrically connected to the terminal D. FIG. 5B illustrates a state in which gates of the transistor Tr1, the transistor Tr2, and the transistor Tr3 are electrically connected to each other and electrically connected to the terminal G.

The transistor 150B illustrated in FIG. 5B has a function of switching a conduction state and a non-conduction state between the terminal S and the terminal D by changing the potential of the terminal G. Thus, the transistor 150B which is a triple-gate transistor functions as one transistor including the transistor Tr1, the transistor Tr2, and the transistor Tr3. In other words, it can be said that in FIG. 5B, one of a source and a drain of the transistor 150B is electrically connected to the terminal S, the other of the source and the drain thereof is electrically connected to the terminal D, and a gate thereof is electrically connected to the terminal G.

Like the transistor 150A and the transistor 150B, a transistor including a plurality of gates electrically connected to each other is referred to as a "multi-gate type transistor" or a "multi-gate transistor" in some cases.

Figure 5C:
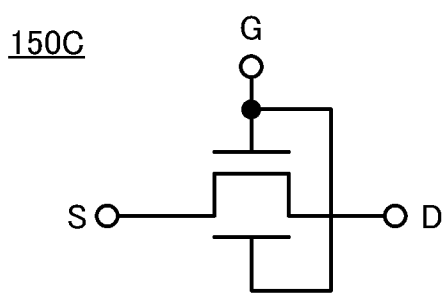
Figure 5D:
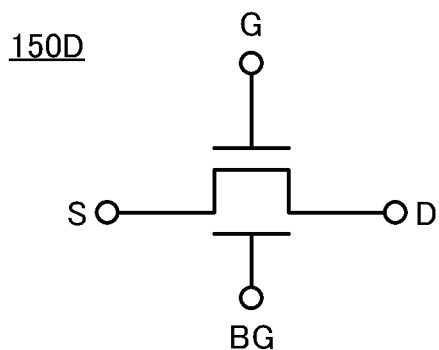

The transistor 111 to the transistor 114, the transistor 213, and the transistor 214 may each be a transistor including a back gate. FIG. 5C illustrates a circuit symbol example of a transistor 150C including a back gate. FIG. 5D illustrates a circuit symbol example of a transistor 150D including a back gate.

The transistor 150C has a structure in which a gate and the back gate are electrically connected to each other. The transistor 150D has a structure in which the back gate is electrically connected to a terminal BG. The back gate is placed so that a channel formation region of a semiconductor layer is interposed between the gate and the back gate. The back gate can function in a manner similar to that of the gate.

When the gate and the back gate are electrically connected to each other, the on-state current of the transistor can be increased. By changing the potential of the back gate independently, the threshold voltage of the transistor can be changed.

Modification Example

Figure 6:
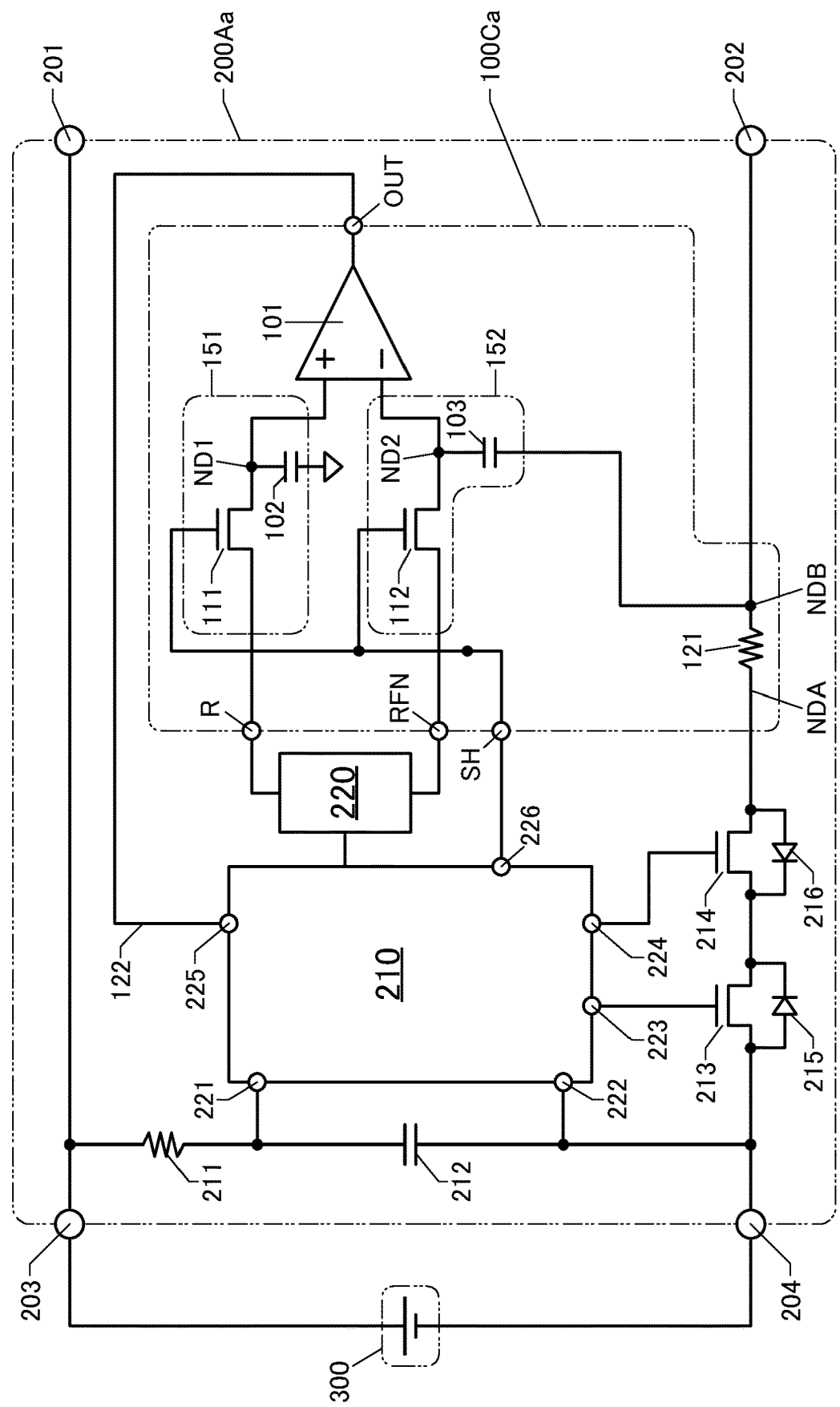
FIG. 6 is a diagram illustrating a structure example of a semiconductor device.

FIG. 6 illustrates a structure example of a semiconductor device 200Aa, which is a modification example of the semiconductor device 200A. In order to reduce repeated description, differences from the semiconductor device 200A are mainly described in this embodiment. The semiconductor device 200Aa is different from the semiconductor device 200A in that a semiconductor device 100Ca is included instead of the semiconductor device 100C.

The semiconductor device 100Ca has a structure in which the transistor 113, the transistor 114, and the terminal SHB are removed from the semiconductor device 100C. In the semiconductor device 100Ca, the other electrode of the capacitor 103 is electrically connected to the other terminal of the resistor 121. Thus, in the semiconductor device 200Aa, a node where the other electrode of the capacitor 103 and the other terminal of the resistor 121 are electrically connected to each other is referred to as the node NDB. Moreover, in the semiconductor device 200Aa, a node where the other of the source and the drain of the transistor 214 and the one terminal of the resistor 121 are electrically connected to each other is referred to as the node NDA.

The semiconductor device 100Ca includes less components than the semiconductor device 100C and thus can have a smaller occupation area. The semiconductor device 100Ca does not include the terminal SHB, and thus the terminal 227 can be removed from the control circuit 210 included in the semiconductor device 200Aa.

[Operation Example of Semiconductor Device 100Ca]

The semiconductor device 100Ca functions as an overcurrent detection circuit like the semiconductor device 100C. Operation examples of the semiconductor device 100Ca are described with reference to FIG. 7 and FIG. 8. FIG. 7 and FIG. 8 are each a diagram illustrating an operation state of the semiconductor device 100Ca.

Figure 7A:
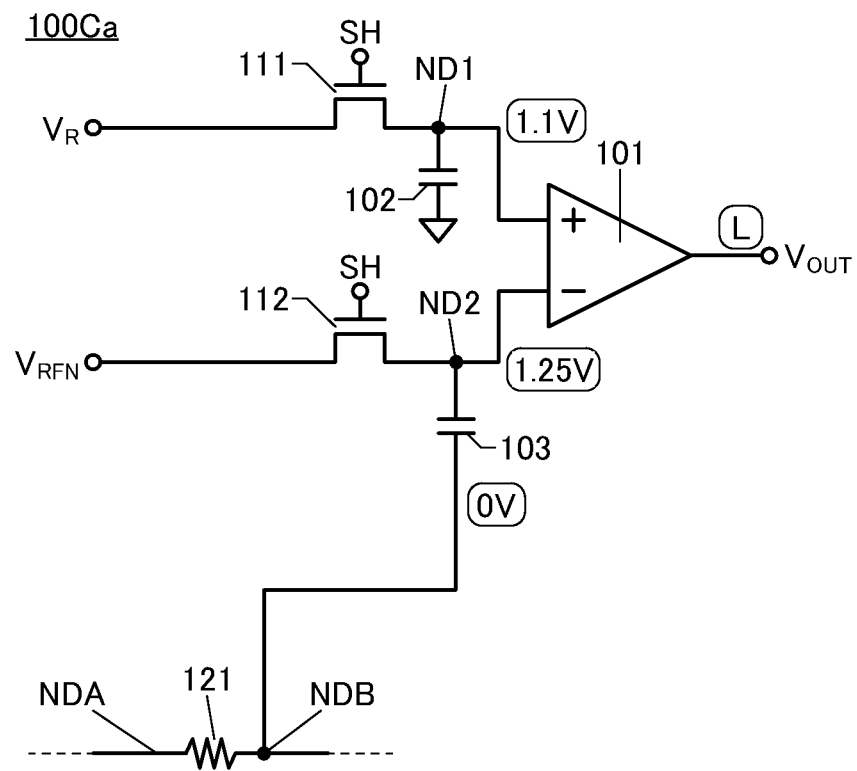
FIG. 7A and FIG. 7B are diagrams illustrating an operation example of a semiconductor device.

First, an H potential is supplied to the terminal SH before start of charging (FIG. 7A). Then, the transistor 111 is brought into an on state, and the potential of the node ND1 becomes 1.1 V. The transistor 112 is brought into an on state, and the potential of the node ND2 becomes 1.25 V. Thus, the potential $V_{OUT}$ output from the comparator 101 becomes an L potential.

At this time, current does not flow through the resistor 121, and thus the potential of the node NDB is 0 V (a reference potential).

Figure 7B:
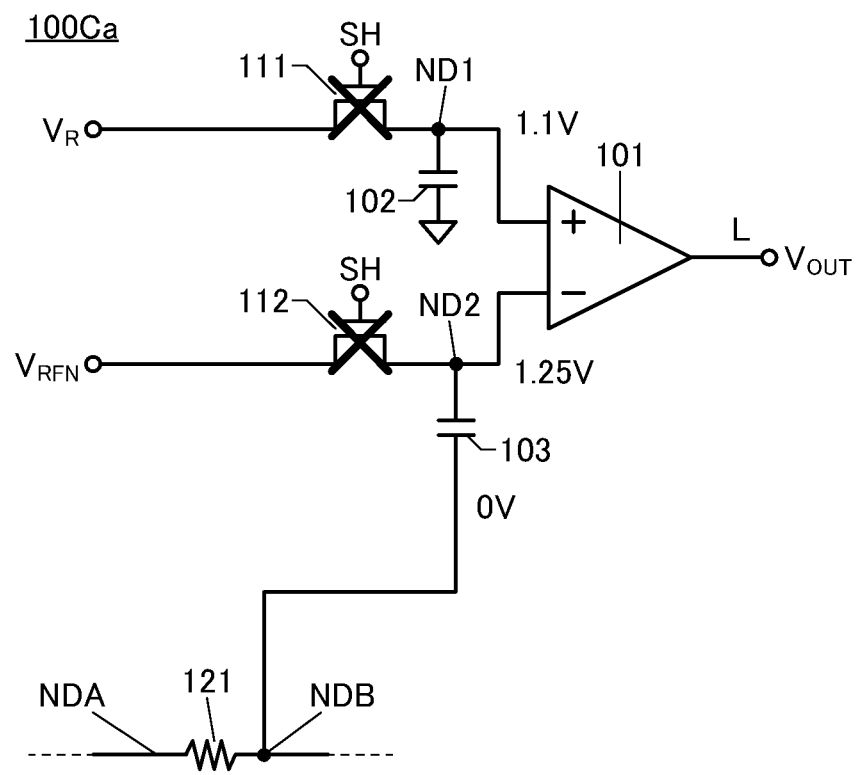

Next, an L potential is supplied to the terminal SH (see FIG. 7B). Then, the transistor 111 is brought into an off state, and thus the potential of the node ND1 is retained. Similarly, the transistor 112 is brought into an off state, and thus the potential of the node ND2 is retained.

Figure 8A:
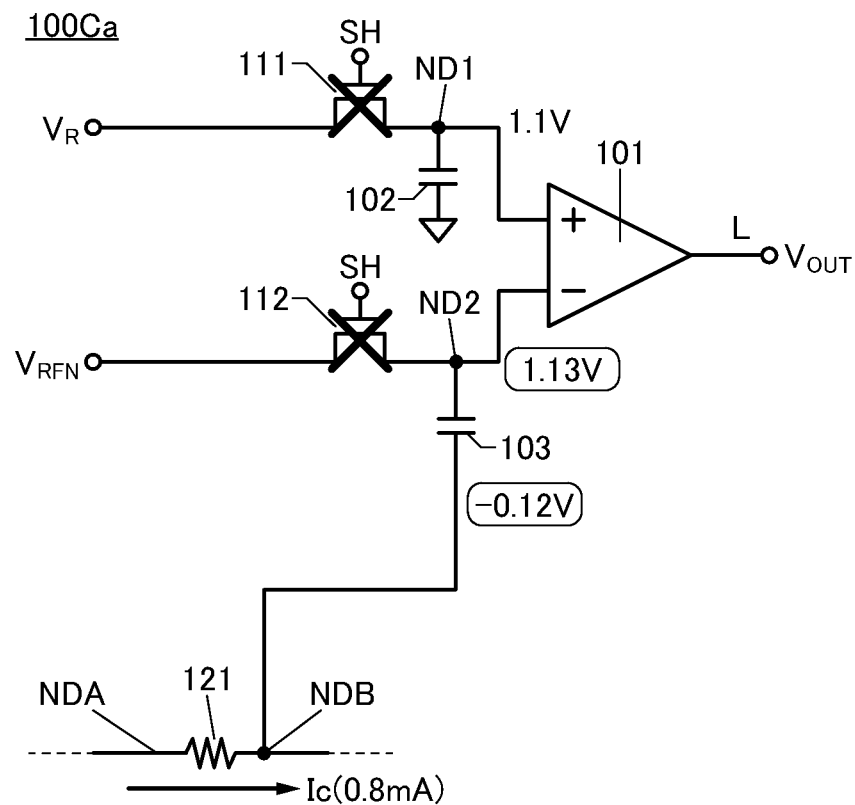
FIG. 8A and FIG. 8B are diagrams illustrating an operation example of a semiconductor device.

Next, charging operation is started. When charging is started, the current $I_C$ flows through the resistor 121 (see FIG. 8A). The current IC flows from the node NDA to the node NDB, and thus when the charging is started, the potential of the node NDB is lower than 0 V. FIG. 8A illustrates a state in which a current of 0.8 mA flows as the current $I_C$ when the resistance value RD of the resistor 121 is 150Ω. In this case, the potential of the node NDB becomes −0.12 V. The node NDB and the node ND2 are capacitively coupled through the capacitor 103. Thus, the potential of the node ND2 becomes 1.13 V. The potential of the node ND2 remains higher than the potential of the node ND1. Accordingly, the potential $V_{OUT}$ remains an L potential.

Figure 8B:
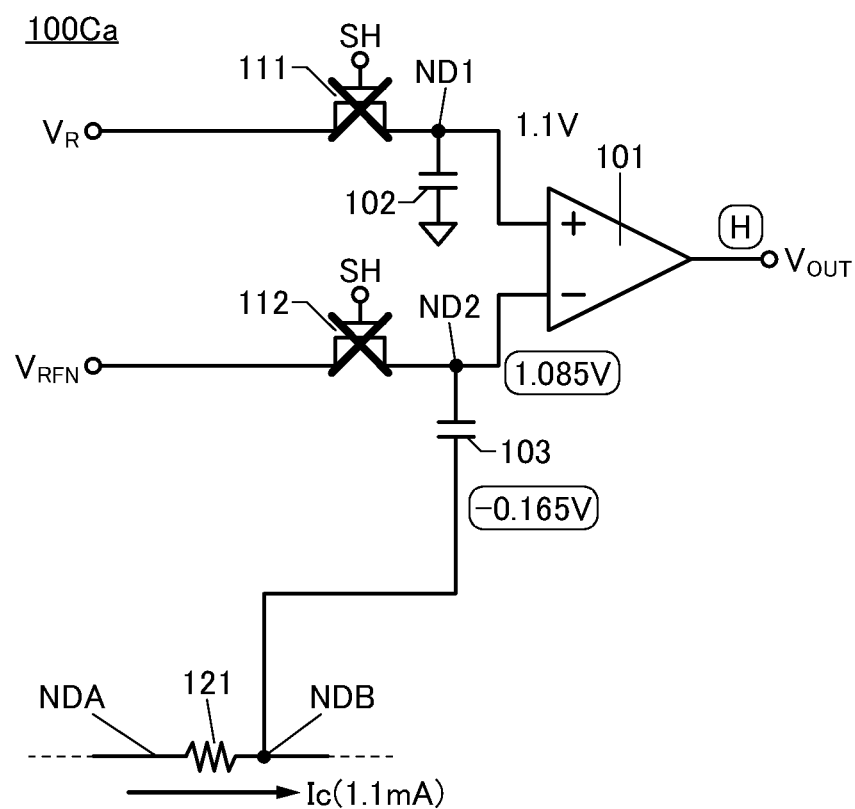

FIG. 8B illustrates a state in which a current of 1.1 mA flows as the current $I_C$ when the resistance value $R_D$ of the resistor 121 is 150Ω. In this case, the potential of the node NDB becomes −0.165 V. For the same reason as the above, the potential of the node ND2 becomes 1.085 V. Accordingly, the potential of the node ND2 becomes lower than the potential of the node ND1, and thus the potential $V_{OUT}$ becomes an H potential.

In this manner, overcurrent in the charging operation can be detected. The semiconductor device 200Aa of one embodiment of the present invention includes less components than the semiconductor device 200A and thus can have a smaller occupation area.

Note that the semiconductor device of one embodiment of the present invention is not interpreted as being limited to the circuit diagrams described in this embodiment. The semiconductor device of one embodiment of the present invention also includes a semiconductor device having a circuit structure comparable to the circuit structure described in this embodiment.

This embodiment can be implemented in combination with any of the structures described in the other embodiments and the like, as appropriate.

Embodiment 2

In this embodiment, a different structure example and the like of the semiconductor device of one embodiment of the present invention are described with reference to drawings.

<Structure Example of Semiconductor Device 200B>

Figure 9:
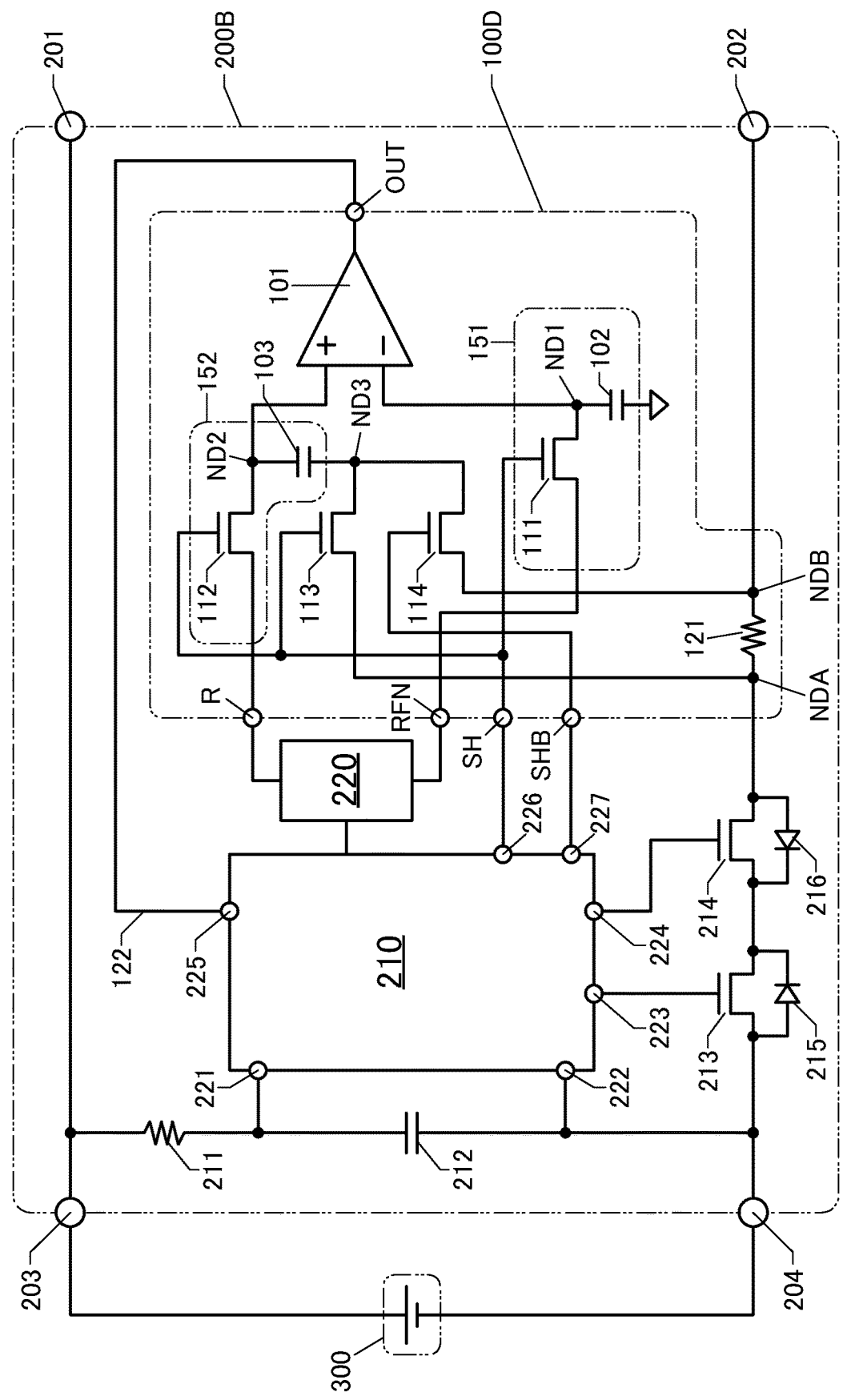
FIG. 9 is a diagram illustrating a structure example of a semiconductor device.

FIG. 9 illustrates a structure example of a semiconductor device 200B. The semiconductor device 200B is a modification example of the semiconductor device 200A. Accordingly, in order to reduce repeated description, differences from the semiconductor device 200A are mainly described in this embodiment.

The semiconductor device 200B is different from the semiconductor device 200A in that a semiconductor device 100D is included instead of the semiconductor device 100C. The semiconductor device 100D includes the terminal R, the terminal RFN, the terminal SH, the terminal SHB, and the terminal OUT like the semiconductor device 100C. Furthermore, the semiconductor device 100D includes the comparator 101, the transistor 111 to the transistor 114, the capacitor 102, the capacitor 103, and the resistor 121.

In the semiconductor device 100D, the one of the source and the drain of the transistor 111 is electrically connected to the terminal RFN, and the other of the source and the drain of the transistor 111 is electrically connected to the inverting input terminal of the comparator 101. The gate of the transistor 111 is electrically connected to the terminal SH.

The one electrode of the capacitor 102 is electrically connected to the inverting input terminal of the comparator 101. A reference potential or a fixed potential is supplied to the other electrode of the capacitor 102.

A node where the other of the source and the drain of the transistor 111, the inverting input terminal of the comparator 101, and the one electrode of the capacitor 102 are electrically connected to each other is referred to as the node ND1.

The one of the source and the drain of the transistor 112 is electrically connected to the terminal R, and the other of the source and the drain of the transistor 112 is electrically connected to the non-inverting input terminal of the comparator 101. The gate of the transistor 112 is electrically connected to the terminal SH.

The one electrode of the capacitor 103 is electrically connected to the non-inverting input terminal of the comparator 101.

A node where the other of the source and the drain of the transistor 112, the non-inverting input terminal of the comparator 101, and the one electrode of the capacitor 103 are electrically connected to each other is referred to as the node ND2.

The one of the source and the drain of the transistor 113 is electrically connected to the one terminal of the resistor 121, and the other of the source and the drain of the transistor 113 is electrically connected to the other electrode of the capacitor 103. The gate of the transistor 113 is electrically connected to the terminal SH.

The one of the source and the drain of the transistor 114 is electrically connected to the other terminal of the resistor 121, and the other of the source and the drain of the transistor 114 is electrically connected to the other electrode of the capacitor 103. The gate of the transistor 114 is electrically connected to the terminal SHB.

A node where the other of the source and the drain of the transistor 113, the other of the source and the drain of the transistor 114, and the other electrode of the capacitor 103 are electrically connected to each other is referred to as the node ND3.

<Operation Example of Semiconductor Device 200B>

The semiconductor device 100D included in the semiconductor device 200B has a function of detecting current higher than or equal to a specific value (also referred to as "overcurrent") flowing through the resistor 121 in discharging operation. Specifically, the semiconductor device 100D outputs an H potential upon detecting overcurrent during the discharging operation. The semiconductor device 100D functions as an overcurrent detection circuit in the discharging operation. An output of the semiconductor device 100D (the potential $V_{OUT}$) is supplied to the terminal 225 of the control circuit 210 through the wiring 122.

When the terminal 225 is supplied with an H potential, the control circuit 210 brings the transistor 213 into an off state to stop the discharging operation. Discharging with overcurrent is not performed, which can prevent a rapid deterioration of characteristics of the secondary battery 300. Thus, the lifetime of the secondary battery 300 can be extended. Furthermore, the reliability of the secondary battery 300 can be improved. Moreover, the safety of the secondary battery 300 can be improved.

[Operation Example of Semiconductor Device 100D]

The semiconductor device 100D functions as an overcurrent detection circuit. Operation examples of the semiconductor device 100D are described with reference to FIG. 10 and FIG. 11. FIG. 10 and FIG. 11 are each a diagram illustrating an operation state of the semiconductor device 100D. As described above, in this embodiment, the potential $V_R$ is set to 1.1 V and the potential $V_{RFN}$ is set to 1.25 V.

Figure 10A:
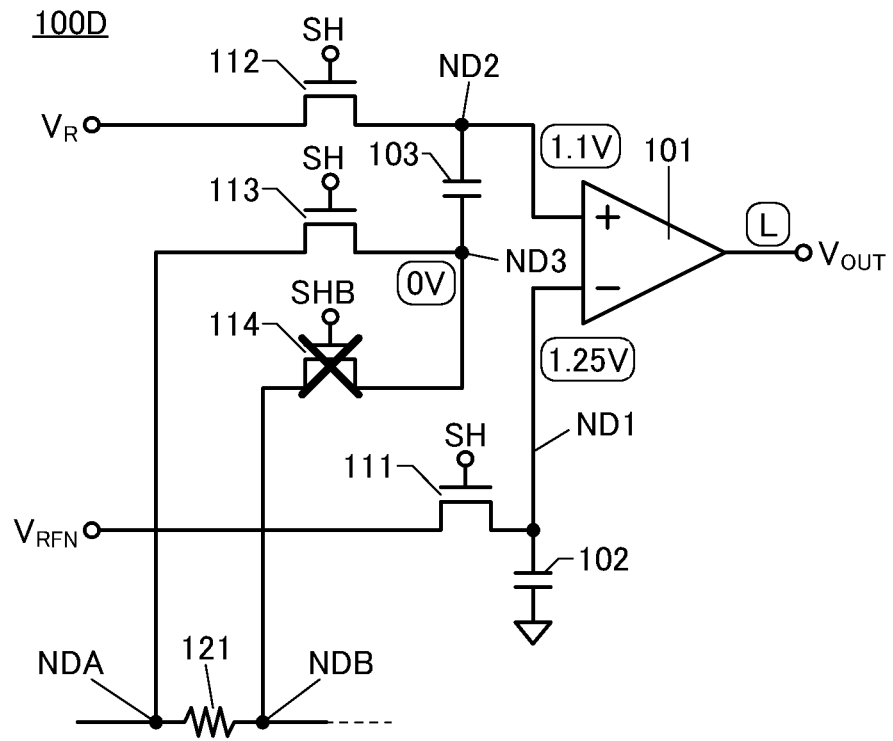
FIG. 10A and FIG. 10B are diagrams illustrating an operation example of a semiconductor device.

First, an H potential is supplied to the terminal SH before start of discharging, and an L potential is supplied to the terminal SHB (see FIG. 10A). Then, the transistor 112 is brought into an on state, and the potential of the node ND2 becomes 1.1 V. The transistor 111 is brought into an on state, and the potential of the node ND1 becomes 1.25 V. Thus, the potential $V_{OUT}$ output from the comparator 101 becomes an L potential.

At this time, current does not flow through the resistor 121, and thus the potentials of the node NDA and the node NDB are each 0 V (a reference potential). When an H potential is supplied to the terminal SH, the transistor 113 is brought into an on state, and the potential of the node ND3 becomes 0 V.

Figure 10B:
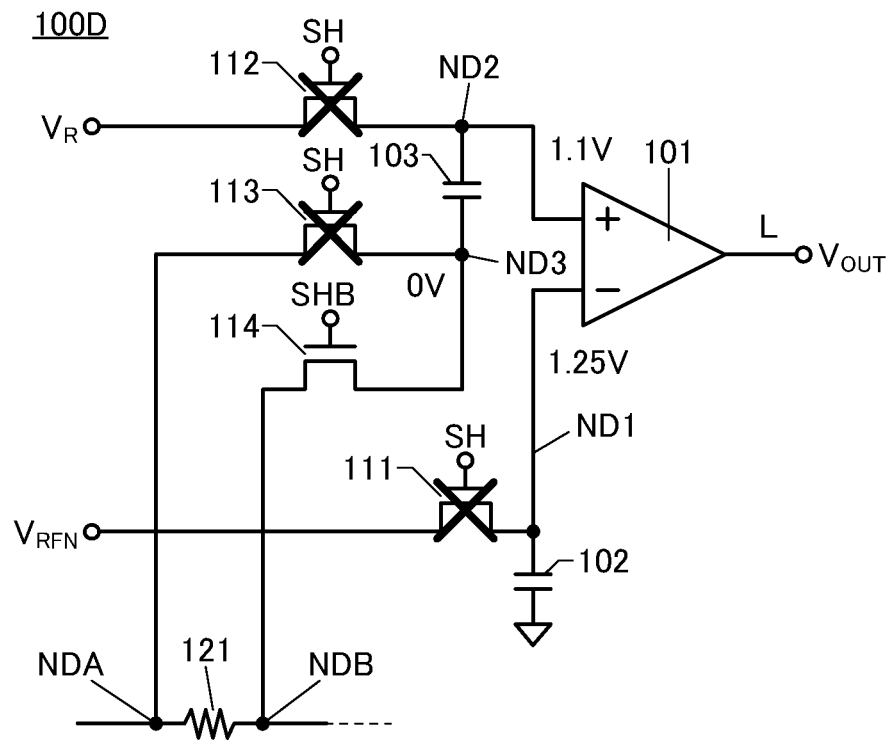

Next, an L potential is supplied to the terminal SH, and an H potential is supplied to the terminal SHB (see FIG. 10B). Then, the transistor 111 is brought into an off state, and thus the potential of the node ND1 is retained. Similarly, the transistor 112 is brought into an off state, and thus the potential of the node ND2 is retained. The transistor 113 is also brought into an off state.

Next, discharging operation is started. When discharging is started, the current $I_C$ flows through the resistor 121 (see FIG. 11A). The current $I_C$ flows from the node NDB to the node NDA, and thus the potential of the node NDB becomes higher than 0 V when the discharging is started. Accordingly, the potential of the node ND3 also becomes higher than 0 V.

Changing the resistance value of the resistor 121 allows the value of overcurrent detected by the semiconductor device 100D to be changed. The resistor 121 may be a variable resistor.

Figure 11A:
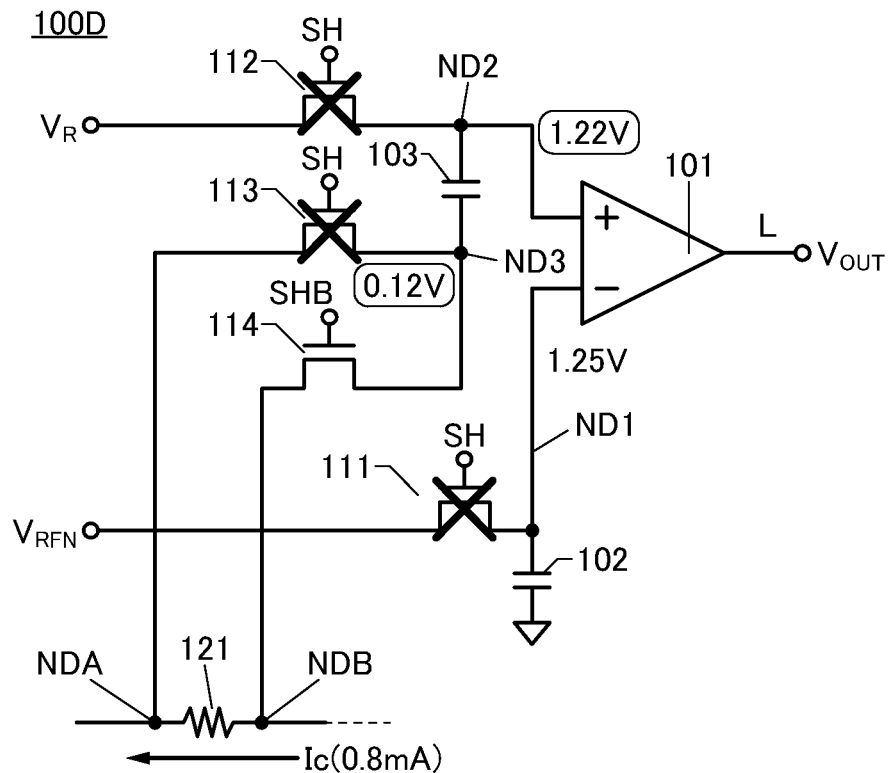
FIG. 11A and FIG. 11B are diagrams illustrating an operation example of a semiconductor device.

FIG. 11A illustrates a state in which a current of 0.8 mA flows as the current $I_C$ when the resistance value $R_D$ of the resistor 121 is 150Ω. In this case, the potential of the node NDB becomes 0.12 V. Thus, the potential of the node ND3 also becomes 0.12 V. The node ND3 and the node ND2 are capacitively coupled through the capacitor 103. Thus, the potential of the node ND2 becomes 1.22 V. The potential of the node ND1 remains higher than the potential of the node ND2. Accordingly, the potential $V_{OUT}$ remains an L potential.

Figure 11B:
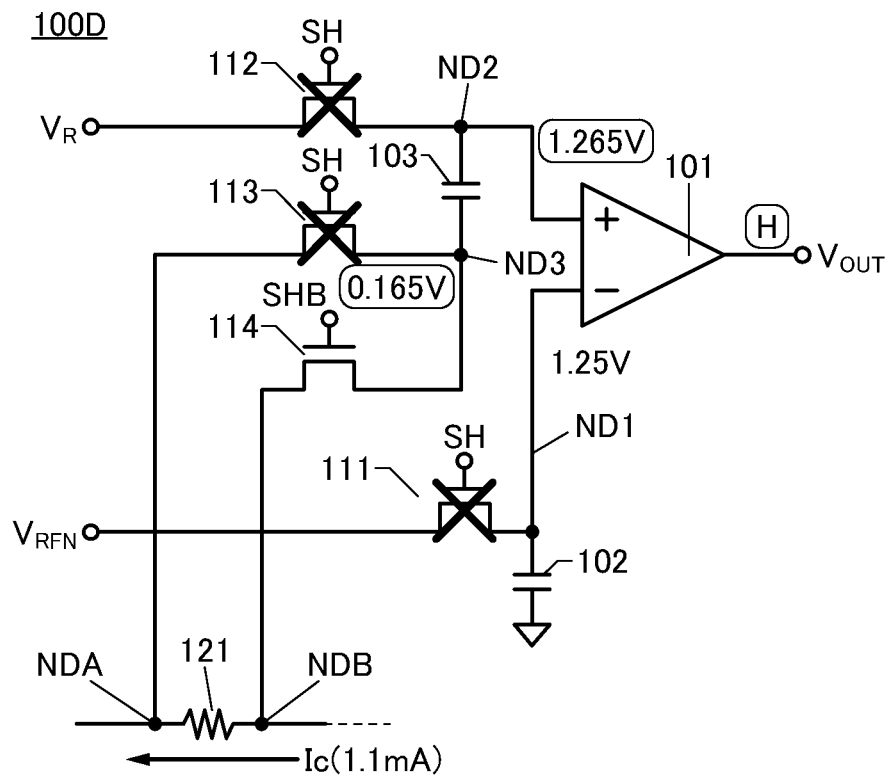

FIG. 11B illustrates a state in which a current of 1.1 mA flows as the current $I_C$ when the resistance value $R_D$ of the resistor 121 is 150Ω. In this case, the potential of the node NDB becomes 0.165 V. Thus, the potential of the node ND3 also becomes 0.165 V. For the same reason as the above, the potential of the node ND2 becomes 1.265 V. Accordingly, the potential of the node ND1 becomes lower than the potential of the node ND2, and thus the potential $V_{OUT}$ becomes an H potential.

In this manner, overcurrent in the discharging operation can be detected. The semiconductor device 100D of one embodiment of the present invention has a structure in which overcurrent is detected by the resistor 121 connected to the terminal 202, the transistor 213, and the transistor 214 in series. Accordingly, overcurrent can be detected with high accuracy without being affected by a variation in the resistance values of the transistor 213 and the transistor 214.

Modification Example

Figure 12:
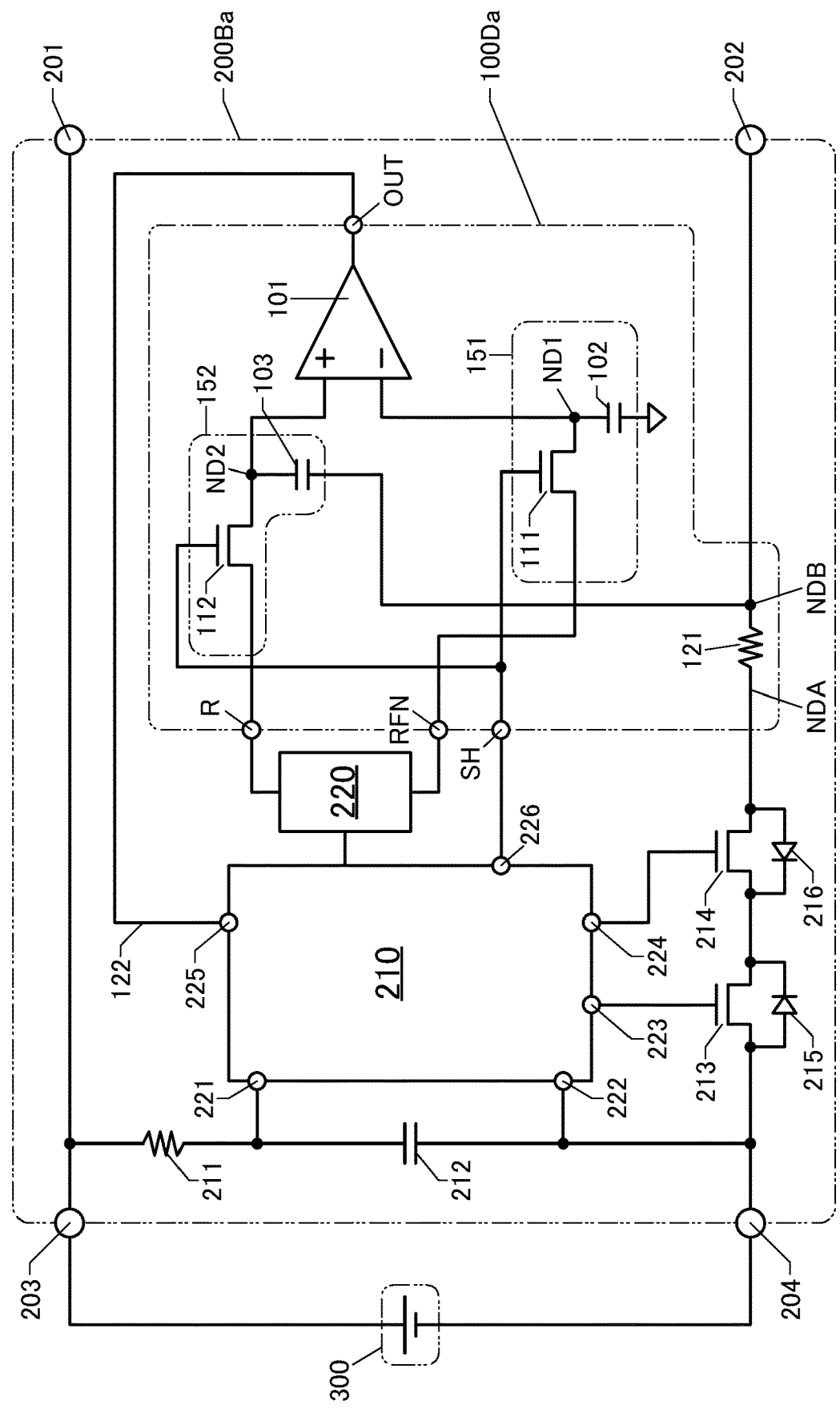
FIG. 12 is a diagram illustrating a structure example of a semiconductor device.

FIG. 12 illustrates a structure example of a semiconductor device 200Ba, which is a modification example of the semiconductor device 200B. In order to reduce repeated description, differences from the semiconductor device 200B are mainly described in this embodiment. The semiconductor device 200Ba is different from the semiconductor device 200B in that a semiconductor device 100Da is included instead of the semiconductor device 100D.

The semiconductor device 100Da has a structure in which the transistor 113, the transistor 114, and the terminal SHB are removed from the semiconductor device 100D. In the semiconductor device 100Da, the other electrode of the capacitor 103 is electrically connected to the other terminal of the resistor 121. Thus, in the semiconductor device 200Ba, a node where the other electrode of the capacitor 103 and the other terminal of the resistor 121 are electrically connected to each other is referred to as the node NDB. Moreover, in the semiconductor device 200Ba, a node where the other of the source and the drain of the transistor 214 and the one terminal of the resistor 121 are electrically connected to each other is referred to as the node NDA.

The semiconductor device 100Da includes less components than the semiconductor device 100D and thus can have a smaller occupation area. The semiconductor device 100Da does not include the terminal SHB, and thus the terminal 227 can be removed from the control circuit 210 included in the semiconductor device 200Ba.

[Operation Example of Semiconductor Device 100Da]

The semiconductor device 100Da functions as an overcurrent detection circuit like the semiconductor device 100D. Operation examples of the semiconductor device 100Da are described with reference to FIG. 13 and FIG. 14. FIG. 13 and FIG. 14 are each a diagram illustrating an operation state of the semiconductor device 100Da.

Figure 13A:
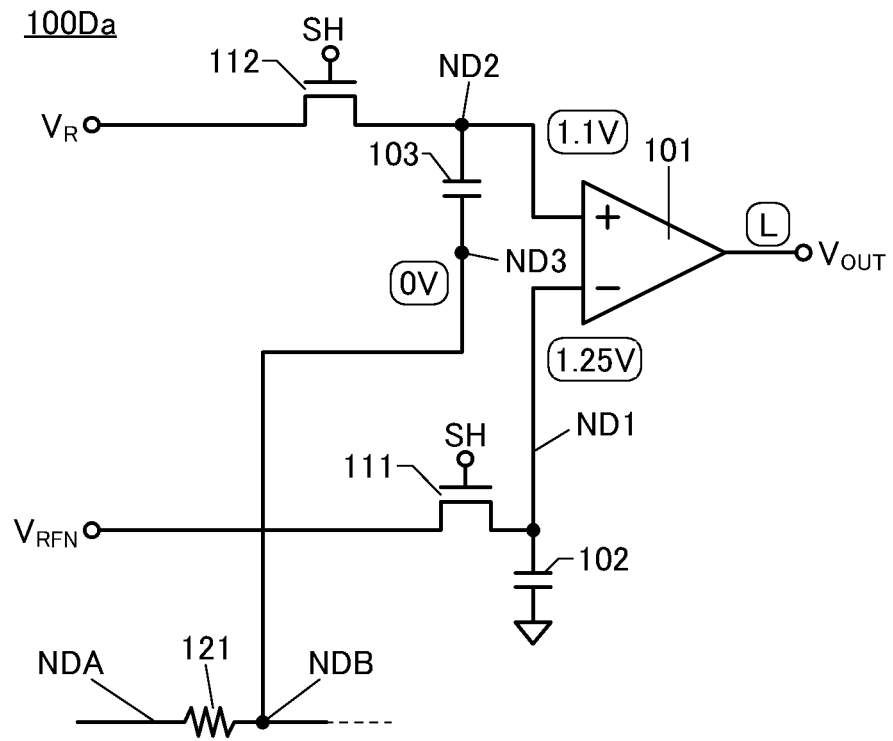
FIG. 13A and FIG. 13B are diagrams illustrating an operation example of a semiconductor device.

First, an H potential is supplied to the terminal SH before start of discharging (see FIG. 13A). Then, the transistor 112 is brought into an on state, and the potential of the node ND2 becomes 1.1 V. The transistor 111 is brought into an on state, and the potential of the node ND1 becomes 1.25 V. Thus, the potential $V_{OUT}$ output from the comparator 101 becomes an L potential.

At this time, current does not flow through the resistor 121, and thus the potentials of the node NDA and the node NDB are each 0 V (a reference potential).

Figure 13B:
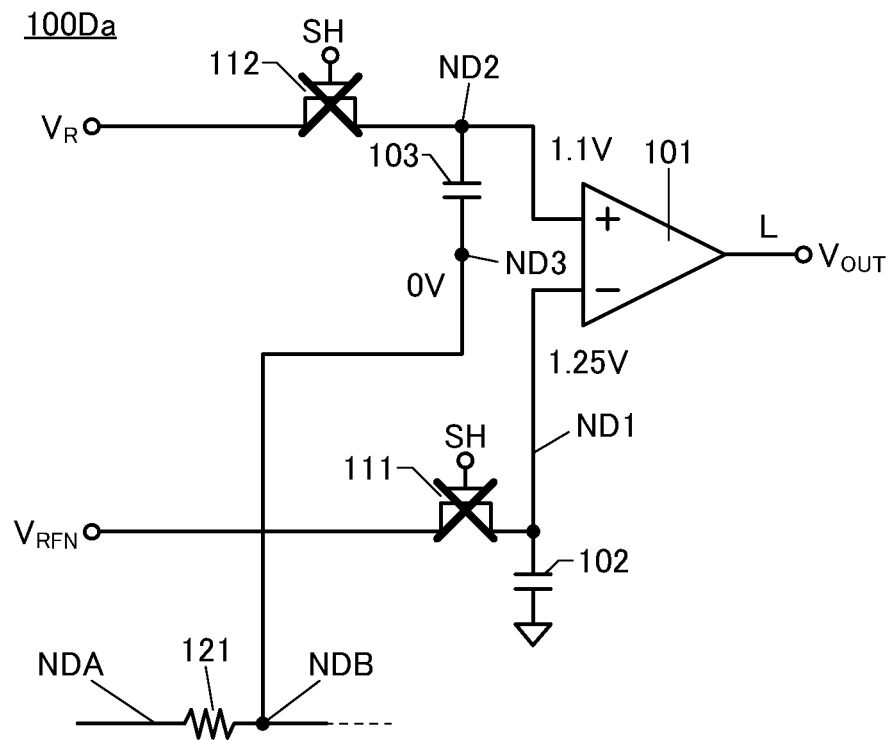

Next, an L potential is supplied to the terminal SH (see FIG. 13B). Then, the transistor 111 is brought into an off state, and thus the potential of the node ND1 is retained. Similarly, the transistor 112 is brought into an off state, and thus the potential of the node ND2 is retained.

Next, discharging operation is started. When discharging is started, the current $I_C$ flows through the resistor 121 (see FIG. 14A). The current $I_C$ flows from the node NDB to the node NDA, and thus the potential of the node NDB becomes higher than 0 V when the discharging is started.

Figure 14A:
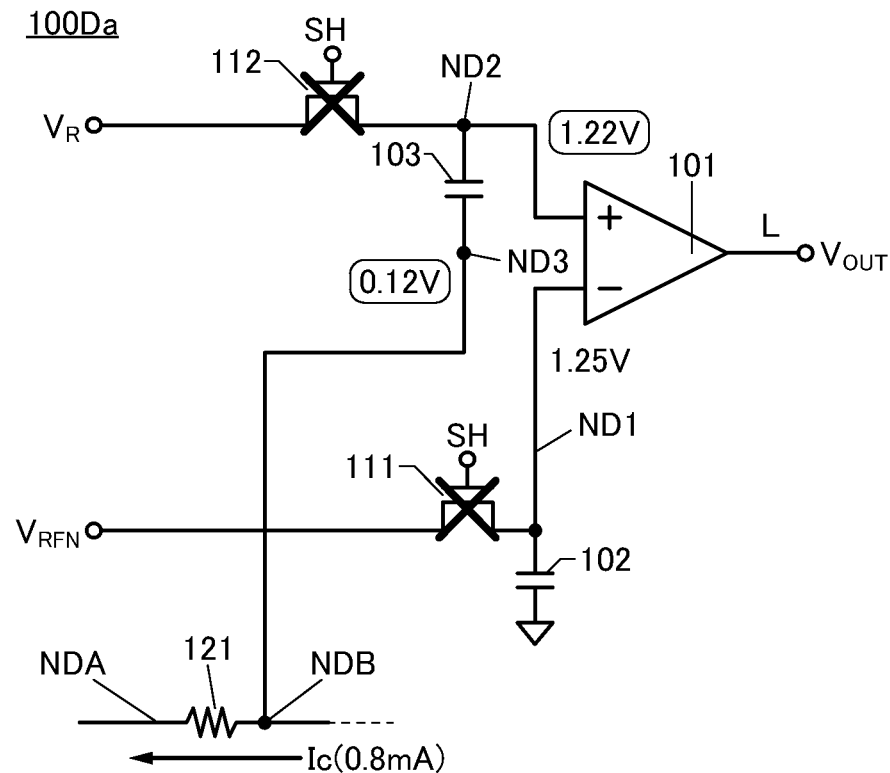
FIG. 14A and FIG. 14B are diagrams illustrating an operation example of a semiconductor device.

FIG. 14A illustrates a state in which a current of 0.8 mA flows as the current $I_C$ when the resistance value $R_D$ of the resistor 121 is 150Ω. In this case, the potential of the node NDB becomes 0.12 V. Thus, the potential of the node ND3 also becomes 0.12 V. The node NDB and the node ND2 are capacitively coupled through the capacitor 103. Thus, the potential of the node ND2 becomes 1.22 V. The potential of the node ND1 remains higher than the potential of the node ND2. Accordingly, the potential $V_{OUT}$ remains an L potential.

Figure 14B:
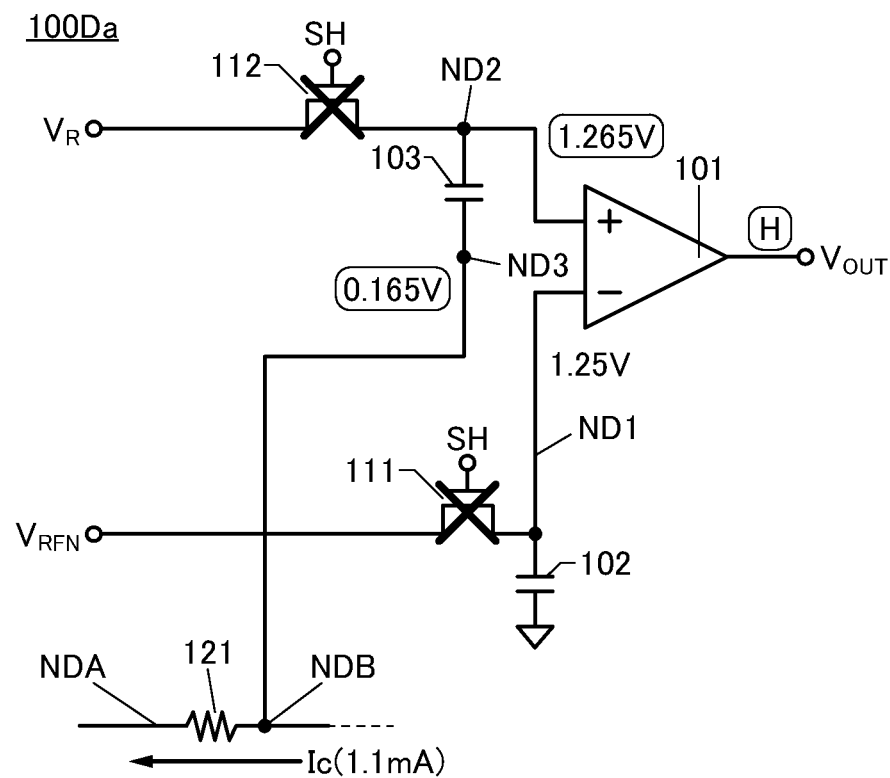

FIG. 14B illustrates a state in which a current of 1.1 mA flows as the current $I_C$ when the resistance value $R_D$ of the resistor 121 is 150Ω. In this case, the potential of the node NDB becomes 0.165 V. For the same reason as the above, the potential of the node ND2 becomes 1.265 V. Accordingly, the potential of the node ND1 becomes lower than the potential of the node ND2, and thus the potential $V_{OUT}$ becomes an H potential.

In this manner, overcurrent in the discharging operation can be detected. The semiconductor device 200Ba of one embodiment of the present invention includes less components than the semiconductor device 200B and thus can have a smaller occupation area.

Note that the semiconductor device of one embodiment of the present invention is not interpreted as being limited to the circuit diagrams illustrated in this embodiment. The semiconductor device of one embodiment of the present invention also includes a semiconductor device having a circuit structure comparable to the circuit structure described in this embodiment.

This embodiment can be implemented in combination with any of the structures described in the other embodiments and the like, as appropriate.

Embodiment 3

In this embodiment, a different structure example and the like of the semiconductor device of one embodiment of the present invention are described with reference to drawings.

<Structure Example of Semiconductor Device 200C>

Figure 15:
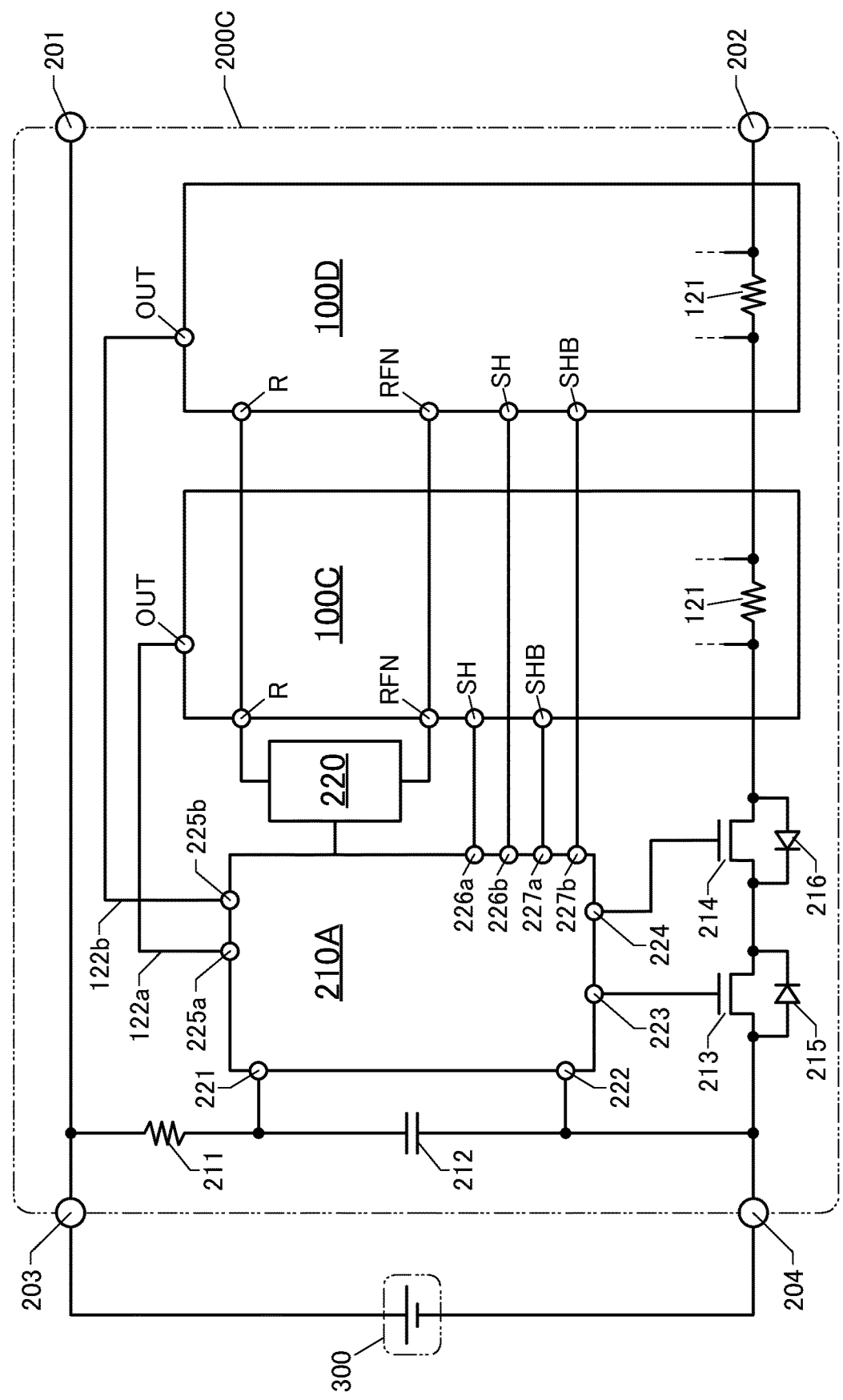
FIG. 15 is a diagram illustrating a structure example of a semiconductor device.

FIG. 15 illustrates a structure example of a semiconductor device 200C. The semiconductor device 200C is a modification example of the semiconductor device 200A and the semiconductor device 200B. Accordingly, in order to reduce repeated description, differences from the semiconductor device 200A or the semiconductor device 200B are mainly described in this embodiment.

The semiconductor device 200C includes a control circuit 210A instead of the control circuit 210. The semiconductor device 200C includes both the semiconductor device 100C and the semiconductor device 100D. The control circuit 210A is a modification example of the control circuit 210 and has a function of controlling the semiconductor device 100C and the semiconductor device 100D in addition to functions similar to those of the control circuit 210.

The control circuit 210A includes a terminal 225a and a terminal 225b as the terminal 225, a terminal 226a and a terminal 226b as a terminal 226, and a terminal 227a and a terminal 227b as the terminal 227.

The terminal 225a is electrically connected to the terminal OUT of the semiconductor device 100C through a wiring 122a. The terminal 225b is electrically connected to the terminal OUT of the semiconductor device 100D through a wiring 122b. The terminal 226a is electrically connected to the terminal SH of the semiconductor device 100C. The terminal 226b is electrically connected to the terminal SH of the semiconductor device 100D. The terminal 227a is electrically connected to the terminal SHB of the semiconductor device 100C. The terminal 227b is electrically connected to the terminal SHB of the semiconductor device 100D.

The potential generation circuit 220 has a function of supplying the potential $V_R$ to the terminal R of the semiconductor device 100C and the terminal R of the semiconductor device 100D, and a function of supplying the potential $V_{RFN}$ to the terminal RFN of the semiconductor device 100C and the terminal RFN of the semiconductor device 100D.

The control circuit 210A has a function of controlling the semiconductor device 100C and the semiconductor device 100D. Thus, the semiconductor device 200C has a function of sensing overcurrent in the charging operation and a function of sensing overcurrent in the discharging operation. With the use of the semiconductor device 200C, the lifetime of the secondary battery 300 can be further extended. Furthermore, the reliability of the secondary battery 300 can be further improved. Furthermore, the safety of the secondary battery 300 can be further improved.

Figure 16:
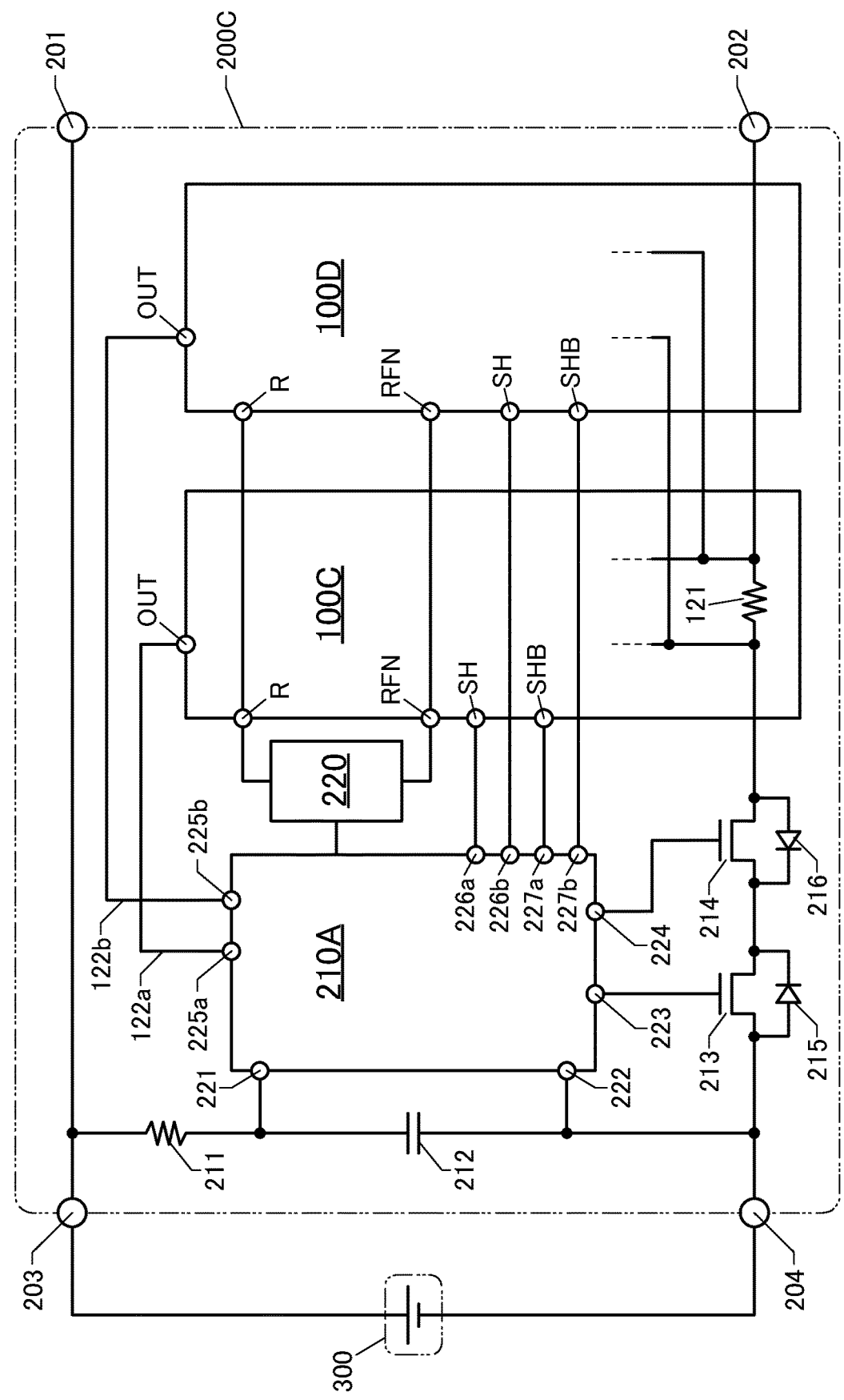
FIG. 16 is a diagram illustrating a structure example of a semiconductor device.

Moreover, as illustrated in FIG. 16, in the semiconductor device 200C, the resistor 121 used for the semiconductor device 100C can also be used as the resistor 121 used for the semiconductor device 100D. Accordingly, the components of the semiconductor device 200C can be reduced. In other words, the number of components included in the semiconductor device 200C can be smaller.

In the semiconductor device 200C, the semiconductor device 100Ca may be used instead of the semiconductor device 100C. Similarly, the semiconductor device 100Da may be used instead of the semiconductor device 100D. One or both of the semiconductor device 100Ca and the semiconductor device 100Da are used in the semiconductor device 200C, whereby the components of the semiconductor device 200C can be further reduced. In other words, the number of components included in the semiconductor device 200C can be further smaller.

Note that the semiconductor device of one embodiment of the present invention is not interpreted as being limited to the circuit diagrams illustrated in this embodiment. The semiconductor device of one embodiment of the present invention also includes a semiconductor device having a circuit structure comparable to the circuit structure described in this embodiment.

This embodiment can be implemented in combination with any of the structures described in the other embodiments and the like, as appropriate.

Embodiment 4

In this embodiment, a different structure example and the like of the semiconductor device of one embodiment of the present invention are described with reference to drawings.

<Structure Example of Semiconductor Device 200Ad>

Figure 17:
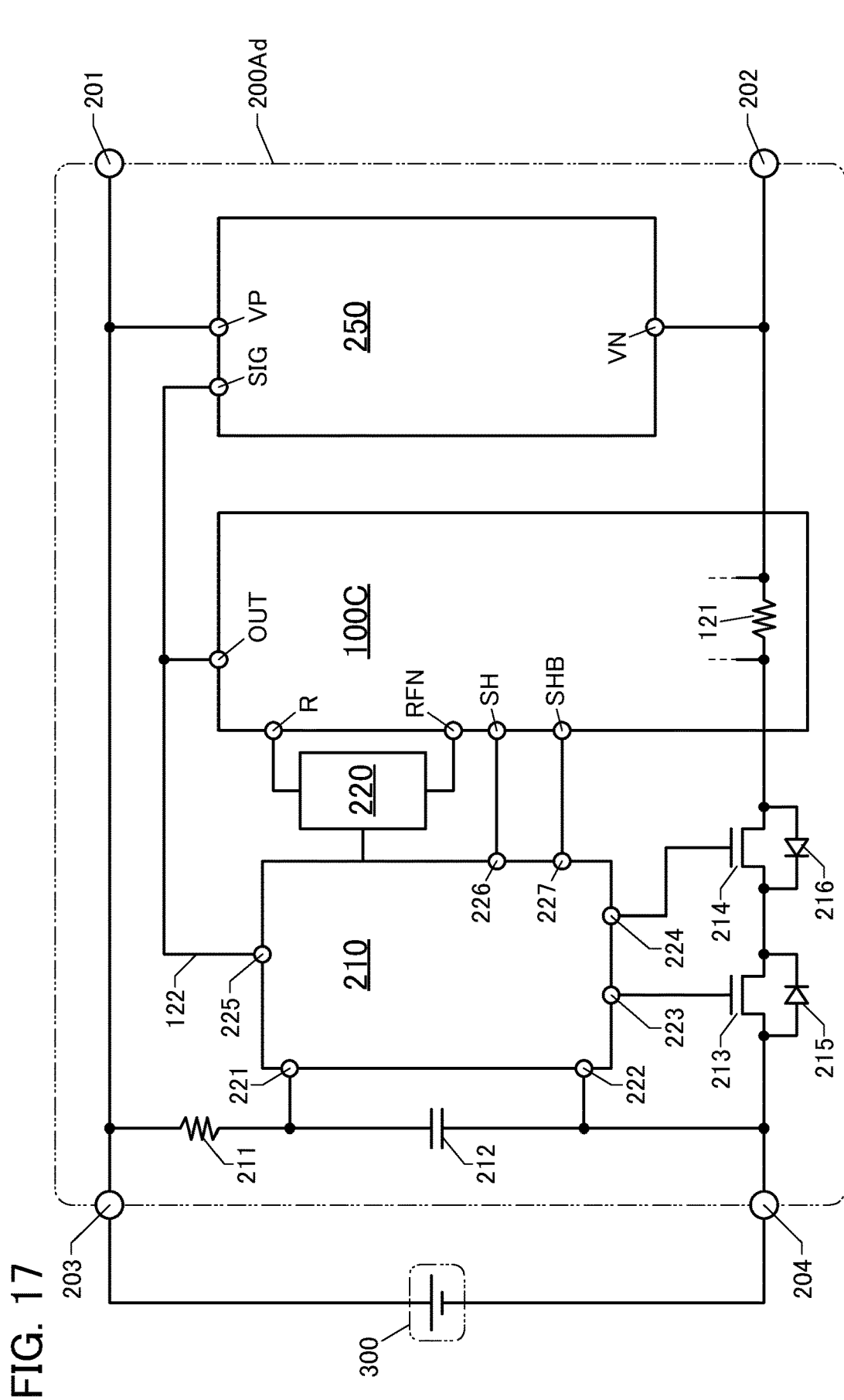
FIG. 17 is a diagram illustrating a structure example of a semiconductor device.

FIG. 17 illustrates a structure example of a semiconductor device 200Ad. The semiconductor device 200Ad is a modification example of the semiconductor device 200A. Accordingly, in order to reduce repeated description, differences between the semiconductor device 200Ad and the semiconductor device 200A are mainly described.

The semiconductor device 200Ad has a structure in which a protection device 250 is added to the semiconductor device 200A. The protection device 250 includes a terminal VP, a terminal VN, and a terminal SIG. The terminal VP is electrically connected to the terminal 201, and the terminal VN is electrically connected to the terminal 202. Thus, the terminal VP is electrically connected to the positive electrode of the secondary battery 300, and the terminal VN is electrically connected to the negative electrode of the secondary battery 300. The terminal SIG is electrically connected to the terminal OUT of the semiconductor device 100C. Moreover, the terminal SIG is electrically connected to the terminal 225 of the control circuit 210.

[Protection Device 250]

The protection device 250 has a function of preventing, for example, damage to or malfunction of the control circuit 210 and the semiconductor device 100C due to a high-voltage noise such as ESD (Electro Static Discharge) to increase the reliability of the semiconductor device 200Ad.

Figure 18A:
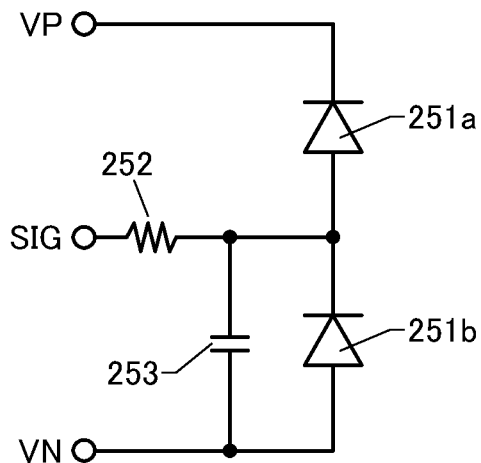
FIG. 18A to FIG. 18D are diagrams each illustrating an equivalent circuit of a protection device.

FIG. 18A illustrates an example of an equivalent circuit diagram of the protection device 250. The protection device 250 illustrated in FIG. 18A includes a diode 251$a$, a diode 251$b$, a resistor 252, and a capacitor 253. One terminal of the resistor 252 is electrically connected to the terminal SIG, and the other terminal thereof is electrically connected to an anode of the diode 251$a$. A cathode of the diode 251$a$ is electrically connected to the terminal VP.

One electrode of the capacitor 253 is electrically connected to the other terminal of the resistor 252, and the other electrode of the capacitor 253 is electrically connected to the terminal VN. An anode of the diode 251$b$ is electrically connected to the terminal VN, and a cathode thereof is electrically connected to the anode of the diode 251$a$. In other words, the one electrode of the capacitor 253 is electrically connected to a cathode of the diode 251$b$, and the other electrode of the capacitor 253 is electrically connected to the anode of the diode 251$b$. The capacitor 253 and the diode 251$b$ are connected in parallel.

In a steady state, the terminal VP is on a high potential side, and the terminal VN is on a low potential side; therefore, reverse bias is applied to the diode 251$a$ and the diode 251$b$. Thus, current does not flow from the terminal VP to the terminal VN in the protection device 250. However, when the potential of the terminal VN unexpectedly becomes higher than that of the terminal VP due to an ESD phenomenon or the like, the terminal VP and the terminal VN are brought into a conduction state, whereby damage to or malfunction of the semiconductor device 200Ad can be prevented.

A signal output from the terminal OUT is supplied to the terminal SIG, and the signal is higher than or equal to the potential of the terminal VN and lower than or equal to the potential of the terminal VP in a steady state. Accordingly, in a steady state, current does not flow from the terminal SIG to the terminal VP and the terminal VN in the protection device 250. However, when a potential higher than the terminal VP or a potential lower than the terminal VN is applied to the terminal SIG unexpectedly due to an ESD phenomenon or the like, the terminal SIG and one of the terminal VP and the terminal VN are brought into a conduction state, whereby damage to or malfunction of the semiconductor device 200Ad can be prevented.

The resistor 252 and the capacitor 253 are connected in series and function as a high-pass filter. A high-frequency and high-voltage noise applied to the terminal SIG is released to the terminal VN through the resistor 252 and the capacitor 253.

The resistance value of the resistor 252 is preferably greater than or equal to 10Ω and less than or equal to 1 kΩ, further preferably greater than or equal to 50Ω and less than or equal to 500Ω. The capacitance value of the capacitor 253 is preferably greater than or equal to 0.1 pF and less than or equal to 100 pF, further preferably greater than or equal to 1 pF and less than or equal to 10 pF.

Figure 19A:
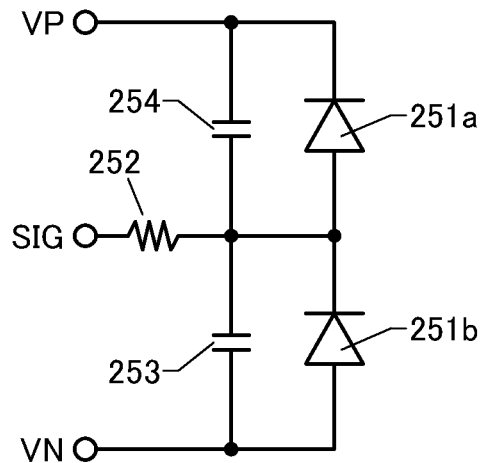
FIG. 19A and FIG. 19B are diagrams each illustrating an equivalent circuit of a protection device.

As illustrated in FIG. 19A, a capacitor 254 may be provided between the other terminal of the resistor 252 and the terminal VP. The capacitance value of the capacitor 254 is substantially the same as that of the capacitor 253.

Figure 18B:
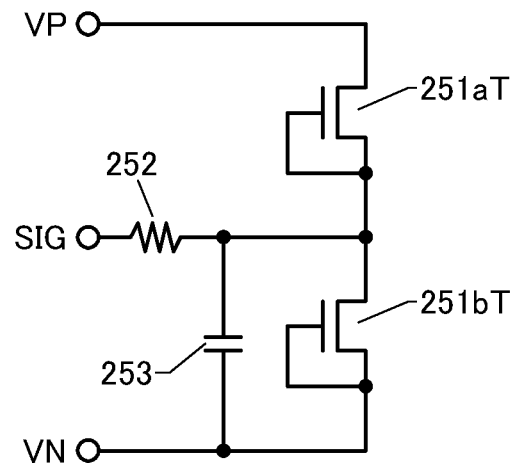

Each of the diode 251$a$ and the diode 251$b$ can be replaced with a transistor. FIG. 18B is an equivalent circuit diagram of the protection device 250 in which the diode 251$a$ is replaced with a transistor 251$a$T and the diode 251$b$ is replaced with a transistor 251$b$T. A gate of the transistor 251$a$T is electrically connected to one of a source and a drain thereof, whereby the transistor 251$a$T can function as a diode. In this case, the one of the source and the drain which is electrically connected to the gate functions as an anode, and the other of the source and the drain functions as a cathode.

OS transistors are preferably used as the transistor 251$a$T and the transistor 251$b$T. An oxide semiconductor has a band gap of 2 eV or more and thus has not only extremely low off-state current but also high withstand voltage between its source and drain. In other words, reverse current in a diode is small, and a breakdown is less likely to occur.

Figure 18C:
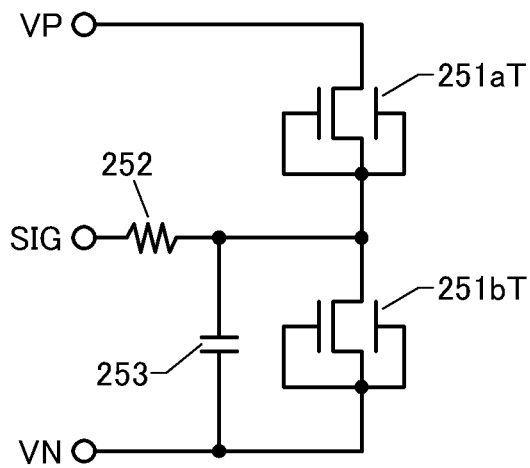
Figure 18D:
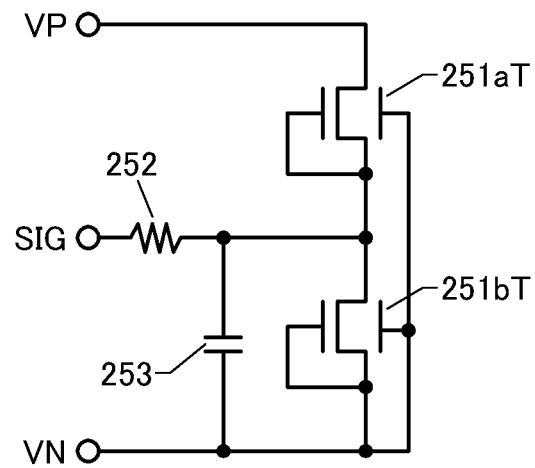

As each of the transistor 251$a$T and the transistor 251$b$T, a transistor including a back gate may be used. In the case where a transistor including a back gate is used, the gate and the back gate are electrically connected to each other (see FIG. 18C). Alternatively, the back gate may be electrically connected to the terminal VN (see FIG. 18D).

Figure 19B:
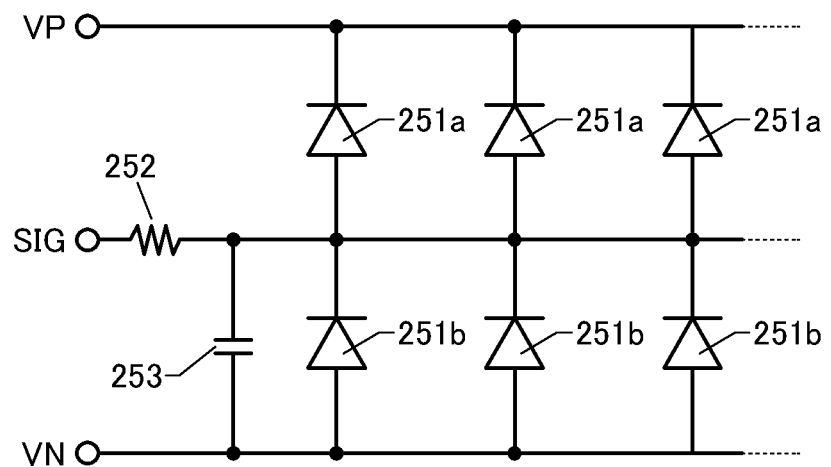

As illustrated in FIG. 19B, a plurality of the diodes 251$a$ may be connected in parallel. Similarly, a plurality of the diodes 251$b$ may be connected in parallel. The diodes 251$a$ and the diodes 251$b$ are connected in parallel, whereby the current bypass capability of the protection device 250 can be increased. Furthermore, even when part of the diode 251$a$ and the diode 251$b$ is broken, the function of the protection device 250 can be kept. Thus, the redundancy of the protection device 250 can be increased.

Figure 20A:
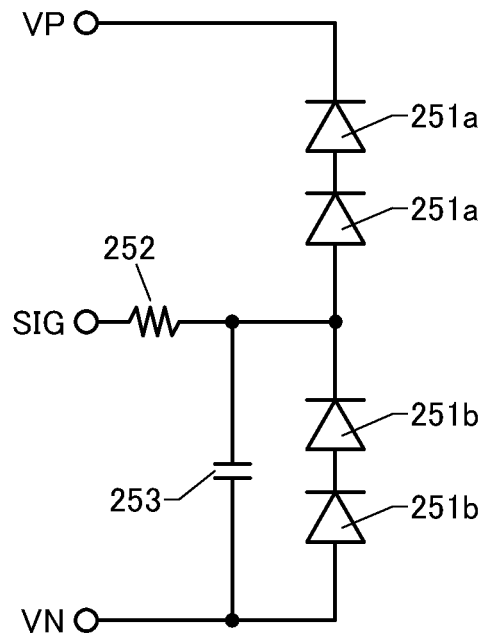
FIG. 20A and FIG. 20B are diagrams each illustrating an equivalent circuit of a protection device.

As illustrated in FIG. 20A, the plurality of diodes 251$a$ may be connected in series. Similarly, the plurality of diodes 251$b$ may be connected in series. FIG. 20A illustrates an example in which two diodes 251$a$ and two diodes 251$b$ are connected in series. The plurality of diodes 251$a$ and the plurality of diodes 251$b$ are connected in series, whereby the reverse bias per diode is reduced, leading to higher withstand voltage of the protection device 250. Thus, the reliability of the protection device 250 can be increased.

FIG. 21A is an equivalent circuit diagram of the protection device 250 illustrated in FIG. 20A in which the diode 251$a$ is replaced with the transistor 251$a$T and the diode 251$b$ is replaced with the transistor 251$b$T. FIG. 21B and FIG. 21C are each an equivalent circuit diagram of the protection device 250 illustrated in FIG. 20A in which a transistor including a back gate is used as each of the transistor 251$a$T and the transistor 251$b$T. FIG. 21B illustrates an example in which the gate and the back gate are electrically connected to each other. FIG. 21C illustrates an example in which the back gate is electrically connected to the terminal VN.

Figure 20B:
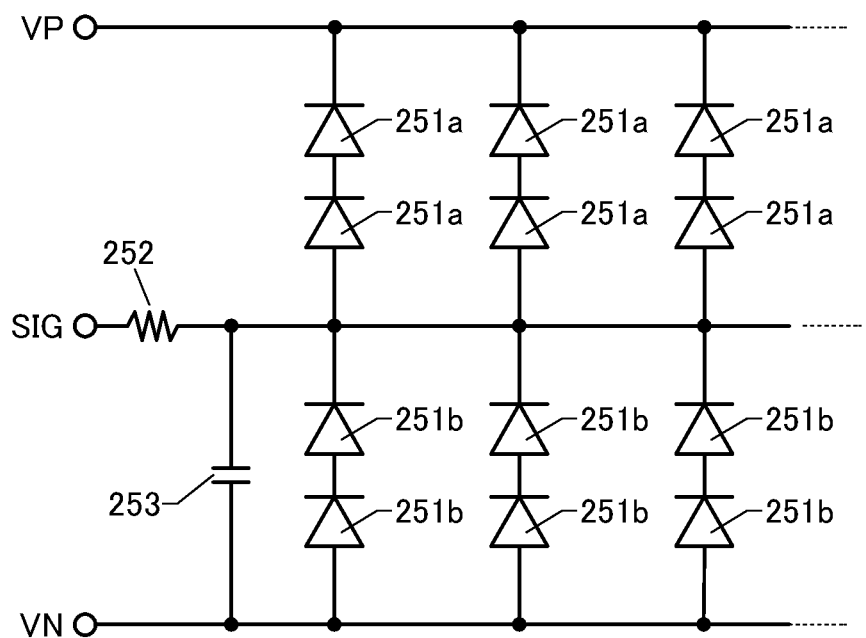

As illustrated in FIG. 20B, the plurality of diodes 251a may be connected in series and in parallel. Similarly, the plurality of diodes 251b may be connected in series and in parallel. FIG. 20B illustrates an example in which two diodes 251a connected in series and two diodes 251b connected in series are each connected in parallel in three columns. When the plurality of diodes are connected in series and in parallel, the redundancy and the withstand voltage of the protection device 250 can be increased. Thus, the reliability of the protection device 250 can be increased.

<Structure Example of Semiconductor Device 200AdA>

Figure 22:
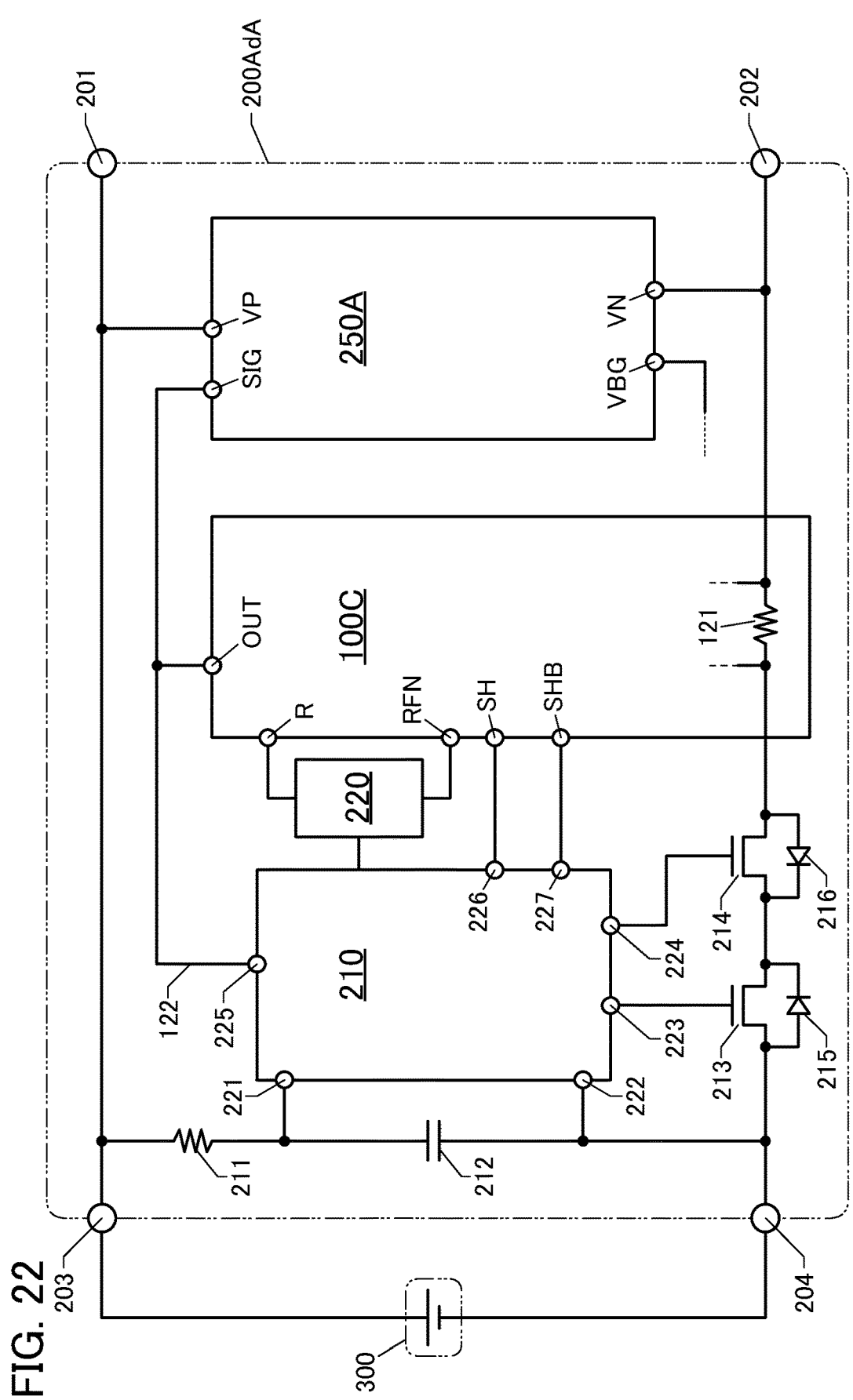
FIG. 22 is a diagram illustrating a structure example of a semiconductor device.

FIG. 22 illustrates a structure example of a semiconductor device 200AdA. The semiconductor device 200AdA is a modification example of the semiconductor device 200Ad. Accordingly, in order to reduce repeated description, differences between the semiconductor device 200AdA and the semiconductor device 200Ad are mainly described. The semiconductor device 200AdA includes a protection device 250A instead of the protection device 250 of the semiconductor device Ad.

For example, the control circuit 210 and/or the semiconductor device 100C may be formed using a transistor including a back gate, and a potential lower than a potential of the negative electrode may be supplied to the back gate. In such a case, the protection device 250A is used instead of the protection device 250.

Figure 23A:
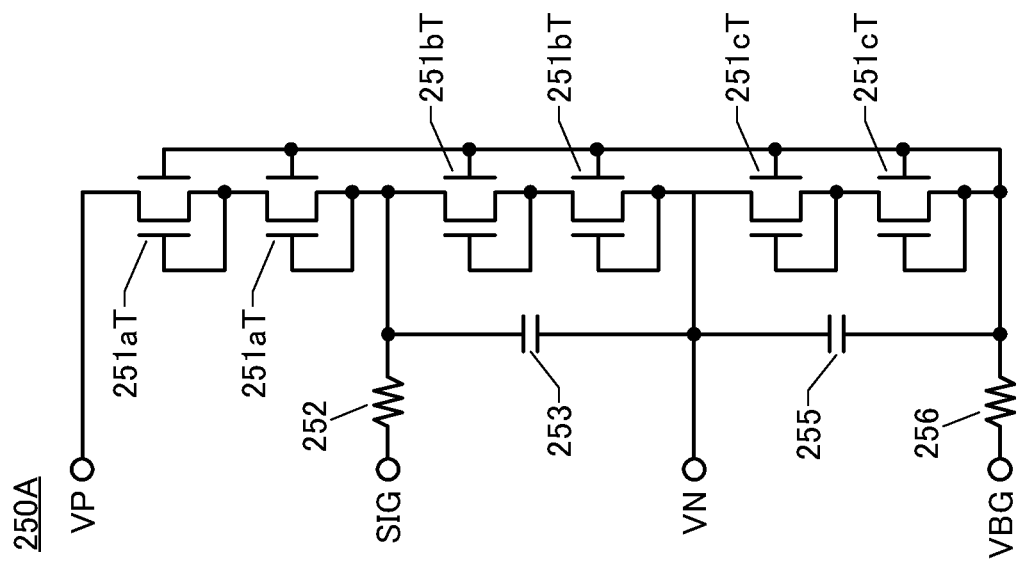
FIG. 23A to FIG. 23C are diagrams each illustrating an equivalent circuit of a protection device.

FIG. 23A is an equivalent circuit diagram of the protection device 250A. The protection device 250A illustrated in FIG. 23A includes two diodes 251c, a capacitor 255, and a resistor 256 in addition to the protection device 250 illustrated in FIG. 20A. One electrode of the capacitor 255 is electrically connected to the terminal VN, and the other electrode thereof is electrically connected to an anode of the first diode 251c. A cathode of the first diode 251c is electrically connected to an anode of the second diode 251c. A cathode of the second diode 251c is electrically connected to the terminal VN. One terminal of the resistor 256 is electrically connected to the terminal VBG, and the other terminal thereof is electrically connected to the anode of the first diode 251c. The terminal VBG is electrically connected to the back gate of the transistor included in the control circuit 210 and/or the semiconductor device 100C, for example.

Although FIG. 23A illustrates a structure in which two diodes 251a, two diodes 251b, and two diodes 251c are connected in series, three or more diodes 251a, three or more diodes 251b, and three or more diodes 251c may be connected in series. One diode 251a, one diode 251b, and one diode 251c may be used.

Figure 23B:
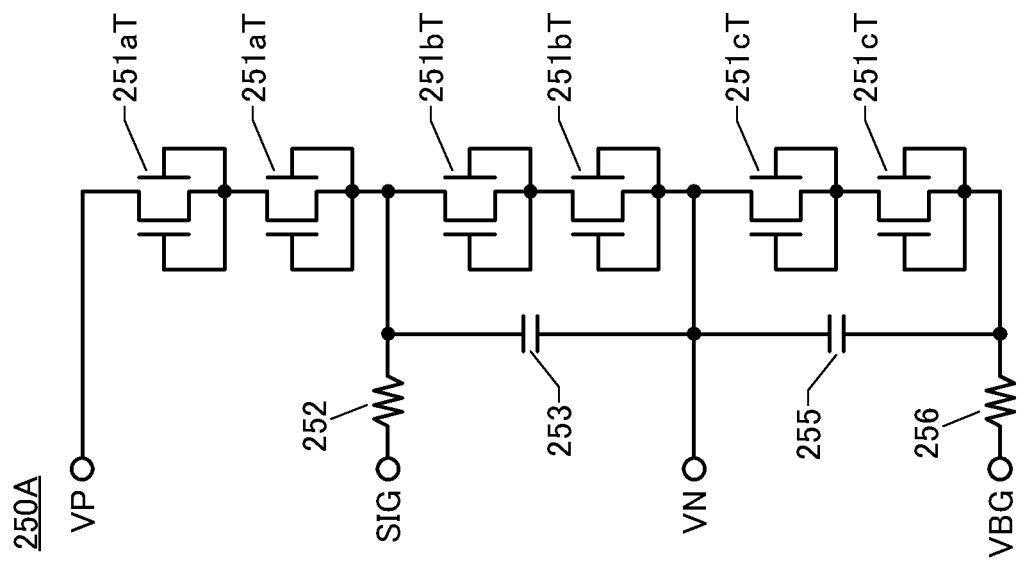
Figure 23C:
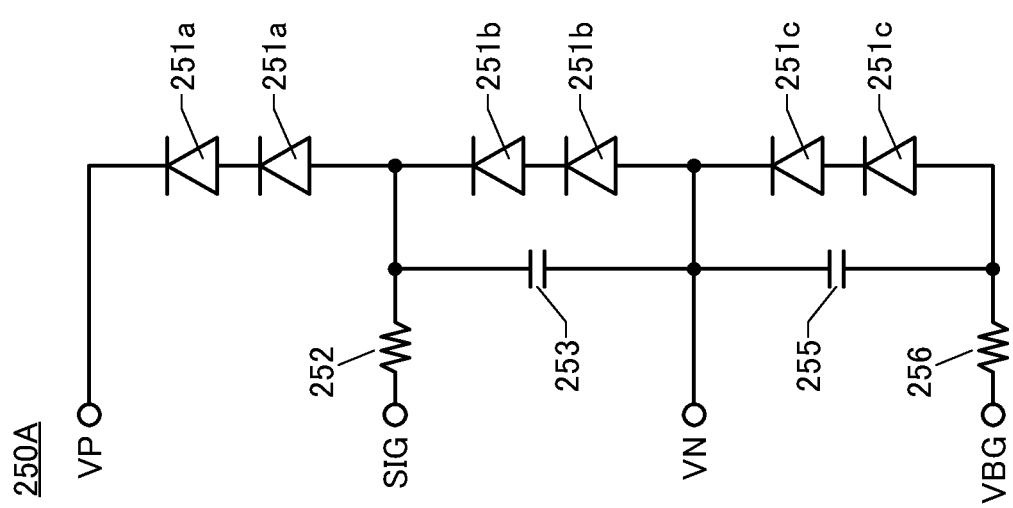

FIG. 23B and FIG. 23C are each an equivalent circuit diagram of the protection device 250A in which the diode 251a is replaced with the transistor 251aT, the diode 251b is replaced with the transistor 251bT, and the diode 251c is replaced with a transistor 251cT. Each of the transistor 251aT, the transistor 251bT, and the transistor 251cT is illustrated as a transistor including a back gate in FIG. 23B and FIG. 23C but may be a transistor without a back gate. FIG. 23B illustrates an example in which the gate and the back gate are electrically connected to each other. FIG. 23C illustrates an example in which the back gate is electrically connected to the terminal VN.

<Structure Example of Semiconductor Device 200AdB>

Figure 24:
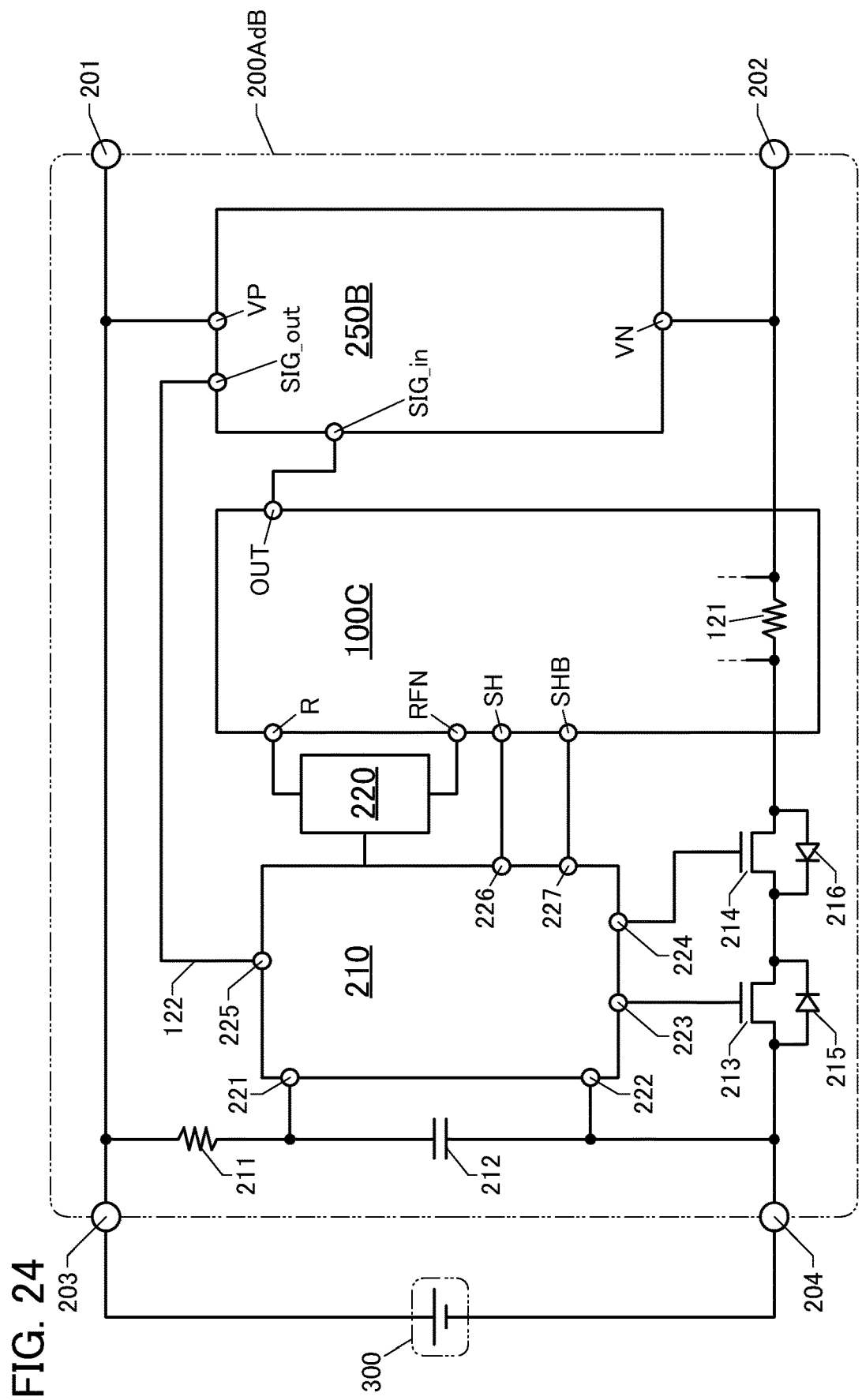
FIG. 24 is a diagram illustrating a structure example of a semiconductor device.

FIG. 24 illustrates a structure example of a semiconductor device 200AdB. The semiconductor device 200AdB is a modification example of the semiconductor device 200Ad. Accordingly, in order to reduce repeated description, differences between the semiconductor device 200AdB and the semiconductor device 200Ad are mainly described. The semiconductor device 200AdB includes a protection device 250B instead of the protection device 250 of the semiconductor device Ad.

The protection device 250B is a modification example of the protection device 250. The protection device 250B includes a terminal SIG_in and a terminal SIG_out instead of the terminal SIG of the protection device 250. The terminal SIG_in is electrically connected to the terminal OUT of the semiconductor device 100C. The terminal SIG_out is electrically connected to the terminal 225 through the wiring 122.

[Protection Device 250B]

Figure 25:
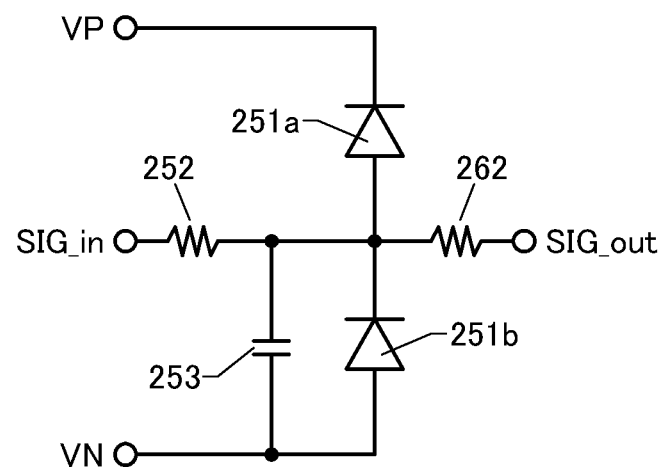
FIG. 25 is a diagram illustrating an equivalent circuit of a protection device.

FIG. 25 illustrates an example of an equivalent circuit diagram of the protection device 250B. The protection device 250B has a structure in which a resistor 262 is added to the protection device 250 illustrated in FIG. 18A. One terminal of the resistor 262 is electrically connected to the other terminal of the resistor 252, and the other terminal of the resistor 262 is electrically connected to the terminal SIG_out.

The resistance value of the resistor 262 is set in a manner similar to that of the resistor 252. A signal output from the terminal OUT is supplied to the terminal 225 through the protection device 250B. As described above, the protection device may be provided in the middle of a signal path.

<Structure Example of Semiconductor Device 200Bd>

Figure 26:
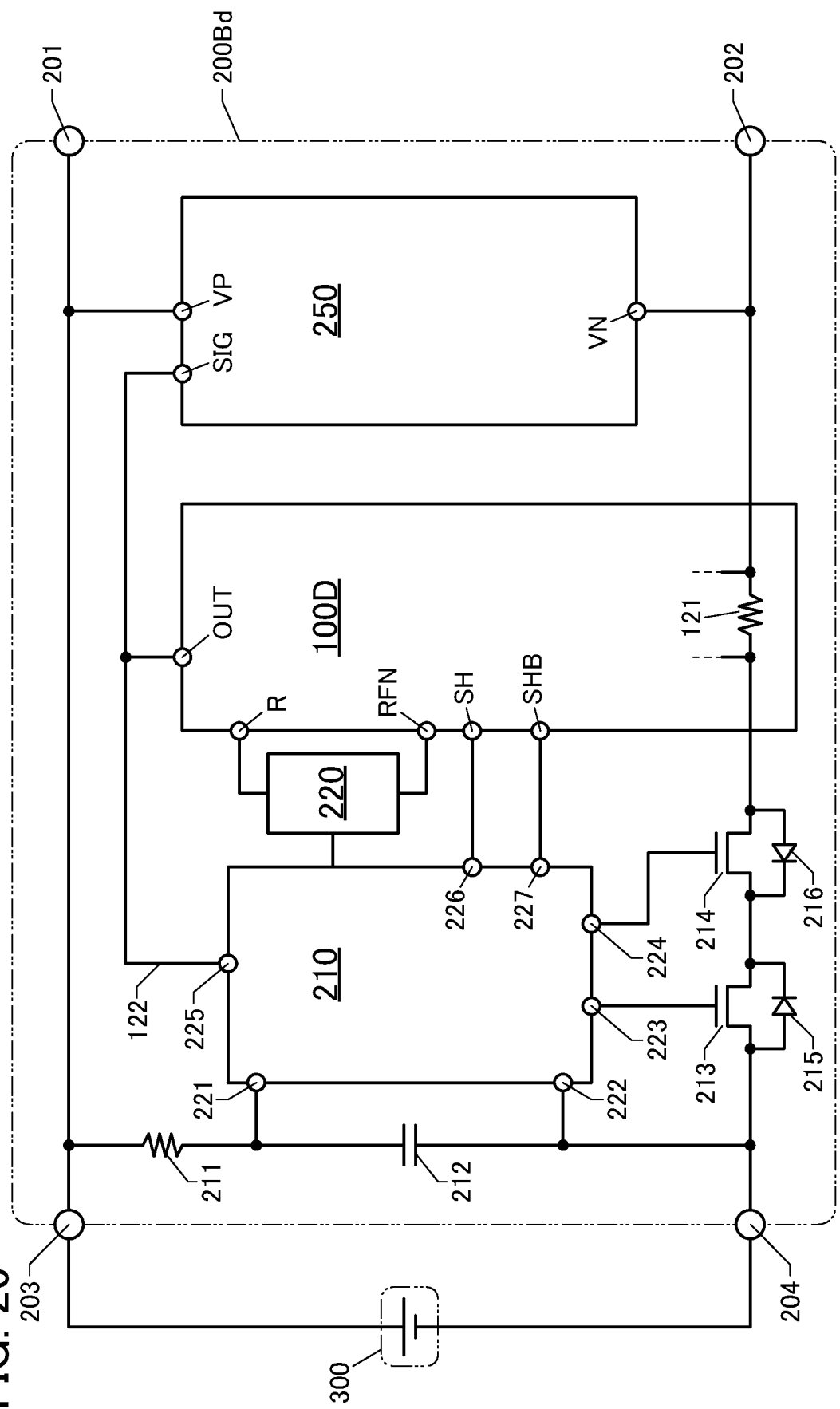
FIG. 26 is a diagram illustrating a structure example of a semiconductor device.

FIG. 26 illustrates a structure example of a semiconductor device Bd. The semiconductor device 200Bd is a modification example of the semiconductor device 200Ad. The semiconductor device 200Bd is also a modification example of the semiconductor device 200B. Accordingly, in order to reduce repeated description, differences between the semiconductor device Bd and the semiconductor device 200Ad are mainly described. Similarly, differences between the semiconductor device Bd and the semiconductor device 200B are mainly described.

The semiconductor device 200Bd includes the semiconductor device 100D instead of the semiconductor device 100C of the semiconductor device 200Ad. Thus, the terminal SIG is electrically connected to the terminal OUT of the semiconductor device 100D.

The semiconductor device 200Ad and the semiconductor device 200B can be referred to for understanding a structure and the like of the semiconductor device 200Bd. Thus, detailed description is omitted here.

<Structure Example of Semiconductor Device 200Cd>

Figure 27:
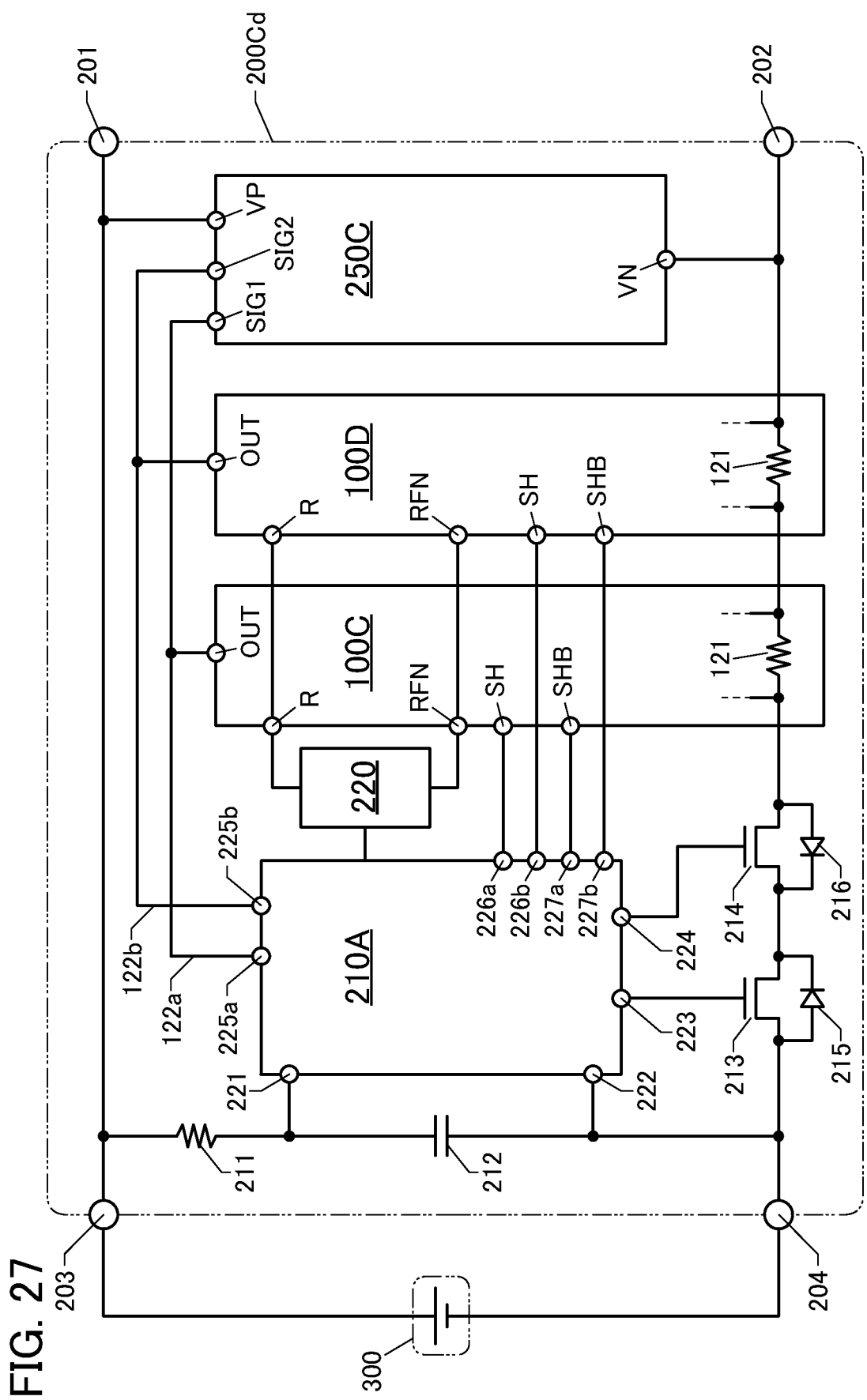
FIG. 27 is a diagram illustrating a structure example of a semiconductor device.

FIG. 27 illustrates a structure example of a semiconductor device 200Cd. The semiconductor device 200Cd is a modification example of the semiconductor device 200Ad. The semiconductor device 200Cd is also a modification example of the semiconductor device 200C. Accordingly, in order to reduce repeated description, differences between the semiconductor device 200Cd and the semiconductor device 200Ad are mainly described. Similarly, differences between the semiconductor device 200Cd and the semiconductor device 200C are mainly described.

The semiconductor device 200Cd has a structure in which a protection device 250C is added to the semiconductor device 200C. The protection device 250C is a modification example of the protection device 250. The protection device 250C includes a terminal SIG1 and a terminal SIG2 instead of the terminal SIG of the protection device 250. The terminal SIG1 is electrically connected to the terminal OUT of the semiconductor device 100C. The terminal SIG1 is electrically connected to the terminal 225a of the control circuit 210A. The terminal SIG2 is electrically connected to the terminal OUT of the semiconductor device 100D. The terminal SIG2 is electrically connected to the terminal 225b of the control circuit 210A.

[Protection Device 250C]

Figure 28:
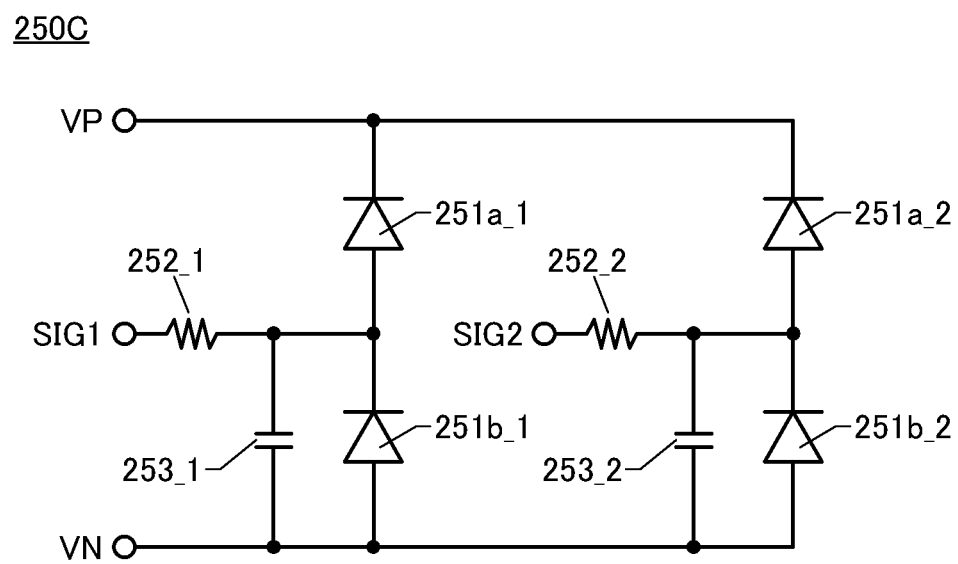
FIG. 28 is a diagram illustrating an equivalent circuit of a protection device.

FIG. 28 illustrates an example of an equivalent circuit diagram of the protection device 250C. The protection device 250C includes a diode 251a_1, a diode 251b_1, a diode 251a_2, a diode 251b_2, a resistor 252_1, a resistor 252_2, a capacitor 253_1, and a capacitor 253_2.

One terminal of the resistor 252_1 is electrically connected to the terminal SIG1, and the other terminal thereof is electrically connected to an anode of the diode 251a_1. A cathode of the diode 251a_1 is electrically connected to the terminal VP.

One electrode of the capacitor 253_1 is electrically connected to the other terminal of the resistor 252_1, and the other electrode of the capacitor 253_1 is electrically connected to the terminal VN. An anode of the diode 251b_1 is electrically connected to the terminal VN, and a cathode thereof is electrically connected to the anode of the diode 251a_1.

One terminal of the resistor 252_2 is electrically connected to the terminal SIG2, and the other terminal thereof is electrically connected to an anode of the diode 251a_2. A cathode of the diode 251a_2 is electrically connected to the terminal VP.

One electrode of the capacitor 253_2 is electrically connected to the other terminal of the resistor 252_2, and the other electrode of the capacitor 253_2 is electrically connected to the terminal VN. The anode of the diode 251b_1 is electrically connected to the terminal VN, and the cathode thereof is electrically connected to the anode of the diode 251a_2.

The protection device 250C has a structure in which substantially two protection devices 250 are connected in parallel. Thus, the above-described modification example of the protection device 250 can also be used for the protection device 250C.

This embodiment can be implemented in combination with any of the structures described in the other embodiments and the like, as appropriate.

Embodiment 5

In this embodiment, structures of a transistor that can be used in the semiconductor device described in the above embodiments are described. Specifically, a structure in which transistors having different electrical characteristics are stacked is described. With the structure, the degree of freedom in design of the semiconductor device can be increased. Stacking transistors having different electrical characteristics can increase the integration degree of the semiconductor device.

Figure 29:
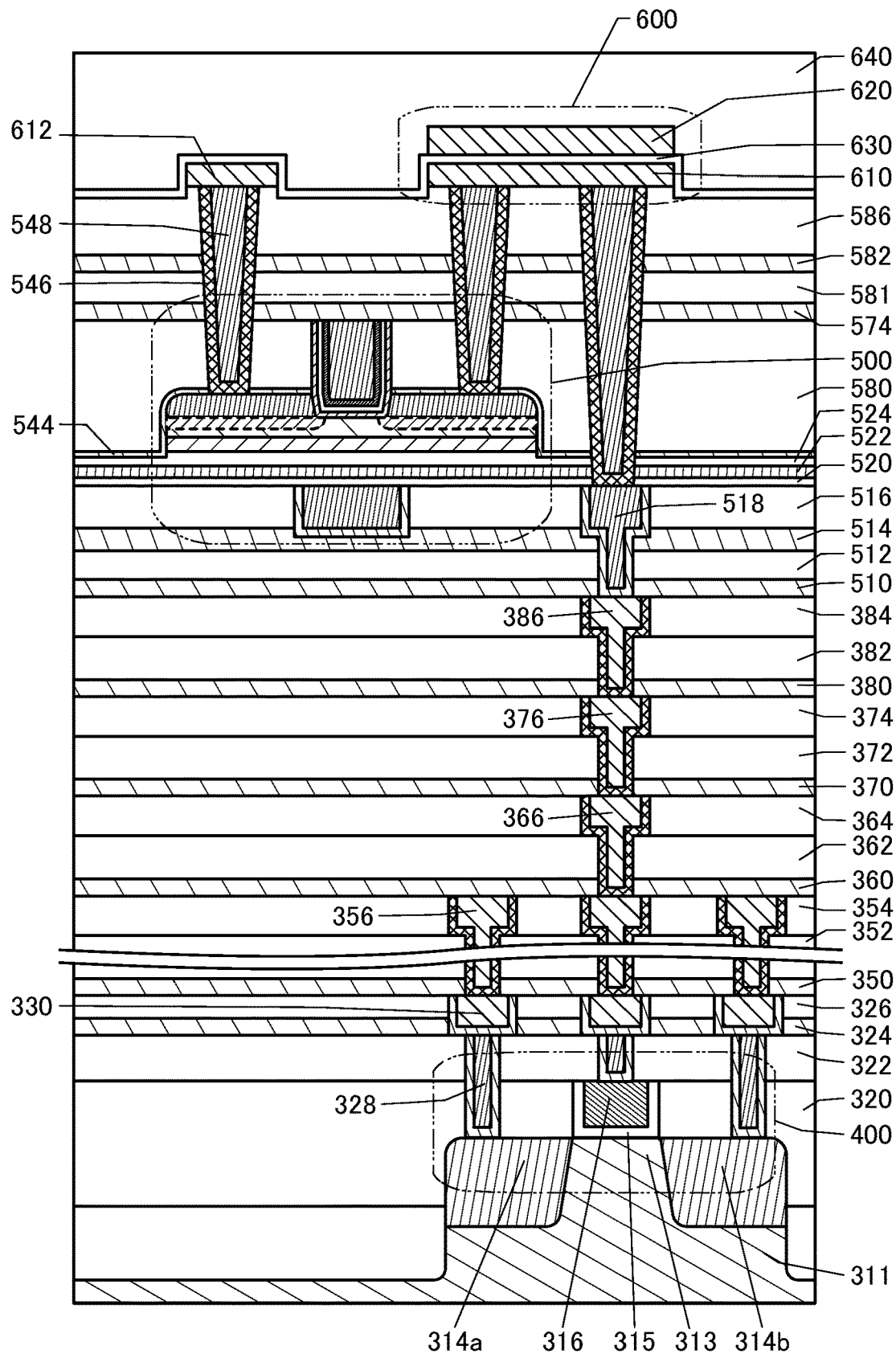
FIG. 29 is a diagram illustrating a structure example of a semiconductor device.
Figure 31A:
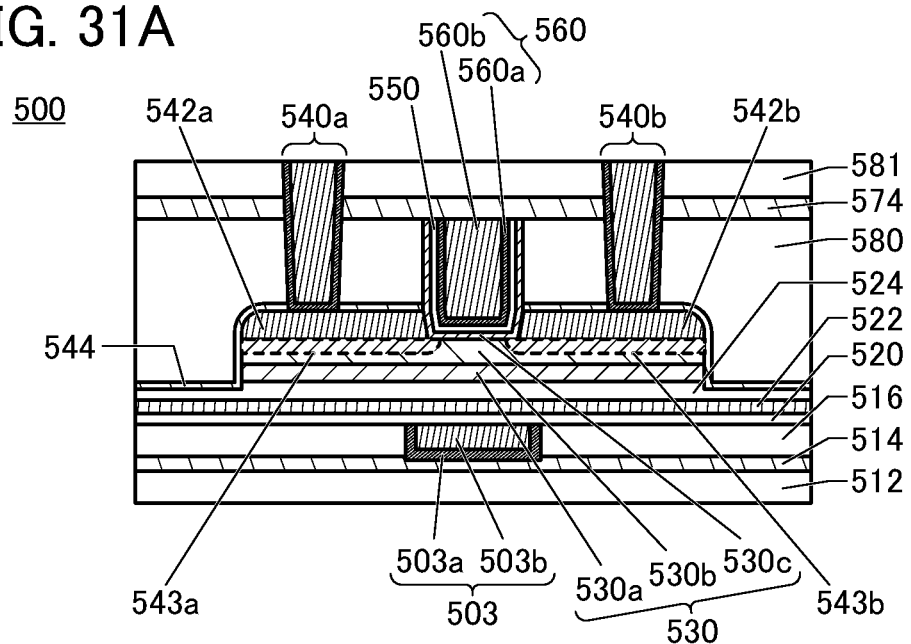
FIG. 31A to FIG. 31C are diagrams illustrating structure examples of transistors.
Figure 31B:
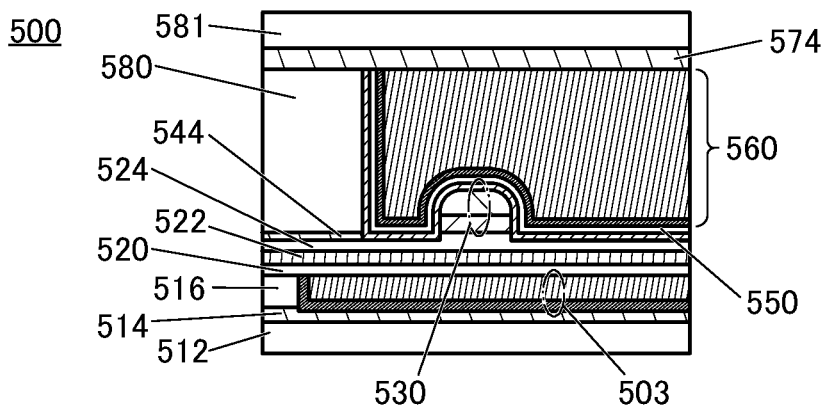
Figure 31C:
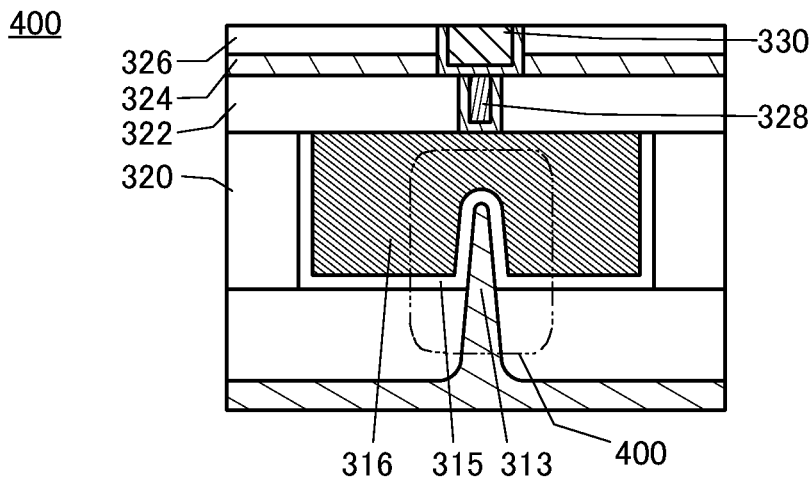

A semiconductor device illustrated in FIG. 29 includes a transistor 400, a transistor 500, and a capacitor 600. FIG. 31A is a cross-sectional view of the transistor 500 in the channel length direction, FIG. 31B is a cross-sectional view of the transistor 500 in the channel width direction, and FIG. 31C is a cross-sectional view of the transistor 400 in the channel width direction.

The transistor 500 is an OS transistor. Since the off-state current of the transistor 500 is extremely low, the use of the transistor 500 as a transistor included in a semiconductor device enables long-term retention of written data voltage or charges. In other words, power consumption of the semiconductor device can be reduced because the semiconductor device has a low frequency of refresh operation or requires no refresh operation.

The semiconductor device described in this embodiment includes the transistor 400, the transistor 500, and the capacitor 600, as illustrated in FIG. 29. The transistor 500 is provided above the transistor 400, and the capacitor 600 is provided above the transistor 400 and the transistor 500.

The transistor 400 is provided over a substrate 311 and includes a conductor 316, an insulator 315, a semiconductor region 313 that is part of the substrate 311, and a low-resistance region 314a and a low-resistance region 314b each functioning as a source region or a drain region. Note that the transistor 400 can be used as the transistor included in the comparator 101 in the above embodiments, for example.

As illustrated in FIG. 31C, in the transistor 400, a top surface and a side surface in the channel width direction of the semiconductor region 313 are covered with the conductor 316 with the insulator 315 therebetween. Such a Fin-type transistor 400 can have an increased effective channel width, and thus have improved on-state characteristics. In addition, since contribution of an electric field of a gate electrode can be increased, the off-state characteristics of the transistor 400 can be improved.

Note that the transistor 400 can be either a p-channel transistor or an n-channel transistor.

A region of the semiconductor region 313 where a channel is formed, a region in the vicinity thereof, the low-resistance region 314a and the low-resistance region 314b each functioning as a source region or a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 400 may be an HEMT (High Electron Mobility Transistor) with the use of GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

For the conductor 316 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 30:
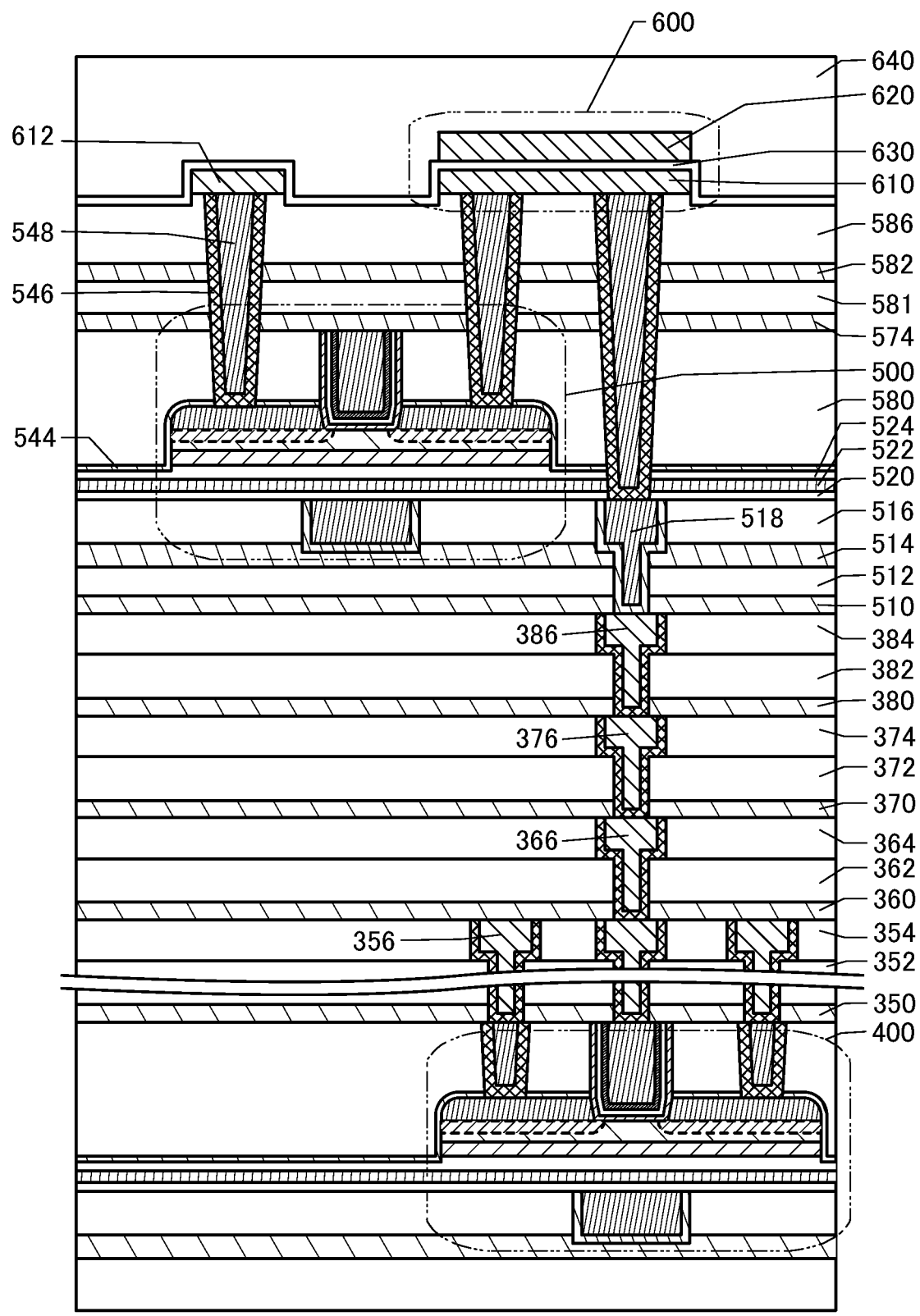
FIG. 30 is a diagram illustrating a structure example of a semiconductor device.

Note that the transistor 400 illustrated in FIG. 29 is an example and the structure is not limited thereto; an appropriate transistor is used in accordance with a circuit structure or a driving method. In the case where all the transistors included in the semiconductor device are OS transistors and have the same conductivity, which means the same-polarity transistors such as re-channel transistors only, for example, the transistor 400 has a structure similar to that of the transistor 500 including an oxide semiconductor as illustrated in FIG. 30. Note that the details of the transistor 500 are described later.

An insulator 320, an insulator 322, an insulator 324, and an insulator 326 are stacked sequentially to cover the transistor 400.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

The insulator 322 may have a function of a planarization film for planarizing a level difference caused by the transistor 400 or the like provided below the insulator 322. For example, a top surface of the insulator 322 may be planarized by planarization treatment using a chemical mechanical polishing (CMP) method or the like to increase planarity.

In addition, for the insulator 324, it is preferable to use a film having a barrier property that prevents diffusion of hydrogen or impurities from the substrate 311, the transistor 400, or the like into a region where the transistor 500 is provided.

For the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably used between the transistor 500 and the transistor 400. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the relative permittivity of the insulator 324. When a material with a low permittivity is used for an interlayer film, parasitic capacitance generated between wirings can be reduced.

In addition, a conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and part of a conductor functions as a plug.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to form the plugs and wirings with a low-resistance conductive material such as aluminum or copper. The use of a low-resistance conductive material can reduce wiring resistance.

A wiring layer may be provided over the insulator 326 and the conductor 330. For example, in FIG. 29, an insulator 350, an insulator 352, and an insulator 354 are stacked sequentially. Furthermore, a conductor 356 is formed in the insulator 350, the insulator 352, and the insulator 354. The conductor 356 has a function of a plug or a wiring that is connected to the transistor 400. Note that the conductor 356 can be provided using a material similar to those for the conductor 328 and the conductor 330.

Note that for example, as the insulator 350, like the insulator 324, an insulator having a barrier property against hydrogen is preferably used. Furthermore, the conductor 356 preferably contains a conductor having a barrier property against hydrogen. In particular, the conductor having a barrier property against hydrogen is formed in an opening portion of the insulator 350 having a barrier property against hydrogen. With this structure, the transistor 400 and the transistor 500 can be separated by a barrier layer, so that diffusion of hydrogen from the transistor 400 into the transistor 500 can be inhibited.

Note that for the conductor having a barrier property against hydrogen, tantalum nitride is preferably used, for example. In addition, using a stack of tantalum nitride and tungsten, which has high conductivity, can inhibit diffusion of hydrogen from the transistor 400 while the conductivity of a wiring is kept. In that case, a structure in which a tantalum nitride layer having a barrier property against hydrogen is in contact with the insulator 350 having a barrier property against hydrogen is preferable.

A wiring layer may be provided over the insulator 354 and the conductor 356. For example, in FIG. 29, an insulator 360, an insulator 362, and an insulator 364 are stacked sequentially. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

Note that for example, as the insulator 360, like the insulator 324, an insulator having a barrier property against hydrogen is preferably used. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 400 and the transistor 500 can be separated by a barrier layer, so that diffusion of hydrogen from the transistor 400 into the transistor 500 can be inhibited.

A wiring layer may be provided over the insulator 364 and the conductor 366. For example, in FIG. 29, an insulator 370, an insulator 372, and an insulator 374 are stacked sequentially. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

Note that for example, as the insulator 370, like the insulator 324, an insulator having a barrier property against hydrogen is preferably used. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 400 and the transistor 500 can be separated by a barrier layer, so that diffusion of hydrogen from the transistor 400 into the transistor 500 can be inhibited.

A wiring layer may be provided over the insulator 374 and the conductor 376. For example, in FIG. 29, an insulator 380, an insulator 382, and an insulator 384 are stacked sequentially. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

Note that for example, as the insulator 380, like the insulator 324, an insulator having a barrier property against hydrogen is preferably used. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 400 and the transistor 500 can be separated by a barrier layer, so that diffusion of hydrogen from the transistor 400 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked sequentially over the insulator 384. A substance having a barrier property against oxygen or hydrogen is preferably used for any of the insulator 510, the insulator 512, the insulator 514, and the insulator 516.

For example, for the insulator 510 and the insulator 514, it is preferable to use a film having a barrier property that prevents diffusion of hydrogen or impurities from the substrate 311, a region where the transistor 400 is provided, or the like into the region where the transistor 500 is provided. Therefore, a material similar to that for the insulator 324 can be used.

For the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 400. The film that inhibits hydrogen diffusion is specifically a film from which a small amount of hydrogen is released.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors of a change in electrical characteristics of the transistor. Accordingly, aluminum oxide can prevent mixing of impurities such as hydrogen and moisture into the transistor 500 in a manufacturing process and after manufacturing of the transistor. In addition, release of oxygen from the oxide included in the transistor 500 can be inhibited. Therefore, aluminum oxide is suitably used for a protective film of the transistor 500.

In addition, for the insulator 512 and the insulator 516, a material similar to that for the insulator 320 can be used, for example. Furthermore, when a material with a comparatively low permittivity is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (a conductor 503 for example), and the like are embedded in the insulator 510, the insulator 512, the insulator 514, and the insulator 516. Note that the conductor 518 has a function of a plug or a wiring that is connected to the capacitor 600 or the transistor 400. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 400 and the transistor 500 can be separated by a layer having a barrier property against oxygen, hydrogen, and water; thus, diffusion of hydrogen from the transistor 400 into the transistor 500 can be inhibited.

The transistor 500 is provided above the insulator 516.

As illustrated in FIG. 31A and FIG. 31B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap with a region between the conductor 542a and the conductor 542b; an oxide 530c positioned on a bottom and a side surface of the opening; an insulator 550 positioned on a formation surface of the oxide 530c; and a conductor 560 positioned on a formation surface of the insulator 550.

In addition, as illustrated in FIG. 31A and FIG. 31B, an insulator 544 is preferably positioned between the insulator 580 and the oxide 530a, the oxide 530b, the conductor 542a, and the conductor 542*b*. Furthermore, as illustrated in FIG. 31A and FIG. 31B, the conductor 560 preferably includes a conductor 560*a* provided inside the insulator 550 and a conductor 560*b* provided to be embedded inside the conductor 560*a*. Moreover, as illustrated in FIG. 31A and FIG. 31B, an insulator 574 is preferably positioned over the insulator 580, the conductor 560, and the insulator 550.

Note that in this specification and the like, the oxide 530*a*, the oxide 530*b*, and the oxide 530*c* are sometimes collectively referred to as an oxide 530.

Note that although a structure of the transistor 500 in which three layers of the oxide 530*a*, the oxide 530*b*, and the oxide 530*c* are stacked in a region where a channel is formed and its vicinity is illustrated, the present invention is not limited thereto. For example, a single layer of the oxide 530*b*, a two-layer structure of the oxide 530*b* and the oxide 530*a*, a two-layer structure of the oxide 530*b* and the oxide 530*c*, or a stacked-layer structure of four or more layers may be employed. Furthermore, although the conductor 560 is illustrated to have a stacked-layer structure of two layers in the transistor 500, the present invention is not limited thereto. For example, the conductor 560 may have a single-layer structure or a stacked-layer structure of three or more layers. Moreover, the transistor 500 illustrated in FIG. 29 and FIG. 31A is an example and the structure is not limited thereto; an appropriate transistor is used in accordance with a circuit configuration or a driving method.

Here, the conductor 560 functions as a gate electrode of the transistor, and the conductor 542*a* and the conductor 542*b* each function as a source electrode or a drain electrode. As described above, the conductor 560 is formed to be embedded in the opening of the insulator 580 and the region between the conductor 542*a* and the conductor 542*b*. The positions of the conductor 560, the conductor 542*a*, and the conductor 542*b* with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542*a* and the conductor 542*b* in a self-aligned manner, the conductor 560 does not have a region overlapping with the conductor 542*a* or the conductor 542*b*. Thus, parasitic capacitance formed between the conductor 560 and each of the conductor 542*a* and the conductor 542*b* can be reduced. As a result, the switching speed of the transistor 500 can be improved, and the transistor 500 can have high frequency characteristics.

The conductor 560 sometimes functions as a first gate (also referred to as top gate) electrode. In addition, the conductor 503 sometimes functions as a second gate (also referred to as bottom gate) electrode. In that case, the threshold voltage of the transistor 500 can be controlled by changing a potential applied to the conductor 503 independently of a potential applied to the conductor 560. In particular, the threshold voltage of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered.

In this specification and the like, a transistor structure in which a channel formation region is electrically surrounded by electric fields of a pair of gate electrodes (a first gate electrode and a second gate electrode) is referred to as a surrounded channel (S-channel) structure. Furthermore, in this specification and the like, the surrounded channel (S-channel) structure has a feature in that the side surface and the vicinity of the oxide 530 that is in contact with the conductor 542*a* and the conductor 542*b* functioning as a source electrode and a drain electrode are of I-type like the channel formation region. Since the side surface and the vicinity of the oxide 530 that is in contact with the conductor 542*a* and the conductor 542*b* are in contact with the insulator 544, they can be of I-type like the channel formation region. Note that in this specification and the like, "I-type" can be equated with "highly purified intrinsic" to be described later. The S-channel structure disclosed in this specification and the like is different from a Fin-type structure and a planar structure. With the S-channel structure, resistance to a short-channel effect can be enhanced, that is, a transistor in which a short-channel effect is unlikely to occur can be provided.

In addition, the conductor 503 has a structure similar to that of the conductor 518; a conductor 503*a* is formed in contact with an inner wall of an opening in the insulator 514 and the insulator 516, and a conductor 503*b* is formed on the inner side. Note that although the transistor 500 having a structure in which the conductor 503*a* and the conductor 503*b* are stacked is illustrated, the present invention is not limited thereto. For example, the conductor 503 may be provided as a single layer or to have a stacked-layer structure of three or more layers.

Here, for the conductor 503*a*, a conductive material that has a function of inhibiting diffusion of impurities such as a hydrogen atom, a hydrogen molecule, a water molecule, and a copper atom (through which the impurities are unlikely to pass) is preferably used. Alternatively, it is preferable to use a conductive material that has a function of inhibiting diffusion of oxygen (e.g., at least one of an oxygen atom, an oxygen molecule, and the like) (through which oxygen is unlikely to pass). Note that in this specification, a function of inhibiting diffusion of impurities or oxygen means a function of inhibiting diffusion of any one or all of the impurities and oxygen.

For example, when the conductor 503*a* has a function of inhibiting diffusion of oxygen, a reduction in conductivity of the conductor 503*b* due to oxidation can be inhibited.

In addition, in the case where the conductor 503 also functions as a wiring, a conductive material with high conductivity that contains tungsten, copper, or aluminum as its main component is preferably used for the conductor 503*b*. Note that although the conductor 503 has a stacked layer of the conductor 503*a* and the conductor 503*b* in this embodiment, the conductor 503 may have a single-layer structure.

The insulator 520, the insulator 522, and the insulator 524 have a function of a second gate insulating film.

Here, as the insulator 524 that is in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies ($V_O$) in the oxide 530 can be reduced and the reliability of the transistor 500 can be improved. When hydrogen enters the oxygen vacancies in the oxide 530, such defects (hereinafter, referred to as $V_OH$ in some cases) serve as donors and generate electrons serving as carriers in some cases. In other cases, bonding of part of hydrogen to oxygen bonded to a metal atom generates electrons serving as carriers. Thus, a transistor including an oxide semiconductor that contains a large amount of hydrogen is likely to have normally-on characteristics. Moreover, hydrogen in an oxide semiconductor is easily transferred by a stress such as heat or an electric field; thus, a large amount of hydrogen in an oxide semiconductor might reduce the reliability of the transistor. In one embodiment of the present invention, $V_OH$ in the oxide 530 is preferably reduced as much as possible so that the oxide 530 becomes a highly purified intrinsic or substantially highly purified intrinsic oxide. It is effective to remove impurities such as moisture and hydrogen in an oxide semiconductor (sometimes described as dehydration or dehydrogenation treatment) and to compensate for oxygen vacancies by supplying oxygen to the oxide semiconductor (sometimes described as oxygen adding treatment) in order to obtain an oxide semiconductor whose $V_OH$ is sufficiently reduced. When an oxide semiconductor with sufficiently reduced impurities such as $V_OH$ is used for a channel formation region of a transistor, the transistor can have stable electrical characteristics.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of $V_OH$ is cut occurs, i.e., a reaction of $V_OH \rightarrow V_O+H$ occurs. Part of hydrogen generated at this time is bonded to oxygen to be $H_2O$, and removed from the oxide 530 or an insulator near the oxide 530 in some cases. Some hydrogen may be gettered into the conductor 542 in some cases.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies ($V_O$). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of $V_O+O \rightarrow$ null. Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_OH$.

In addition, in the case where the insulator 524 includes an excess-oxygen region, it is preferable that the insulator 522 have a function of inhibiting diffusion of oxygen (e.g., an oxygen atom, an oxygen molecule, or the like) (through which oxygen is unlikely to pass).

When the insulator 522 has a function of inhibiting diffusion of oxygen or impurities, oxygen contained in the oxide 530 is not diffused into the insulator 520 side, which is preferable. Furthermore, the conductor 503 can be inhibited from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as leakage current might arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is unlikely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

In addition, it is preferable that the insulator 520 be thermally stable. For example, silicon oxide and silicon oxynitride are suitable because they are thermally stable. Furthermore, the combination of an insulator that is a high-k material and silicon oxide or silicon oxynitride enables the insulator 520 to have a stacked-layer structure that has thermal stability and a high relative permittivity.

Note that in the transistor 500 in FIG. 31A and FIG. 31B, the insulator 520, the insulator 522, and the insulator 524 are illustrated as the second gate insulating film having a stacked-layer structure of three layers; however, the second gate insulating film may be a single layer or may have a stacked-layer structure of two layers or four or more layers. In that case, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. The In-M-Zn oxide that can be used as the oxide 530 is particularly preferably a CAAC-OS (c-axis aligned crystalline oxide semiconductor). Alternatively, a CAC-OS (Cloud-Aligned Composite oxide semiconductor) is preferable. Note that CAAC refers to an example of a crystal structure, and CAC refers to an example of a function or a material composition. Furthermore, as the oxide 530, an In—Ga oxide or an In—Zn oxide may be used.

The CAC-OS is referred to as a CAC-metal oxide in some cases. Note that in the case where the CAC-OS or the CAC-metal oxide is used in a channel formation region of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

Furthermore, in the CAC-OS or the CAC-metal oxide, the conductive regions and the insulating regions each having a size greater than or equal to 0.5 nm and less than or equal to 10 nm, preferably greater than or equal to 0.5 nm and less than or equal to 3 nm are dispersed in the material in some cases.

The CAC-OS or the CAC-metal oxide is composed of components having different band gaps. For example, the CAC-OS or the CAC-metal oxide is composed of a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in an on state can achieve high current driving capability, that is, high on-state current and high field-effect mobility.

In other words, the CAC-OS or the CAC-metal oxide can also be referred to as a matrix composite or a metal matrix composite.

Note that metal oxides functioning as oxide semiconductors are classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. On the other hand, a clear crystal grain boundary cannot be observed in the CAAC-OS; thus, it can be said that a reduction in electron mobility due to the crystal grain boundary is unlikely to occur. Furthermore, entry of impurities, formation of defects, or the like might decrease the crystallinity of a metal oxide, which means that the CAAC-OS is a metal oxide including few impurities and defects (e.g., oxygen vacancies). Thus, a metal oxide including a CAAC-OS is physically stable. Therefore, the metal oxide including a CAAC-OS is resistant to heat and highly reliable.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that In—Ga—Zn oxide (also referred to as "IGZO") that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS contains a void or a low-density region. That is, the a-like OS has low crystallinity compared with the nc-OS and the CAAC-OS.

An oxide semiconductor (metal oxide) can have various structures which show different properties. Two or more kinds of the amorphous oxide semiconductor, the polycrystalline oxide semiconductor, the a-like OS, the nc-OS, and the CAAC-OS may be included in an oxide semiconductor of one embodiment of the present invention.

Furthermore, a metal oxide with a low carrier concentration is preferably used in the transistor 500. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities in a metal oxide include hydrogen, nitrogen, alkali metal, alkaline earth metal, iron, nickel, and silicon.

In particular, hydrogen contained in a metal oxide reacts with oxygen bonded to a metal atom to be water, and thus forms oxygen vacancies in the metal oxide in some cases. If the channel formation region in the metal oxide includes oxygen vacancies, the transistor sometimes has normally-on characteristics. In some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor using a metal oxide containing a large amount of hydrogen is likely to have normally-on characteristics.

A defect in which hydrogen has entered an oxygen vacancy can function as a donor of the metal oxide. However, it is difficult to evaluate the defects quantitatively. Thus, the metal oxide is sometimes evaluated by not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Consequently, when a metal oxide is used for the oxide 530, hydrogen in the metal oxide is preferably reduced as much as possible. Specifically, the hydrogen concentration of the metal oxide, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide with a sufficiently reduced concentration of impurities such as hydrogen is used for a channel formation region of a transistor, the transistor can have stable electrical characteristics.

When a metal oxide is used for the oxide 530, the carrier density of the metal oxide in the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, still further preferably lower than $1\times10^{13}$ cm$^{-3}$, still further preferably lower than $1\times10^{12}$ cm$^{-3}$. Note that the lower limit of the carrier concentration of the metal oxide in the channel formation region is not particularly limited and can be, for example, $1\times10^{-9}$ cm$^{-3}$.

When a metal oxide is used for the oxide 530, contact between the conductor 542 (the conductor 542*a* and the conductor 542*b*) and the oxide 530 may make oxygen in the oxide 530 diffuse into the conductor 542, resulting in oxidation of the conductor 542. It is highly possible that oxidation of the conductor 542 lowers the conductivity of the conductor 542. Note that diffusion of oxygen in the oxide 530 into the conductor 542 can be interpreted as absorption of oxygen in the oxide 530 by the conductor 542.

When oxygen in the oxide 530 is diffused into the conductor 542 (the conductors 542*a* and 542*b*), a layer is sometimes formed between the conductor 542*a* and the oxide 530*b*, and between the conductor 542*b* and the oxide 530*b*. The layer contains more oxygen than the conductor 542 does, and thus presumably has an insulating property. In this case, a three-layer structure of the conductor 542, the layer, and the oxide 530*b* can be regarded as a three-layer structure of a metal, an insulator, and a semiconductor and is sometimes referred to as a MIS (Metal-Insulator-Semiconductor) structure or a diode junction structure having a MIS structure as its main part.

Note that the above-described layer is not necessarily formed between the conductor 542 and the oxide 530*b*, but the layer may be formed between the conductor 542 and the oxide 530*c*, or formed both between the conductor 542 and the oxide 530*b* and between the conductor 542 and the oxide 530*c*.

Furthermore, the metal oxide functioning as the channel formation region in the oxide 530 has a band gap of more than or equal to 2 eV, preferably more than or equal to 2.5 eV. With the use of a metal oxide having such a wide bandgap, the off-state current of the transistor can be reduced.

When the oxide 530 includes the oxide 530*a* under the oxide 530*b*, it is possible to inhibit diffusion of impurities into the oxide 530*b* from the components formed below the oxide 530*a*. Moreover, including the oxide 530*c* over the oxide 530*b* makes it possible to inhibit diffusion of impurities into the oxide 530*b* from the components formed above the oxide 530*c*.

Note that the oxide 530 preferably has a stacked-layer structure of oxides that differ in the atomic ratio of metal atoms. Specifically, the atomic ratio of the element M to the constituent elements in the metal oxide used as the oxide 530a is preferably higher than the atomic ratio of the element M to the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a. Moreover, a metal oxide that can be used as the oxide 530a or the oxide 530b can be used as the oxide 530c.

In addition, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

Here, the energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the densities of defect states in mixed layers formed at an interface between the oxide 530a and the oxide 530b and an interface between the oxide 530b and the oxide 530c are preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used as the oxide 530a and the oxide 530c.

At this time, the oxide 530b serves as a main carrier path. When the oxide 530a and the oxide 530c have the above structures, the densities of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal element; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lantha- num and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are illustrated in FIG. 31, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

In addition, as illustrated in FIG. 31A, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used as the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is unlikely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, diffusion of impurities such as water and hydrogen contained in the insulator 580 into the oxide 530b through the oxide 530c and the insulator 550 can be inhibited. Furthermore, oxidation of the conductor 560 due to excess oxygen contained in the insulator 580 can be inhibited.

The insulator 550 functions as a first gate insulating film. The insulator 550 is preferably positioned in contact with an inner side (a top surface and a side surface) of the oxide 530c. Like the insulator 524, the insulator 550 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator from which oxygen is released by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably reduced. The thickness of the insulator 550 is preferably greater than or equal to 1 nm and less than or equal to 20 nm.

Furthermore, to efficiently supply excess oxygen contained in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 550 may have a stacked-layer structure like the second gate insulating film. As miniaturization and high integration of transistors progress, a problem such as leakage current might arise because of a thinner gate insulating film. For that reason, when the insulator functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high relative permittivity.

Although the conductor 560 that functions as the first gate electrode and has a two-layer structure is illustrated in FIGS. 31A and 31B, a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 550. As a conductive material having a function of inhibiting diffusion of oxygen, for example, tantalum, tantalum nitride, ruthenium, ruthenium oxide, or the like is preferably used. For the conductor 560a, the oxide semiconductor that can be used as the oxide 530 can be used. In that case, when the conductor 560b is deposited by a sputtering method, the conductor 560a can have a reduced electrical resistance value to be a conductor. Such a conductor can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus a conductor having high conductivity is preferably used as the conductor 560b. For example, a conductive material containing tungsten, copper, or aluminum as its main component can be used. Moreover, the conductor 560b may have a stacked-layer structure, for example, a stacked-layer structure of the above conductive material and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided in contact with the oxide 530c, oxygen in the insulator 580 can be efficiently supplied to the oxide 530 through the oxide 530c. Note that the concentration of impurities such as water or hydrogen in the insulator 580 is preferably reduced.

The opening of the insulator 580 is formed to overlap with the region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 550. When the insulator 574 is deposited by a sputtering method, excess-oxygen regions can be provided in the insulator 550 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water or hydrogen in the insulator 581 is preferably reduced.

Furthermore, a conductor 540*a* and a conductor 540*b* are positioned in openings formed in the insulator 581, the insulator 574, the insulator 580, and the insulator 544. The conductor 540*a* and the conductor 540*b* are provided to face each other with the conductor 560 therebetween. The structures of the conductor 540*a* and the conductor 540*b* are similar to a structure of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of a change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for the protective film of the transistor 500.

In addition, an insulator 586 is provided over the insulator 582. For the insulator 586, a material similar to that for the insulator 320 can be used. Furthermore, when a material with a comparatively low permittivity is used for these insulators, parasitic capacitance between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 400. The conductor 546 and the conductor 548 can be provided using materials similar to those for the conductor 328 and the conductor 330.

After the transistor 500 is formed, an opening may be formed to surround the transistor 500 and an insulator having a high barrier property against hydrogen or water may be formed to cover the opening. Surrounding the transistor 500 by the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 522 or the insulator 514 and the formation of the insulator having a high barrier property in contact with the insulator 522 or the insulator 514 are suitable because these formation steps can also serve as part of the manufacturing steps of the transistor 500. The insulator having a high barrier property against hydrogen or water is formed using a material similar to that for the insulator 522 or the insulator 514, for example.

Next, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are shown in this embodiment, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. The insulator 640 can be provided using a material similar to that for the insulator 320. In addition, the insulator 640 may function as a planarization film that covers an uneven shape therebelow.

With the use of this structure, a semiconductor device using a transistor including an oxide semiconductor can be miniaturized or highly integrated.

Examples of a substrate that can be used for the semiconductor device of one embodiment of the present invention include a glass substrate, a quartz substrate, a sapphire substrate, a ceramic substrate, a metal substrate (e.g., a stainless steel substrate, a substrate including stainless steel foil, a tungsten substrate, and a substrate including tungsten foil), a semiconductor substrate (e.g., a single crystal semiconductor substrate, a polycrystalline semiconductor substrate, and a compound semiconductor substrate), and a SOI (Silicon on Insulator) substrate. Alternatively, a plastic substrate having heat resistance to the processing temperature in this embodiment may be used. Examples of a glass substrate include a barium borosilicate glass substrate, an aluminosilicate glass substrate, an aluminoborosilicate glass substrate, and a soda lime glass substrate. Alternatively, crystallized glass or the like can be used.

Alternatively, a flexible substrate, an attachment film, paper including a fibrous material, a base film, or the like can be used as the substrate. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples are polypropylene, polyester, polyvinyl fluoride, and polyvinyl chloride. Other examples are polyamide, polyimide, aramid, epoxy, an inorganic vapor deposition film, paper, and the like. In particular, the use of a semiconductor substrate, a single crystal substrate, an SOI substrate, or the like enables the manufacture of small-sized transistors with a small variation in characteristics, size, shape, or the like and with high current capability. When a circuit is formed with such transistors, lower power consumption of the circuit or higher integration of the circuit can be achieved.

A flexible substrate may be used as the substrate, and a transistor, a resistor, a capacitor, and/or the like may be formed directly over the flexible substrate. Alternatively, a separation layer may be provided between the substrate and the transistor, the resistor, the capacitor, and/or the like. After part or the whole of a semiconductor device is completed over the separation layer, the separation layer can be used for separation from the substrate and transfer to another substrate. In such a case, the transistor, the resistor, the capacitor, and/or the like can be transferred to a substrate having low heat resistance or a flexible substrate. As the separation layer, a stack of inorganic films, namely a tungsten film and a silicon oxide film, an organic resin film of polyimide or the like formed over a substrate, or a silicon film containing hydrogen can be used, for example.

That is, a semiconductor device may be formed over one substrate and then transferred to another substrate. Examples of a substrate to which a semiconductor device is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupro, rayon, or regenerated polyester), or the like), a leather substrate, and a rubber substrate. With the use of any of these substrates, a flexible semiconductor device or a highly durable semiconductor device can be manufactured, high heat resistance can be provided, or a reduction in weight or thickness can be achieved.

A semiconductor device is provided over a flexible substrate, whereby even in the case where the secondary battery 300 is curved or bent, the semiconductor device can be provided along the external shape of the secondary battery. In the case where the secondary battery 300 is cylindrical, for example, the semiconductor device can be provided to be wound around a side surface of the secondary battery.

Modification Example 1 of Transistor

Figure 32A:
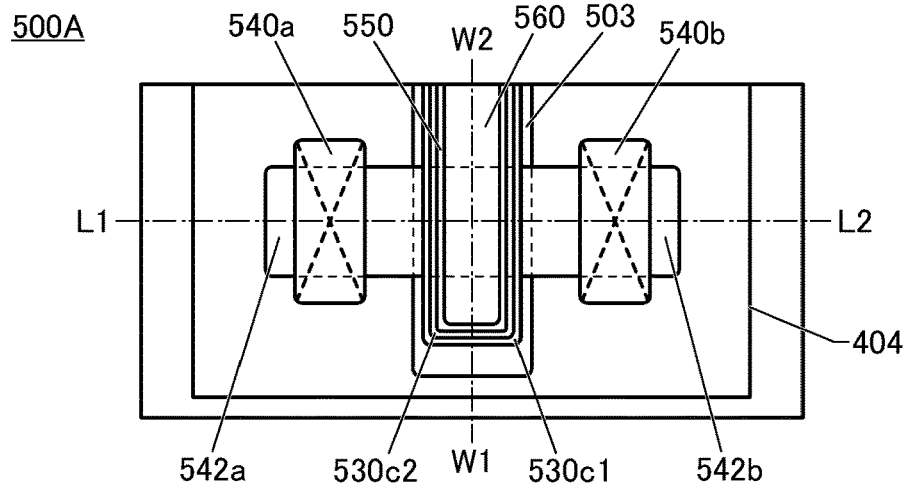
FIG. 32A to FIG. 32C are diagrams illustrating a structure example of a transistor.
Figure 32B:
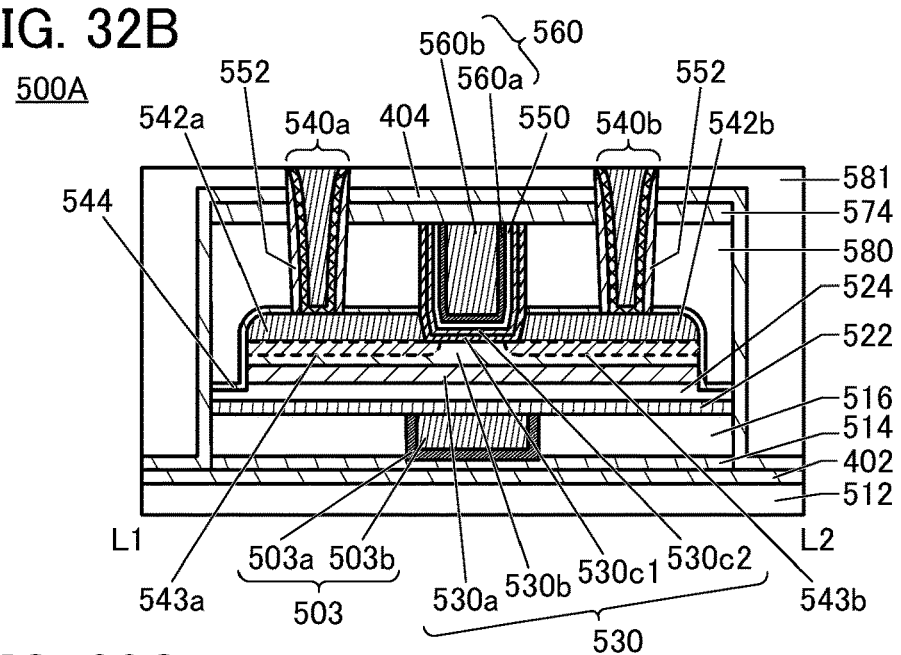
Figure 32C:
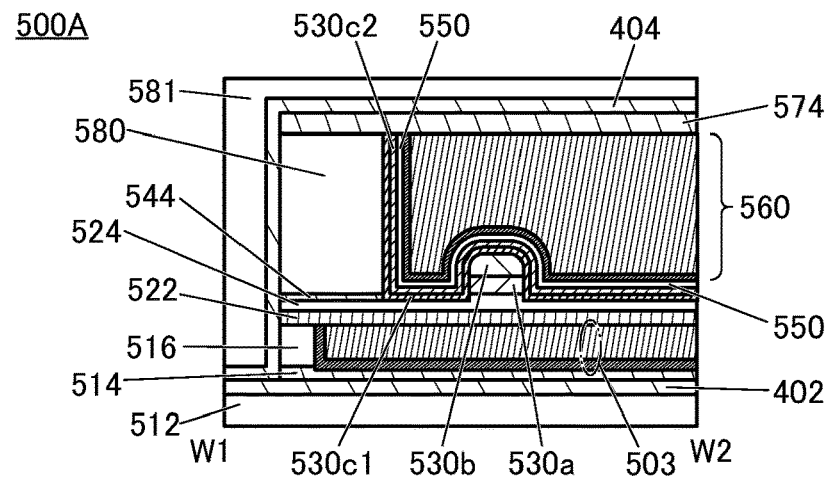

A transistor 500A illustrated in FIG. 32A and FIG. 32B is a modification example of the transistor 500 having the structure illustrated in FIG. 31A and FIG. 31B. FIG. 32A is a cross-sectional view of the transistor 500A in the channel length direction, and FIG. 32B is a cross-sectional view of the transistor 500A in the channel width direction. Note that the structure illustrated in FIG. 32A and FIG. 32B can also be employed for other transistors, such as the transistor 400, included in the semiconductor device of one embodiment of the present invention.

The transistor 500A having the structure illustrated in FIG. 32A and FIG. 32B is different from the transistor 500 having the structure illustrated in FIG. 31A and FIG. 31B in including an insulator 552, an insulator 402, and an insulator 404 and including the oxide 530c having a stack of an oxide 530c1 and an oxide 530c2. Furthermore, the transistor 500A having the structure illustrated in FIG. 32A and FIG. 32B is different from the transistor 500 having the structure illustrated in FIG. 31A and FIG. 31B in that the insulator 552 is provided in contact with a side surface of the conductor 540a and a side surface of the conductor 540b. Moreover, the transistor 500A having the structure illustrated in FIG. 32A and FIG. 32B is different from the transistor 500 having the structure illustrated in FIG. 31A and FIG. 31B in that the insulator 520 is not included.

In the transistor 500A having the structure illustrated in FIG. 32A and FIG. 32B, the insulator 402 is provided over the insulator 512. The insulator 404 is provided over the insulator 574 and the insulator 402.

In the transistor 500A having the structure illustrated in FIG. 32A and FIG. 32B, the insulator 514, the insulator 516, the insulator 522, the insulator 524, the insulator 544, the insulator 580, and the insulator 574 are patterned and covered with the insulator 404. That is, the insulator 404 is in contact with the top surface of the insulator 574, the side surface of the insulator 574, the side surface of the insulator 580, the side surface of the insulator 544, the side surface of the insulator 524, the side surface of the insulator 522, the side surface of the insulator 516, the side surface of the insulator 514, and the top surface of the insulator 402. Thus, the oxide 530 and the like are isolated from the outside by the insulator 404 and the insulator 402.

The insulator 402 and the insulator 404 preferably have high capability of inhibiting diffusion of hydrogen (e.g., at least one of a hydrogen atom, a hydrogen molecule, and the like) or a water molecule. For example, as the insulator 402 and the insulator 404, silicon nitride or silicon nitride oxide that is a material having a high hydrogen barrier property is preferably used. This can inhibit diffusion of hydrogen or the like into the oxide 530, thereby suppressing the degradation of the characteristics of the transistor 500A. Consequently, the reliability of the semiconductor device of one embodiment of the present invention can be increased.

The insulator 552 is provided in contact with the insulator 581, the insulator 404, the insulator 574, the insulator 580, and the insulator 544. The insulator 552 preferably has a function of inhibiting diffusion of hydrogen or water molecules. For example, as the insulator 552, an insulator such as silicon nitride, aluminum oxide, or silicon nitride oxide that is a material having a high hydrogen barrier property is preferably used. In particular, silicon nitride is suitably used for the insulator 552 because of its high hydrogen barrier property. The use of a material having a high hydrogen barrier property for the insulator 552 can inhibit diffusion of impurities such as water and hydrogen from the insulator 580 and the like into the oxide 530 through the conductor 540a and the conductor 540b. Furthermore, oxygen contained in the insulator 580 can be inhibited from being absorbed by the conductor 540a and the conductor 540b. As described above, the reliability of the semiconductor device of one embodiment of the present invention can be increased.

The oxide 530c1 is in contact with the top surface of the insulator 524, the side surface of the oxide 530a, the top surface and the side surface of the oxide 530b, the side surfaces of the conductor 542a and the conductor 542b, the side surface of the insulator 544, and the side surface of the insulator 580 (see FIG. 32B). The oxide 530c2 is in contact with the insulator 550.

An In—Zn oxide can be used as the oxide 530c1, for example. As the oxide 530c2, it is possible to use a material similar to a material used for the oxide 530c when the oxide 530c has a single-layer structure. As the oxide 530c2, a metal oxide with In:Ga:Zn=1:3:4 [atomic ratio], Ga:Zn=2:1 [atomic ratio], or Ga:Zn=2:5 [atomic ratio] can be used, for example.

When the oxide 530c has a two-layer structure of the oxide 530c1 and the oxide 530c2, the on-state current of the transistor can be increased as compared with the case where the oxide 530c has a single-layer structure. Thus, a transistor can be a power MOS transistor, for example.

Modification Example 2 of Transistor

Figure 33A:
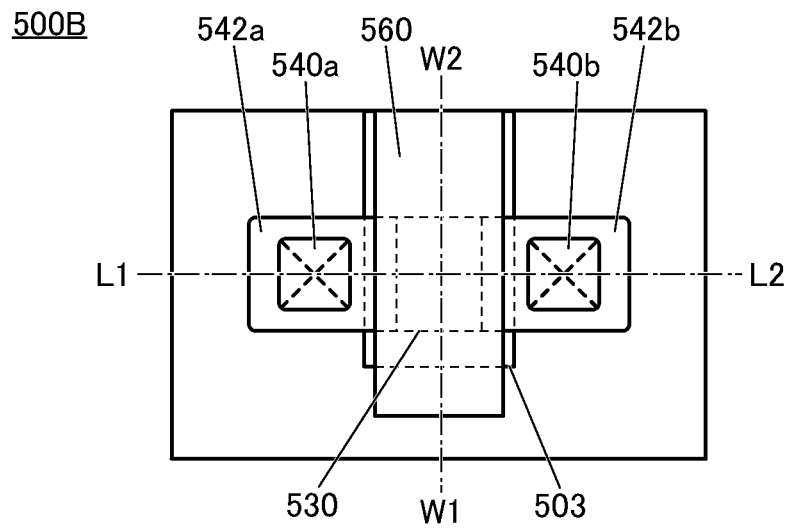
FIG. 33A to FIG. 33C are diagrams illustrating a structure example of a transistor.
Figure 33B:
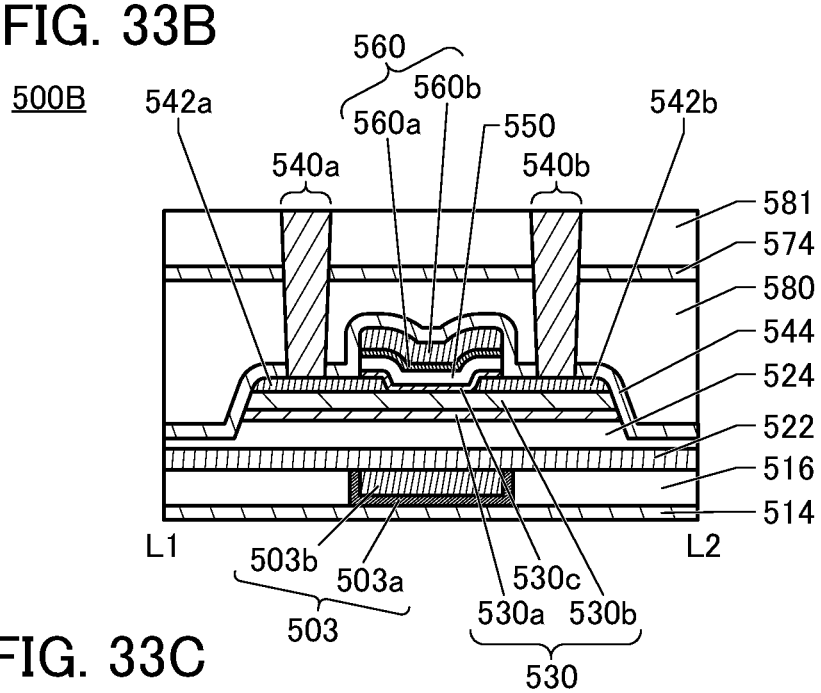
Figure 33C:
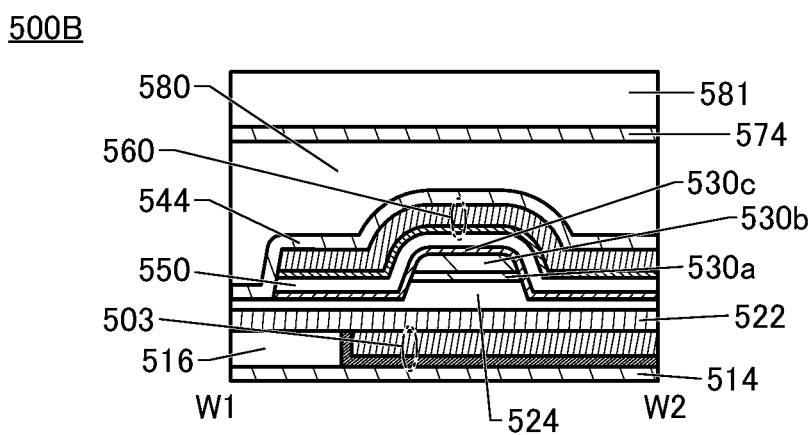

A structure example of a transistor 500B is described with reference to FIG. 33A, FIG. 33B, and FIG. 33C. FIG. 33A is a top view of the transistor 500B. FIG. 33B is a cross-sectional view of a portion along the dashed-dotted line L1-L2 in FIG. 33A. FIG. 33C is a cross-sectional view of a portion along the dashed-dotted line W1-W2 in FIG. 33A. Note that for clarity of the drawing, some components are not illustrated in the top view of FIG. 33A.

The transistor 500B is a modification example of the transistor 500 and can be replaced with the transistor 500. Therefore, differences from the transistor 500 are mainly described to avoid repeated description.

The conductor 560 functioning as a first gate electrode includes the conductor 560a and the conductor 560b over the conductor 560a. For the conductor 560a, a conductive material that has a function of inhibiting diffusion of impurities such as a hydrogen atom, a hydrogen molecule, a water molecule, and a copper atom is preferably used. Alternatively, it is preferable to use a conductive material having a function of inhibiting diffusion of oxygen (e.g., at least one of oxygen atoms, oxygen molecules, and the like).

When the conductor 560a has a function of inhibiting oxygen diffusion, the range of choices for the material of the conductor 560b can be expanded. That is, the conductor 560a inhibits oxidation of the conductor 560b, thereby preventing the decrease in conductivity.

The insulator 544 is preferably provided to cover the top surface and the side surface of the conductor 560, a side surface of the insulator 550, and a side surface of the oxide 530c. For the insulator 544, an insulating material having a function of inhibiting diffusion of oxygen and impurities such as water and hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 544 can inhibit oxidation of the conductor 560. Moreover, the insulator 544 can inhibit diffusion of impurities such as water and hydrogen contained in the insulator 580 into the transistor 500B.

The transistor 500B has the conductor 560 overlapping part of the conductor 542a and part of the conductor 542b, and thus tends to have larger parasitic capacitance than the transistor 500. Consequently, the transistor 500B tends to have a lower operating frequency than the transistor 500. However, the transistor 500B does not require steps of providing an opening in the insulator 580 and the like and embedding the conductor 560, the insulator 550, and the like in the opening; hence, the productivity of the transistor 500B is higher than that of the transistor 500.

This embodiment can be implemented in combination with any of the structures described in the other embodiments and the like, as appropriate.

Embodiment 6

In this embodiment, structure examples of a battery which can be used as the secondary battery 300 are described with reference to drawings. Although a lithium-ion secondary battery is described as an example in this embodiment, a battery that can be used as the secondary battery 300 is not limited to a lithium-ion secondary battery.

<Cylindrical Secondary Battery>

Figure 34A:
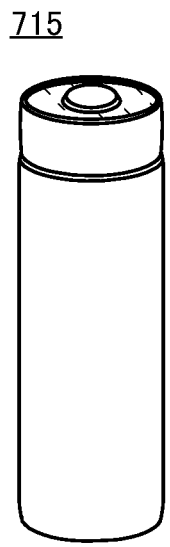
FIG. 34A to FIG. 34C are diagrams illustrating a structure example of a secondary battery.
Figure 34B:
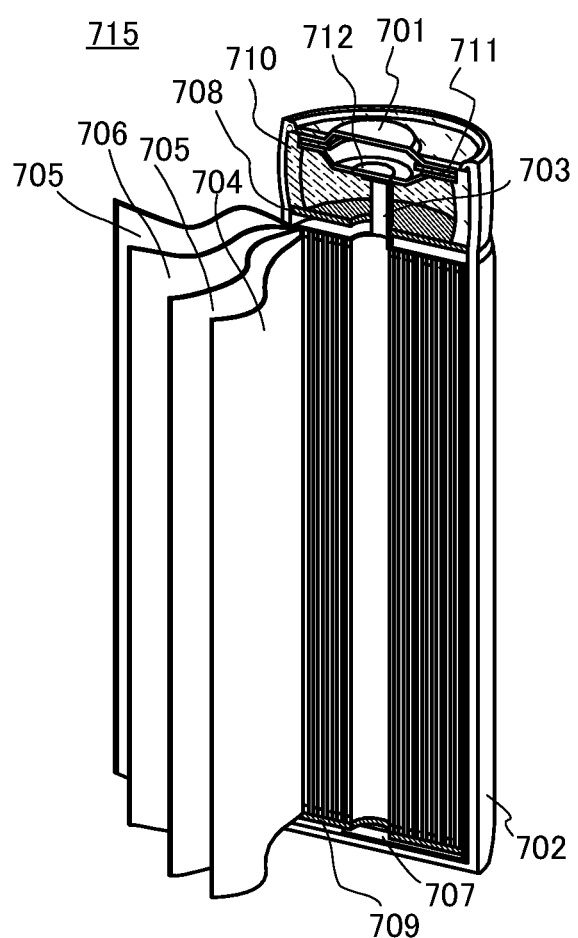

FIG. 34A is an external view of a cylindrical secondary battery 715. FIG. 34B is a schematic cross-sectional view of the cylindrical secondary battery 715. Inside a battery can 702 having a hollow cylindrical shape, a battery element in which a strip-like positive electrode 704 and a strip-like negative electrode 706 are wound with a separator 705 interposed therebetween is provided. Although not illustrated, the battery element is wound centering around a center pin. One end of the battery can 702 is close and the other end thereof is open. For the battery can 702, a metal having corrosion resistance to an electrolyte solution, such as nickel, aluminum, or titanium, an alloy of such a metal, or an alloy of such a metal and another metal (e.g., stainless steel or the like) can be used. The battery can 702 is preferably covered with nickel, aluminum, or the like in order to prevent corrosion due to the electrolyte solution. Inside the battery can 702, the battery element in which the positive electrode, the negative electrode, and the separator are wound is interposed between a pair of insulating plate 708 and insulating plate 709 which face each other. Furthermore, a non-aqueous electrolyte solution (not illustrated) is injected inside the battery can 702 in which the battery element is provided. The secondary battery is composed of a positive electrode containing an active material such as lithium cobalt oxide ($LiCoO_2$) or lithium iron phosphate ($LiFePO_4$), a negative electrode composed of a carbon material such as graphite capable of occluding and releasing lithium ions, a nonaqueous electrolytic solution in which an electrolyte composed of a lithium salt such as $LiBF_4$ or $LiPF_6$ is dissolved in an organic solvent such as ethylene carbonate or diethyl carbonate, and the like.

Since the positive electrode and the negative electrode of the cylindrical secondary battery are wound, active materials are preferably formed on both sides of current collectors. A positive electrode terminal (positive electrode current collecting lead) 703 is connected to the positive electrode 704, and a negative electrode terminal (negative electrode current collecting lead) 707 is connected to the negative electrode 706. A metal material such as aluminum can be used for both the positive electrode terminal 703 and the negative electrode terminal 707. The positive electrode terminal 703 and the negative electrode terminal 707 are resistance-welded to a safety valve mechanism 712 and the bottom of the battery can 702, respectively. The safety valve mechanism 712 is electrically connected to a positive electrode cap 701 through a PTC element (Positive Temperature Coefficient) 711. The safety valve mechanism 712 cuts off electrical connection between the positive electrode cap 701 and the positive electrode 704 when an increase in the internal pressure of the battery exceeds a predetermined threshold value. Furthermore, the PTC element 711 is a heat sensitive resistor whose resistance increases when temperature rises, and controls the amount of current by increase in resistance to prevent unusual heat generation. Barium titanate (Ba-TiO$_3$)-based semiconductor ceramics or the like can be used for the PTC element.

A lithium-ion secondary battery using an electrolyte solution includes a positive electrode, a negative electrode, a separator, an electrolyte solution, and an exterior body. Note that in a lithium-ion secondary battery, the anode (positive electrode) and the cathode (negative electrode) are interchanged in charging and discharging, and the oxidation reaction and the reduction reaction are interchanged; thus, an electrode with a high reaction potential is called the positive electrode and an electrode with a low reaction potential is called the negative electrode. For this reason, in this specification, the positive electrode is referred to as a "positive electrode" or a "plus electrode" and the negative electrode is referred to as a "negative electrode" or a "minus electrode" in all the cases where charge is performed, discharge is performed, a reverse bias current is supplied, and a charge current is supplied. The use of terms such as anode (positive electrode) and cathode (negative electrode) related to oxidation reaction and reduction reaction might cause confusion because the anode and the cathode are reversed in charging and in discharging. Thus, the terms anode and cathode are not used in this specification. If the term anode or cathode is used, whether it is at the time of charging or discharging is noted and whether it corresponds to a positive electrode or a negative electrode is also noted.

In this embodiment, an example of a lithium-ion secondary battery is shown; however, it is not limited to a lithium-ion secondary battery and a material including an element A, an element X, and oxygen can be used as a positive electrode material for the secondary battery. The element A is preferably one or more selected from the Group 1 elements and the Group 2 elements. As the Group 1 element, for example, an alkali metal such as lithium, sodium, or potassium can be used. In addition, as the Group 2 element, for example, calcium, beryllium, magnesium, or the like can be used. As the element X, for example, one or more selected from metal elements, silicon, and phosphorus can be used. The element X is preferably one or more selected from cobalt, nickel, manganese, iron, and vanadium. Typical examples include lithium-cobalt composite oxide (LiCoO$_2$) and lithium iron phosphate (LiFePO$_4$).

The negative electrode includes a negative electrode active material layer and a negative electrode current collector. The negative electrode active material layer may contain a conductive additive and a binder.

For the negative electrode active material, an element that enables charge-discharge reactions by an alloying reaction and a dealloying reaction with lithium can be used. For example, a material containing at least one of silicon, tin, gallium, aluminum, germanium, lead, antimony, bismuth, silver, zinc, cadmium, indium, and the like can be used. Such elements have higher capacity than carbon, and silicon in particular has a high theoretical capacity of 4700 mAh/g.

In addition, the secondary battery preferably includes a separator. As the separator, for example, fiber containing cellulose such as paper; nonwoven fabric; glass fiber; ceramics; synthetic fiber using nylon (polyamide), vinylon (polyvinyl alcohol-based fiber), polyester; acrylic, polyolefin, or polyurethane; or the like can be used.

Figure 34C:
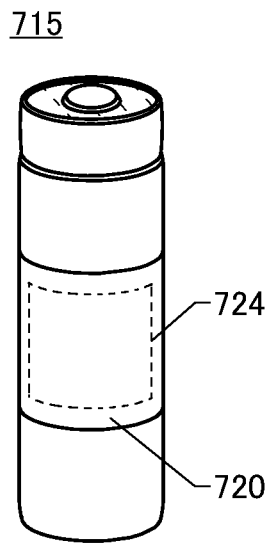

FIG. 34C illustrates a state in which a charge control circuit 724 formed over or fixed onto a flexible substrate 720 is provided along a side surface of the secondary battery 715. As the charge control circuit 724, the semiconductor device 200 described in the above embodiment can be used, for example. When the charge control circuit 724 is provided over the flexible substrate 720, the charge control circuit 724 can be provided along a curved surface of the cylindrical secondary battery 715. Accordingly, the occupation space of the charge control circuit 724 can be small. Thus, a reduction in size of an electronic device including the secondary battery 715 and the charge control circuit 724 can be achieved.

[Flat Secondary Battery]

Figure 35A:
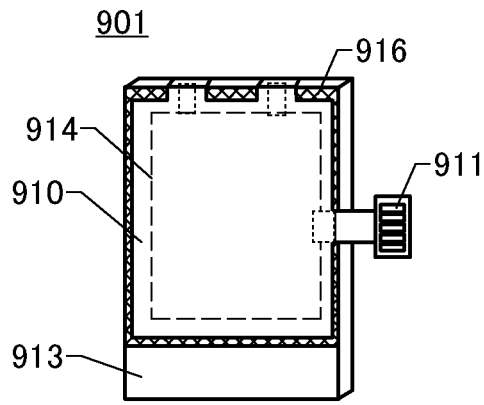
FIG. 35A to FIG. 35C are diagrams illustrating structure examples of a secondary battery.
Figure 35B:
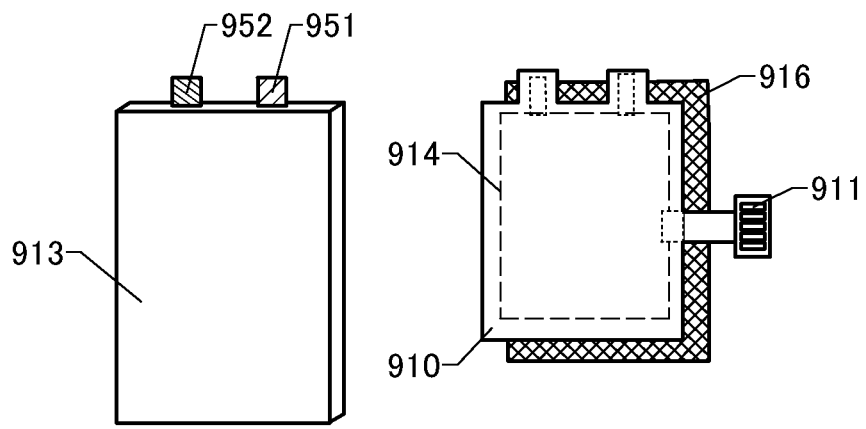

FIG. 35A is an external view of a battery pack 901 including a flat secondary battery 913. The secondary battery 913 illustrated in FIG. 35A functions as the battery pack 901 together with a charge control circuit 914 and a connection terminal 911. FIG. 35B illustrates a state in which the secondary battery 913 and the charge control circuit 914 are separated from each other.

The charge control circuit 914 is formed over or fixed onto a flexible substrate 910. As the charge control circuit 914, the semiconductor device 200 described in the above embodiment can be used, for example. The charge control circuit 914 may have a function of sensing an anomaly such as a micro short circuit.

The secondary battery 913 includes a terminal 951 and a terminal 952. The charge control circuit 914 is electrically connected to the terminal 951 and the terminal 952. The connection terminal 911 is electrically connected to the terminal 951 and the terminal 952 through the charge control circuit 914. Note that a plurality of connection terminals 911 serving as a control signal input terminal, a power supply terminal, and the like may be provided.

The battery pack 901 includes an insulating sheet 916 between the charge control circuit 914 and the secondary battery 913. The insulating sheet 916 has a function of preventing an unnecessary electrical contact between the secondary battery 913 and the charge control circuit 914, for example. As the insulating sheet 916, an organic resin film or an adhesive sheet can be used, for example.

Figure 35C:
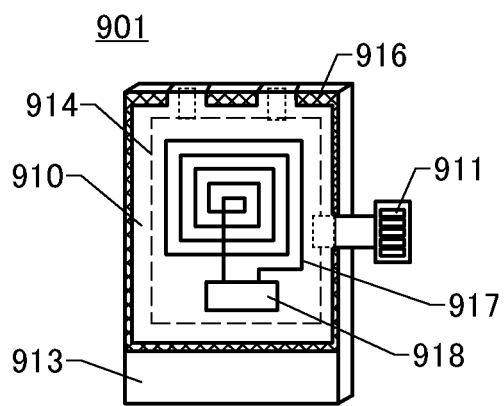

As illustrated in FIG. 35C, an antenna 917 and a receiving circuit 918 may be provided in the battery pack 901. Contactless charging of the secondary battery 913 can also be performed using the antenna. Note that the shape of the antenna is not limited to a coil shape and may be a linear shape or a plate shape. An antenna such as a planar antenna, an aperture antenna, a traveling-wave antenna, an EH antenna, a magnetic-field antenna, or a dielectric antenna may be used. The antenna has a function of communicating data with an external device, for example. As a system for data communication, for example, a response method used between the battery pack and another device, such as NFC, can be used.

Next, an internal structure example of the secondary battery 913 is described.

Figure 36A:
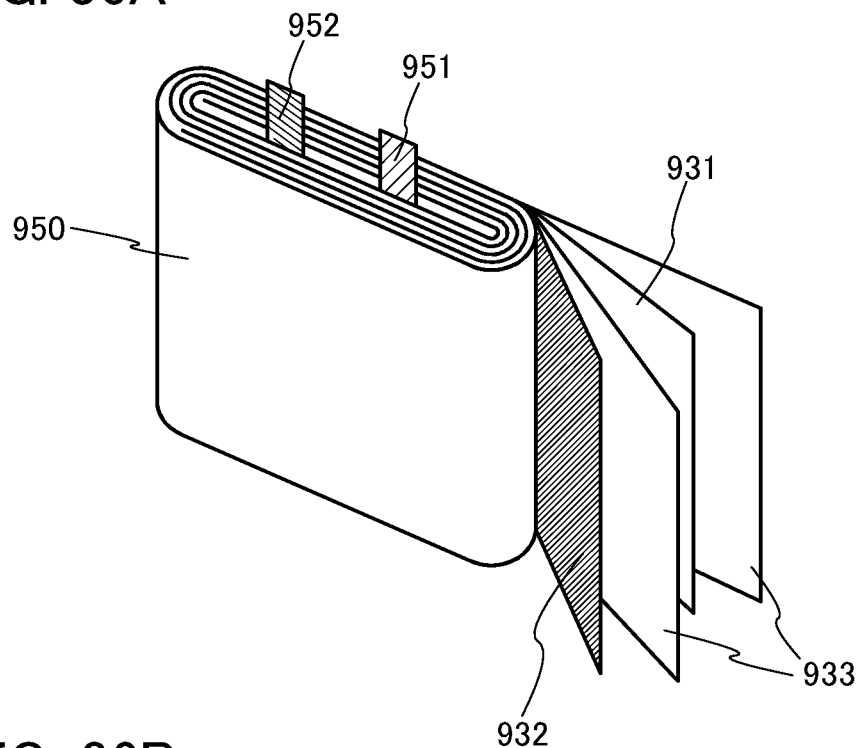
FIG. 36A and FIG. 36B are diagrams illustrating structure examples a wound body and a secondary battery.

FIG. 36A illustrates a structure of a wound body 950 provided in the secondary battery 913. The wound body 950 includes a negative electrode 931, a positive electrode 932, and separators 933. The wound body 950 is obtained by winding a sheet of a stack in which the negative electrode 931 overlaps with the positive electrode 932 with the separator 933 provided therebetween. Note that a plurality of stacks each including the negative electrode 931, the positive electrode 932, and the separator 933 may be stacked.

The negative electrode 931 is connected to the connection terminal 911 illustrated in FIG. 35A via one of the terminal 951 and the terminal 952. The positive electrode 932 is connected to the connection terminal 911 in FIG. 35A via the other of the terminal 951 and the terminal 952.

Figure 36B:
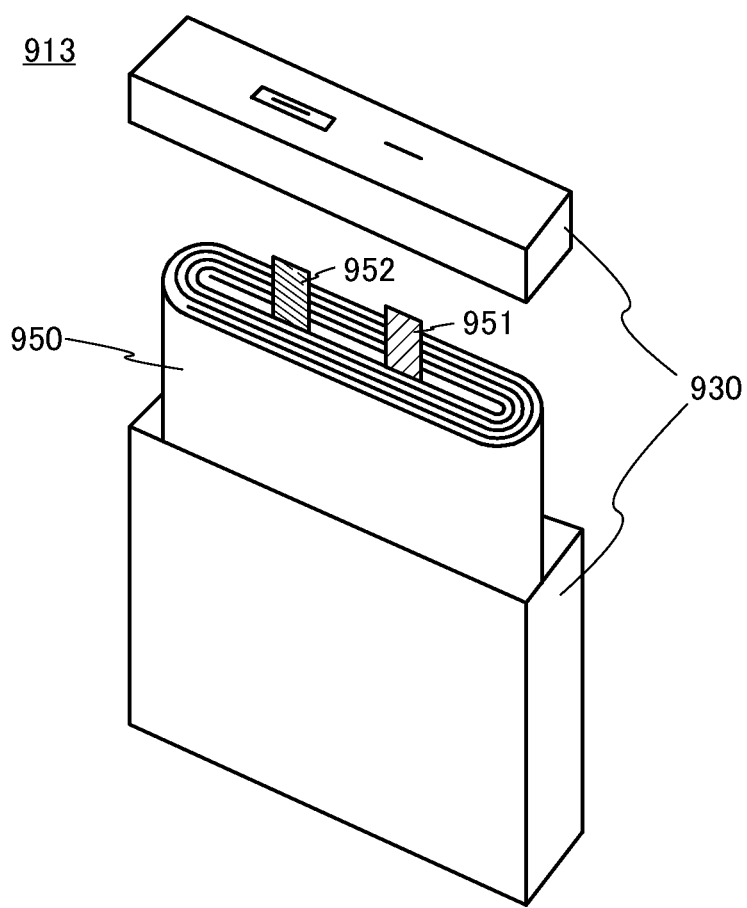

In FIG. 36B, the secondary battery 913 includes the wound body 950 provided with the terminal 951 and the terminal 952 inside a housing 930 (also referred to as an "exterior body"). The wound body 950 is soaked in an electrolyte solution inside the housing 930. The terminal 952 is in contact with the housing 930. An insulator or the like inhibits contact between the terminal 951 and the housing 930. Note that in FIG. 36B, the housing 930 divided into pieces is illustrated; however, in the actual structure, the wound body 950 is covered with the housing 930 and the terminal 951 and the terminal 952 extend to the outside of the housing 930. For the housing 930, a metal material (e.g., aluminum) or a resin material can be used.

For the housing 930, an insulating material such as a metal material or an organic resin can be used. The housing 930 is sometimes formed using a film, in which case the film is sometimes provided with a charge control circuit formed over a flexible substrate.

Although FIG. 35A illustrates an example in which the insulating sheet 916 is provided on a surface of the housing and the flexible substrate is fixed with its surface provided with the charge control circuit inside, connection with the terminal 951 and the terminal 952 may be performed with its surface provided with the charge control circuit outside. However, the connection portion is exposed in such a case, and thus assembly should be performed carefully in consideration of a risk of electrostatic breakdown or a short circuit.

This embodiment can be implemented in combination with any of the structures described in the other embodiments and the like, as appropriate.

Embodiment 7

In this embodiment, electronic devices in which the semiconductor device of one embodiment of the present invention can be used are described.

The semiconductor device of one embodiment of the present invention can be mounted on a variety of electronic devices. Examples of electronic devices include a digital camera, a digital video camera, a digital photo frame, a mobile phone, a portable game console, a portable information terminal, and an audio reproducing device in addition to electronic devices provided with a relatively large screen, such as a television device, a desktop or laptop personal computer, a monitor for a computer and the like, digital signage, and a large game machine like a pachinko machine. Vehicles such as an automobile, a bicycle, a ship, and an airplane can also be categorized as electronic devices. The semiconductor device of one embodiment of the present invention can be used for a charge and discharge control device or the like of a battery incorporated in any of the electronic devices.

The electronic device may include an antenna. When a signal is received by the antenna, the electronic device can display a video, data, or the like on the display portion. When the electronic device includes an antenna and a secondary battery, the antenna may be used for contactless power transmission.

The electronic device may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device can have a variety of functions. For example, the electronic device in this embodiment can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 37:
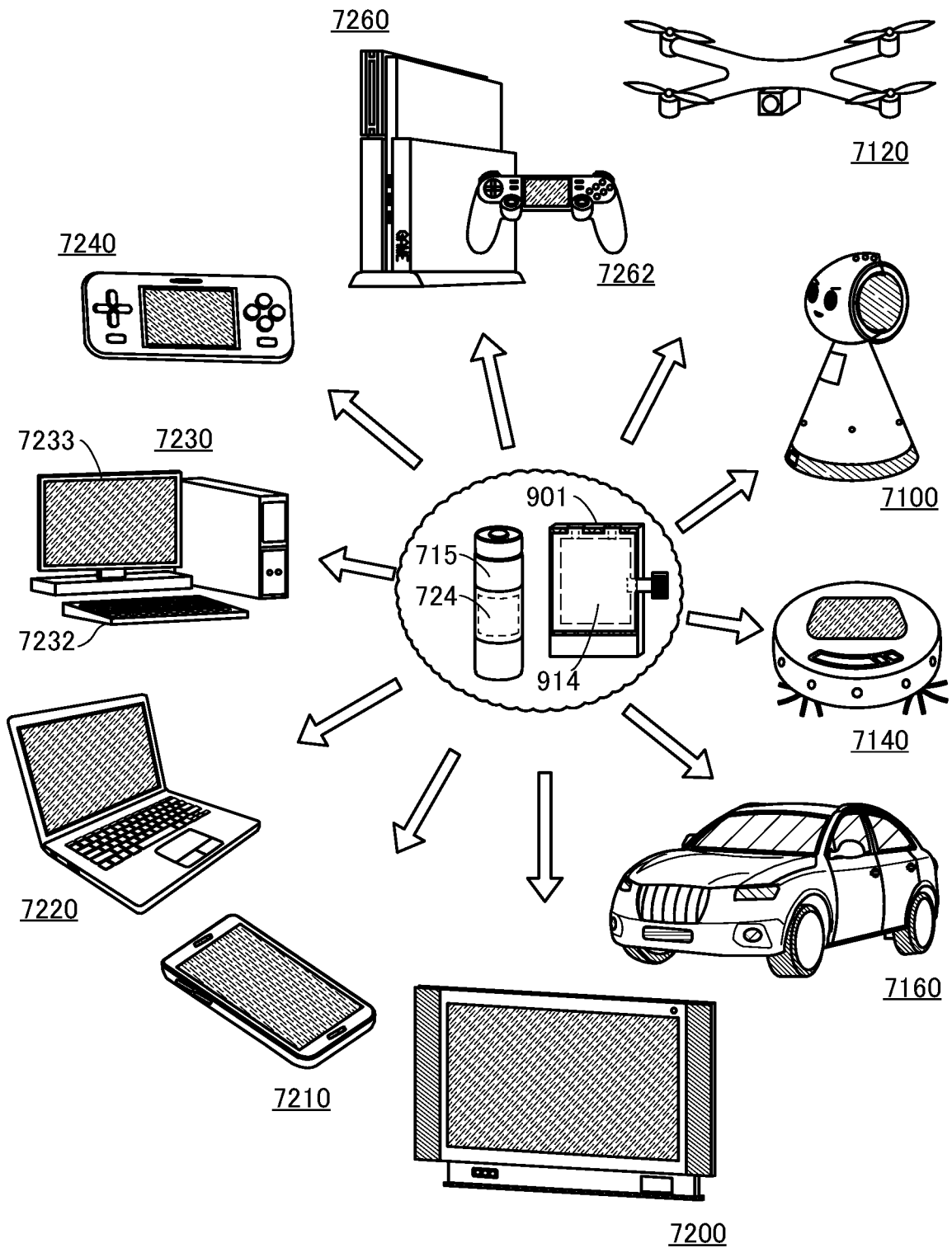
FIG. 37 illustrates examples of an electronic device.

Examples of an electronic device including the semiconductor device of one embodiment of the present invention are described with reference to FIG. 37.

A robot 7100 includes an illuminance sensor, a microphone, a camera, a speaker, a display, various kinds of sensors (e.g., an infrared ray sensor, an ultrasonic wave sensor, an acceleration sensor, a piezoelectric sensor, an optical sensor, and a gyro sensor), a moving mechanism, and the like.

The microphone has a function of detecting acoustic signals of a speaking voice of a user, an environmental sound, and the like. The speaker has a function of outputting audio signals such as a voice and a warning beep. The robot 7100 can analyze an audio signal input via the microphone and can output a necessary audio signal from the speaker. The robot 7100 can communicate with the user using the microphone and the speaker.

The camera has a function of taking images of the surroundings of the robot 7100. The robot 7100 has a function of moving with use of the moving mechanism. The robot 7100 can take images of the surroundings with use of the camera and analyze the images to sense whether there is an obstacle in the way of the movement. The semiconductor device of one embodiment of the present invention is used for a secondary battery (battery) of the robot 7100, whereby overcurrent in charging operation or discharging operation can be detected. In addition, the reliability and the safety of the robot 7100 can be improved.

A flying object 7120 includes propellers, a camera, a battery, a memory device, an arithmetic device, and the like and has a function of flying autonomously.

For example, image data taken by the camera is stored in the memory device. The flying object 7120 can analyze the image data to sense whether there is an obstacle in the way of the movement. Moreover, the arithmetic device can estimate the remaining battery level from a change in the power storage capacity of the battery. The semiconductor device of one embodiment of the present invention is used for a battery of the flying object 7120, whereby overcurrent in charging operation or discharging operation can be detected. Thus, the reliability and the safety the flying object 7120 can be improved.

A cleaning robot 7140 includes a display provided on the top surface, a plurality of cameras provided on the side surface, a brush, an operation button, various kinds of sensors, and the like. Although not illustrated, the cleaning robot 7140 is provided with a tire, an inlet, and the like. The cleaning robot 7140 can run autonomously, detect dust, and vacuum the dust through the inlet provided on the bottom surface.

For example, the cleaning robot 7140 can analyze images taken by the cameras to judge whether there is an obstacle such as a wall, furniture, or a step. In the case where an object that is likely to be caught in the brush, such as a wire, is detected by image analysis, the rotation of the brush can be stopped. The semiconductor device of one embodiment of the present invention is used for a battery of the cleaning robot 7140, whereby overcurrent in charging operation or discharging operation can be detected. Thus, the reliability and the safety the cleaning robot 7140 can be improved.

An electric vehicle 7160 is shown as an example of a moving object. An electric vehicle 7160 includes an engine, tires, a brake, a steering gear, a camera, and the like. The semiconductor device of one embodiment of the present invention is used for a battery of the electric vehicle 7160, whereby overcurrent in charging operation or discharging operation can be detected. Thus, the reliability and the safety the electric vehicle 7160 can be improved.

Note that although an electric vehicle is described above as an example of a moving object, the moving object is not limited to an electric vehicle. Examples of moving objects include a train, a monorail train, a ship, and a flying object (a helicopter, an unmanned aircraft (a drone), an airplane, and a rocket), and the semiconductor device of one embodiment of the present invention is used for each of the batteries of these moving objects, whereby overcurrent in charging operation or discharging operation can be detected. Thus, the reliability and the safety of these moving objects can be improved.

A battery including the semiconductor device of one embodiment of the present invention can be incorporated in a TV device 7200 (a television receiver), a smartphone 7210, a PC 7220 (a personal computer), a PC 7230, a game machine 7240, a game machine 7260, and the like.

The smartphone 7210 is an example of a portable information terminal. The smartphone 7210 includes a microphone, a camera, a speaker, various kinds of sensors, and a display portion.

The PC 7220 and the PC 7230 are examples of a laptop PC and a desktop PC. To the PC 7230, a keyboard 7232 and a monitor device 7233 can be connected with or without a wire. The game machine 7240 is an example of a portable game machine. A game machine 7260 is an example of a stationary game machine. To the game machine 7260, a controller 7262 is connected with or without a wire.

The semiconductor device of one embodiment of the present invention is included in a battery of an electronic device, whereby overcurrent in charging operation or discharging operation can be detected. Thus, the reliability and the safety of the electronic device can be improved.

This embodiment can be implemented in combination with any of the structures described in the other embodiments and the like, as appropriate.

REFERENCE NUMERALS

101: comparator, 102: capacitor, 103: capacitor, 111: transistor, 112: transistor, 113: transistor, 114: transistor, 121: resistor, 122: wiring, 200: semiconductor device, 201: terminal, 202: terminal, 203: terminal, 204: terminal, 210: control circuit, 211: resistor, 212: capacitor, 213: transistor, 214: transistor, 215: diode, 216: diode, 220: potential generation circuit, 221: terminal, 222: terminal, 223: terminal, 224: terminal, 225: terminal, 226: terminal, 227: terminal, 100C: semiconductor device, 100D: semiconductor device, 300: secondary battery

The invention claimed is:

1. A battery pack comprising:
   first to fourth transistors and a comparator;
   a control circuit electrically connected to gate electrodes of the first to fourth transistors; and
   a secondary battery electrically connected to the control circuit,
   wherein one of a source and a drain of the first transistor is electrically connected to a non-inverting input terminal of the comparator,
   wherein one of a source and a drain of the second transistor is electrically connected to an inverting input terminal of the comparator,
   wherein one of a source and a drain of the third transistor is electrically connected to one of a source and a drain of the fourth transistor,
   wherein a first resistor is included between the other of the source and the drain of the third transistor and the other of the source and the drain of the fourth transistor,
   wherein a first capacitor is electrically connected to the one of the source and the drain of the first transistor,
   wherein a second capacitor is included between the one of the source and the drain of the second transistor and the one of the source and the drain of the third transistor, and
   wherein each of the first and second transistors comprises an oxide semiconductor in a semiconductor layer.

2. A semiconductor device comprising:
   first to fourth transistors and a comparator,
   wherein one of a source and a drain of the first transistor is electrically connected to a non-inverting input terminal of the comparator,
   wherein one of a source and a drain of the second transistor is electrically connected to an inverting input terminal,
   wherein one of a source and a drain of the third transistor is electrically connected to one of a source and a drain of the fourth transistor, and
   wherein a first resistor is included between the other of the source and the drain of the third transistor and the other of the source and the drain of the fourth transistor.

3. The semiconductor device according to claim 2,
   wherein a resistance of the first resistor is greater than or equal to 1 mΩ and less than or equal to 10Ω.

4. The semiconductor device according to claim 2,
   wherein the first resistor is a variable resistor.

5. The semiconductor device according to according to claim 2,
   wherein a first capacitor is electrically connected to the one of the source and the drain of the first transistor.

6. The semiconductor device according to claim 5,
   wherein a capacitance of the first capacitor is greater than or equal to 0.01 fF and less than or equal to 100 pF.

7. The semiconductor device according to claim 6,
   wherein a second capacitor is included between the one of the source and the drain of the second transistor and the one of the source and the drain of the third transistor.

8. The semiconductor device according to claim 7,
   wherein a capacitance of the second capacitor is greater than or equal to 0.01 fF and less than or equal to 100 pF.

9. The semiconductor device according to claim 2,
wherein each of the first and second transistors comprises an oxide semiconductor in a semiconductor layer.

10. The semiconductor device according to claim 2,
wherein each of the third and fourth transistors comprises an oxide semiconductor in a semiconductor layer.

11. The semiconductor device according to claim 2,
wherein at least one of the first to fourth transistors is a multi-gate transistor.

12. The semiconductor device according to claim 2,
wherein a potential supplied to the other of the source and the drain of the first transistor is lower than a potential supplied to the other of the source and the drain of the second transistor.

13. The semiconductor device according to claim 2,
wherein gate electrodes of the first to third transistors are electrically connected to each other.

14. The semiconductor device according to claim 2,
wherein the semiconductor device is configured to bring the fourth transistor into an off state when the first to third transistors are in an on state, and
wherein the semiconductor device is configured to bring the fourth transistor into an on state when the first to third transistors are in an off state.

15. A battery pack comprising:
the semiconductor device according to claim 2, the semiconductor device being provided over a flexible substrate; and
a secondary battery.

16. The battery pack according to claim 15, comprising:
a first diode, a second diode, a second resistor, and a third capacitor,
wherein a cathode of the first diode is electrically connected to a positive electrode of the secondary battery,
wherein an anode of the first diode is electrically connected to a cathode of the second diode,
wherein an anode of the second diode is electrically connected to a negative electrode of the secondary battery,
wherein the second resistor is provided between the anode of the first diode and an output terminal of the comparator, and
wherein the third capacitor is connected to the second diode in parallel.

17. The battery pack according to claim 16,
wherein one or both of the first diode and the second diode are transistors.

* * * * *